United States Patent
Kobayashi et al.

(10) Patent No.: US 8,724,407 B2
(45) Date of Patent: May 13, 2014

(54) SIGNAL PROCESSING CIRCUIT

(75) Inventors: Hidetomo Kobayashi, Kanagawa (JP); Yukio Maehashi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 222 days.

(21) Appl. No.: 13/428,015

(22) Filed: Mar. 23, 2012

(65) Prior Publication Data
US 2012/0243340 A1 Sep. 27, 2012

(30) Foreign Application Priority Data

Mar. 24, 2011 (JP) ................. 2011-065210
May 14, 2011 (JP) ................. 2011-108886

(51) Int. Cl.
*G11C 7/10* (2006.01)

(52) U.S. Cl.
USPC ............ 365/189.2; 365/230.03; 365/230.05; 365/233.11

(58) Field of Classification Search
USPC ............... 365/189.2, 230.03, 230.05, 233.11
See application file for complete search history.

(56) References Cited

U.S. PATENT DOCUMENTS

| | | | |
|---|---|---|---|
| 5,218,607 A | 6/1993 | Saito et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,507,523 B2 | 1/2003 | Pekny | |
| 6,563,174 B2 | 5/2003 | Kawasaki et al. | |
| 6,721,212 B2* | 4/2004 | Sasaki | 365/189.11 |
| 6,727,522 B1 | 4/2004 | Kawasaki et al. | |
| 6,822,279 B2 | 11/2004 | Soeda | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| CN | 101258607 A | 9/2008 |
|---|---|---|
| EP | 0 404 061 A2 | 12/1990 |

(Continued)

OTHER PUBLICATIONS

Toshio Kamiya et al.; "Carrier Transport Properties and Electronic Structures of Amorphous Oxide Semiconductors: The present status"; Solid State Physics; 2009; pp. 621-633; vol. 44, No. 9.

(Continued)

*Primary Examiner* — Pho M Luu
(74) *Attorney, Agent, or Firm* — Fish & Richardson P.C.

(57) ABSTRACT

To provide a signal processing circuit including a nonvolatile memory circuit with a novel structure, the signal processing circuit includes an arithmetic portion, a memory, and a control portion for controlling the arithmetic portion and the memory. The control portion includes a set of a volatile memory circuit and a first nonvolatile memory circuit for storing data held in the volatile memory circuit, the memory includes a plurality of second nonvolatile memory circuits, and the first nonvolatile memory circuit and the second nonvolatile memory circuit each include a transistor having a channel in an oxide semiconductor layer and a capacitor in which one of a pair of electrodes is electrically connected to a node which is set in a floating state when the transistor is turned off.

21 Claims, 32 Drawing Sheets

(56) References Cited

U.S. PATENT DOCUMENTS

| | | | |
|---|---|---|---|
| 7,116,571 B2 * | 10/2006 | Miyazaki et al. | 365/94 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,298,977 B2 | 11/2007 | Ohsawa et al. | |
| 7,323,356 B2 | 1/2008 | Hosono et al. | |
| 7,385,224 B2 | 6/2008 | Ishii et al. | |
| 7,394,717 B2 * | 7/2008 | Hidaka | 365/230.03 |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,935,582 B2 | 5/2011 | Iwasaki | |
| 7,956,361 B2 | 6/2011 | Iwasaki | |
| 8,004,481 B2 | 8/2011 | Yamazaki et al. | |
| 8,019,929 B2 | 9/2011 | Kimura | |
| 8,154,024 B2 | 4/2012 | Iwasaki | |
| 8,488,407 B2 * | 7/2013 | Kim | 365/233.1 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0052352 A1 | 3/2003 | Soeda | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0047184 A1 | 3/2004 | Tran et al. | |
| 2004/0127038 A1 | 7/2004 | Carcia et al. | |
| 2005/0017302 A1 | 1/2005 | Hoffman | |
| 2005/0190597 A1 | 9/2005 | Kato | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0010493 A1 | 1/2011 | Kimura et al. | |
| 2011/0101351 A1 | 5/2011 | Yamazaki | |
| 2011/0121878 A1 | 5/2011 | Kato et al. | |
| 2011/0122670 A1 | 5/2011 | Yamazaki et al. | |
| 2011/0128777 A1 | 6/2011 | Yamazaki et al. | |
| 2011/0134683 A1 | 6/2011 | Yamazaki et al. | |
| 2011/0148463 A1 | 6/2011 | Kato et al. | |
| 2011/0156024 A1 | 6/2011 | Koyama et al. | |
| 2011/0157961 A1 | 6/2011 | Yamazaki et al. | |
| 2011/0176357 A1 | 7/2011 | Koyama et al. | |
| 2011/0187410 A1 | 8/2011 | Kato et al. | |
| 2011/0210957 A1 | 9/2011 | Koyama et al. | |
| 2011/0215317 A1 | 9/2011 | Yamazaki et al. | |
| 2012/0032730 A1 | 2/2012 | Koyama | |
| 2012/0051117 A1 | 3/2012 | Yamazaki et al. | |
| 2012/0140550 A1 | 6/2012 | Endo et al. | |
| 2012/0163071 A1 | 6/2012 | Kurokawa | |
| 2012/0170355 A1 | 7/2012 | Ohmaru et al. | |
| 2012/0182788 A1 | 7/2012 | Kurokawa | |
| 2012/0195115 A1 | 8/2012 | Fujita et al. | |
| 2012/0195122 A1 | 8/2012 | Ohmaru | |
| 2012/0206956 A1 | 8/2012 | Fujita | |
| 2012/0212995 A1 | 8/2012 | Kurokawa | |
| 2012/0230078 A1 | 9/2012 | Fujita | |
| 2012/0230138 A1 | 9/2012 | Endo | |
| 2012/0250397 A1 | 10/2012 | Ohmaru | |
| 2012/0250407 A1 | 10/2012 | Kurokawa | |

FOREIGN PATENT DOCUMENTS

| | | |
|---|---|---|
| EP | 1 737 044 A1 | 12/2006 |
| EP | 2 226 847 A2 | 9/2010 |
| EP | 2 339 639 A2 | 6/2011 |
| JP | 49-005562 A | 1/1974 |
| JP | 58-205226 A | 11/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-027419 A | 2/1991 |
| JP | 05-251705 A | 9/1993 |
| JP | 08-264794 A | 10/1996 |
| JP | 10-078836 A | 3/1998 |
| JP | 11-120778 A | 4/1999 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-319682 A | 10/2002 |

(56) References Cited

FOREIGN PATENT DOCUMENTS

| | | |
|---|---|---|
| JP | 2003-078022 A | 3/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-303990 A | 10/2005 |
| JP | 2007-103918 A | 4/2007 |
| JP | 2008-210358 A | 9/2008 |
| JP | 2009-206942 A | 9/2009 |
| KR | 10-2008-0053355 A | 6/2008 |
| WO | 2004/114391 A1 | 12/2004 |
| WO | 2007/029844 A1 | 3/2007 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Kenji Nomura et al.; "Thin-Film Transistor Fabricated in Single-Crystalline Transparent Oxide Semiconductor"; Science; 2003; pp. 1269-1272; vol. 300, No. 5623.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [a; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

(56) References Cited

OTHER PUBLICATIONS

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Amorphous Oxide Semiconductors for High-Performance Flexible Thin-Film Transistors," Jpn, J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (International Patent Application No. PCT/JP2012/056801) mailed May 1, 2012, 5 pages.

International Written Opinion (International Patent Application No. PCT/JP2012/056801) mailed May 1, 2012, 4 pages.

* cited by examiner

- In
- Sn
- Zn
- O

● In
○ Ga
○ Zn
● O

SIGNAL PROCESSING CIRCUIT

TECHNICAL FIELD

One mode of the present invention relates to a signal processing circuit including a nonvolatile memory circuit which can keep a stored logic state even when power is turned off. Further, one mode of the present invention relates to an electronic device including the signal processing circuit.

BACKGROUND ART

A signal processing circuit such as a central processing unit (CPU) has a variety of configurations depending on its application but it is generally provided with some kinds of memory circuits such as a register and a cache memory in addition to a main memory for storing data or a program.

In a memory circuit such as a register or a cache memory, reading and writing of data needs to be performed at higher speed than in a main memory. Thus, in general, a flip-flop or the like is used as a register, and a static random access memory (SRAM) or the like is used as a cache memory. That is, for the register, cache memory, and the like, volatile memory circuits in which data is lost when supply of a power supply voltage is stopped are used.

In order to reduce consumed power, a method for temporarily stopping the supply of a power supply voltage to a signal processing circuit in a period during which data is not input and output has been suggested. In the method, a nonvolatile memory circuit is located in the periphery of a volatile memory circuit such as a register or a cache memory, so that the data is temporarily stored in the nonvolatile memory circuit. Thus, the register, the cache memory, or the like holds data even while the supply of power supply voltage is stopped in the signal processing circuit (e.g., see Patent Document 1).

In addition, in the case where the supply of the power supply voltage is stopped for a long time in a signal processing circuit, data in a volatile memory circuit is transferred to an external memory device such as a hard disk or a flash memory before the supply of the power supply voltage is stopped, so that the data can be prevented from being erased.

REFERENCE

[Patent Document 1] Japanese Published Patent Application No. H10-078836

DISCLOSURE OF INVENTION

In such a signal processing circuit disclosed in Patent Document 1, a ferroelectric is used for a memory element included in a nonvolatile memory circuit. In the memory element including a ferroelectric, a ferroelectric material is fatigued by repetition of data writing, which causes a problem such as a writing error. As a result, the number of rewriting times is limited. In addition, the data processing speed (hereinafter also referred to as access speed), for example, the speed of reading and writing data is low.

In the case where a flash memory is used as the nonvolatile memory circuit, a high voltage is applied to generate a tunnel current, whereby injection or release of electrons is performed. Therefore, there are problems in that memory elements intensively deteriorate by repeatedly performing data rewriting, so that the number of rewriting times is limited. In addition, the access speed is low.

In the case where data in the volatile memory circuit is stored in the external memory device while the supply of power supply voltage is stopped in the signal processing circuit, it takes a long time for returning data from the external memory device to the volatile memory circuit. Therefore, such a signal processing circuit is not suitable in the case where the power supply is stopped for a short time so as to reduce consumed power.

In view of the above problems, it is an object of one mode of the present invention to provide a signal processing circuit including a memory circuit with a novel structure in which a stored logic state is not lost even when power supply is stopped.

One mode of a signal processing circuit of the present invention includes an arithmetic portion, a memory, and a control portion for controlling the arithmetic portion and the memory. The control portion includes a set of a first volatile memory circuit and a first nonvolatile memory circuit for storing data held in the first volatile memory circuit, and the memory includes a second nonvolatile memory circuit. Note that the memory may include the plurality of second nonvolatile memory circuits arranged in matrix. In the control portion, the data held in the first volatile memory circuit is input and stored in the first nonvolatile memory circuit while power supply voltage is supplied (hereinafter also referred to as data storage). Data can be stored concurrently with holding of predetermined data in the first volatile memory circuit or can be stored after holding of the data therein. Then, the data stored in the first nonvolatile memory circuit is made not to change in response to a signal from the first volatile memory circuit (hereinafter also referred to as data standby). Specifically, in the first nonvolatile memory circuit, a node in which a signal potential corresponding to the data is held is set in a floating state. After the data standby, the supply of power supply voltage is stopped in the entire control portion (or in most of the control portion). Even after the supply of power supply voltage is stopped, the data in the first volatile memory circuit can be held in the first nonvolatile memory circuit. Then, as needed, power supply voltage is selectively supplied to the entire control portion or part thereof. After that, in a part of the control portion where the supply of power supply voltage is selected, the data held in the first nonvolatile memory circuit is moved to the first volatile memory circuit (hereinafter also referred to as data provision). Thus, in the part of the control portion where the supply of power supply voltage is selected, the first volatile memory circuit can perform predetermined operation.

In this manner, the power consumption of the signal processing circuit can be drastically reduced by employing a driving method in which power supply voltage is supplied only when needed (hereinafter also referred to as a normally-off driving method) as described above. In addition, the speed of writing and reading data in the first volatile memory circuit is higher than that in the first nonvolatile memory circuit. Thus, the operation speed in the part of the control portion where the supply of power supply voltage is selected can be increased. Therefore, the signal processing circuit can be operated at high speed. In addition, the memory can continue to hold data even after the supply of power supply voltage is stopped.

(Configuration of Nonvolatile Memory Circuit)

Here, the above-mentioned nonvolatile memory circuit (each of the first nonvolatile memory circuit and the second nonvolatile memory circuit) includes a transistor with extremely low off-state current and a capacitor in which one of a pair of electrodes (hereinafter referred to as one electrode) is electrically connected to a node which is set in a floating state when the transistor is turned off. Data is stored (or memorized) in the nonvolatile memory circuit by controlling the potential (or the amount of electric charge corresponding to the potential) of the one electrode of the capacitor, depending on the data. For example, a state where predetermined electric charge is accumulated (also referred to as charged) in the capacitor is made to correspond to data "1" and a state where the predetermined electric charge is not accumulated in the capacitor is made to correspond to data "0", whereby 1-bit data can be stored. Here, as the transistor with extremely low off-state current, it is possible to use a transistor having a channel in a layer or substrate including a semiconductor whose band gap is wider than that of silicon. A compound semiconductor is an example of the semiconductor whose band gap is wider than that of silicon. Examples of the compound semiconductor include an oxide semiconductor, a nitride semiconductor, and the like. For example, a transistor having a channel in an oxide semiconductor layer can be used as a transistor with extremely low off-state current.

When the transistor with extremely low off-state current is turned off in such a nonvolatile memory circuit, the potential of one electrode of the capacitor can be held for a long time even after the supply of power supply voltage is stopped. Therefore, in a memory including a nonvolatile memory circuit having the above configuration, regular data rewriting (hereinafter also referred to as refresh operation) is not needed or the frequency of refresh operation can be markedly decreased.

In addition, such a nonvolatile memory circuit has a configuration of storing data in a manner such that a signal potential corresponding to data is input to a predetermined node (the one electrode of the capacitor), the transistor with extremely low off-state current is turned off, and the node is set in a floating state. Therefore, in the nonvolatile memory circuit, fatigue by repeating writing of data can be alleviated and the number of times data can be written can be increased Here, the transistor with extremely low off-state current that is included in the first nonvolatile memory circuit (the nonvolatile memory circuit of the control portion) and the transistor with extremely low off-state current that is included in the second nonvolatile memory circuit (the nonvolatile memory circuit of the memory) can be formed in the same step. For example, gate electrodes of these transistors can be formed by etching of one conductive film; source electrodes and drain electrodes of these transistors can be formed by etching of one conductive film; and active layers (semiconductor layers where channels are formed) of these transistors can be formed by etching of one semiconductor layer.

In addition, the capacitor included in the first nonvolatile memory circuit (the nonvolatile memory circuit of the control portion) and the capacitor included in the second nonvolatile memory circuit (the nonvolatile memory circuit of the memory) can be formed in the same step. For example, each one electrode of these capacitors can be formed by etching of one conductive film; and dielectric layers of these capacitors can be formed by etching of one insulating film. Note that the dielectric layers of these capacitors can be provided in common without being separated from each other. Further, for example, the others of the pairs of electrodes (hereinafter referred to as each the other electrode) of these capacitors can be formed by etching of one conductive film. Note that each the other electrode of these capacitors can be provided in common without being separated from each other. In this case, conductive layer which is provided in common without being separated from each other can be used as a shielding layer or a light-blocking layer. For example, when the conductive layer is provided so as to cover an element such as a transistor which is included in the signal processing circuit, the adverse effect of an external electric field or the like on the element which is included in the signal processing circuit can be reduced. Further, for example, when the conductive layer is provided so as to cover a surface (a front surface or a rear surface) of a substrate over which an element such as a transistor included in the signal processing circuit is formed, the adverse effect of an external electric field or the like on the element included in the signal processing circuit can be reduced. As described above, when each the other electrode of the capacitors each function as a shielding layer or a light-blocking layer, a highly reliable signal processing circuit can be provided without increasing the number of manufacturing processes.

(Configuration of Volatile Memory Circuit)

The first volatile memory circuit (the volatile memory circuit included in the control portion) can include at least two arithmetic circuits, which constitute a feedback loop in which an output of one of the arithmetic circuits is input to the other of the arithmetic circuits and an output of the other of the arithmetic circuits is input to the one of the arithmetic circuits. A flip-flop circuit and a latch circuit can be given as examples of the memory circuit having such a configuration.

Note that a CPU, a large scale integrated circuit (LSI) such as a microprocessor, an image processing circuit, a digital signal processor (DSP), or a field programmable gate array (FPGA), and the like are included in the signal processing circuit of the preset invention in its category. The arithmetic portion can also be referred to as an arithmetic logic unit (ALU). The memory can function as a main memory for storing data or a program.

(Variation of Arithmetic Portion)

The arithmetic portion may include a set of a second volatile memory circuit and a third nonvolatile memory circuit for storing data held in the second volatile memory circuit. The third nonvolatile memory circuit can have a configuration similar to those of the first nonvolatile memory circuit and the second nonvolatile memory circuit. Here, for example, a flip-flop circuit which inputs and outputs data in synchronization with clock signals can be used as the second volatile memory circuit (the volatile memory circuit of the arithmetic portion).

Here, a transistor with extremely low off-state current that is included in the third nonvolatile memory circuit (the nonvolatile memory circuit of the arithmetic portion), the transistor with extremely low off-state current that is included in the first nonvolatile memory circuit (the nonvolatile memory circuit of the control portion), and the transistor with extremely low off-state current that is included in the second nonvolatile memory circuit (the nonvolatile memory circuit of the memory) can be formed in the same step. For example, gate electrodes of these transistors can be formed by etching of one conductive film; source electrodes and drain electrodes of these transistors can be formed by etching of one conductive film; and active layers (semiconductor layers where channels are formed) of these transistors can be formed by etching of one semiconductor layer.

In addition, the capacitor included in the third nonvolatile memory circuit (the nonvolatile memory circuit of the arithmetic portion), the capacitor included in the first nonvolatile memory circuit (the nonvolatile memory circuit of the control portion), and the capacitor included in the second nonvolatile memory circuit (the nonvolatile memory circuit of the memory) can be formed in the same step. For example, each one electrode of these capacitors can be formed by etching of one conductive film; and dielectric layers of these capacitors can be formed by etching of one insulating film. Note that the dielectric layers of these capacitors can be provided in common without being separated from each other. Further, for example, each the other electrode of these capacitors can be formed by etching of one conductive film. Note that each the other electrode of these capacitors can be provided in common without being separated from each other. In this case, conductive layer which is provided in common without being separated from each other can be used as a shielding layer or a light-blocking layer. For example, when the conductive layer is provided so as to cover an element such as a transistor which is included in the signal processing circuit, the adverse effect of an external electric field or the like on the element which is included in the signal processing circuit can be reduced. Further, for example, when the conductive layer is provided so as to cover a surface (a front surface or a rear surface) of a substrate over which an element such as a transistor which is included in the signal processing circuit is formed, the adverse effect of an external electric field or the like on the element which is included in the signal processing circuit can be reduced. As described above, when each the other electrode of the capacitors each function as a shielding layer or a light-blocking layer, a highly reliable signal processing circuit can be provided without increasing the number of manufacturing processes.

(Variation of Control Portion)

The control portion can include a decoder, a control circuit, a register, and a power supply circuit.

The decoder decodes a command. In addition, the decoder may have a function of inputting a control signal to the power supply circuit or the control circuit by an input from external when the supply of power supply voltage to the memory is stopped. Further, the decoder may have a counter (timer) and have a function of inputting a control signal to the power supply circuit or the control circuit by the counter (timer) when the supply of power supply voltage to the memory is stopped. The control circuit controls the register, the arithmetic portion, and the memory, based on the decoded command. The register temporarily stores data input to the arithmetic portion and data output from the arithmetic portion. The power supply circuit is controlled by the decoder, and the power supply circuit controls the supply of power supply voltage to the arithmetic portion, the control circuit, the register, and the memory. Note that the arithmetic portion, the control circuit, the register, and the memory are also each referred to as a module. Here, the power supply circuit can select the supply or stop of power supply voltage in each module. That is, the power supply circuit can supply power supply voltage to all the modules (the arithmetic portion, the control circuit, the register, and the memory) and the power supply circuit can selectively supply power supply voltage to some of the modules (any of the arithmetic portion, the control circuit, the register, and the memory).

The register can include a set of a third volatile memory circuit and a fourth nonvolatile memory circuit for storing data held in the third volatile memory circuit, and the control circuit can include a set of a fourth volatile memory circuit and a fifth nonvolatile memory circuit for storing data held in the fourth volatile memory circuit. The third volatile memory circuit and the fourth volatile memory circuit each correspond to the first volatile memory circuit (the volatile memory circuit of the control portion). The fourth nonvolatile memory circuit and the fifth nonvolatile memory circuit each correspond to the first nonvolatile memory circuit (the nonvolatile memory circuit of the control portion).

Here, for example, a flip-flop circuit or a latch circuit which inputs and outputs data in synchronization with clock signals can be used as the third volatile memory circuit of the register. In addition, for example, a flip-flop circuit which inputs and outputs data in synchronization with clock signals can be used as the fourth volatile memory circuit of the control portion.

Note that in the register, the plurality of fourth nonvolatile memory circuits for storing 1-bit data may be provided for each of the third volatile memory circuits for storing 1-bit data. Here, the plurality of fourth nonvolatile memory circuits are also each referred to as a bank. In this manner, when the supply of power supply voltage is selected in the case of carrying out a normally-off driving method, one fourth nonvolatile memory circuit (a bank) is selected from the plurality of fourth nonvolatile memory circuits (the plurality of banks) and 1-bit data which is held in the selected fourth nonvolatile memory circuit (the bank) is provided for the third volatile memory circuit (data provision), so that the state of the register can be selected from a plurality of states.

With the use of the above nonvolatile memory circuit having a novel configuration for the signal processing circuit, the signal processing circuit can continue to hold data for a long time even after the supply of power supply voltage is stopped. Thus, a normally-off driving method can be carried out. Accordingly, power consumption of the signal processing circuit can be drastically reduced. The signal processing circuit can start predetermined processing with data held, shortly after the supply of power supply voltage is selected. Therefore, time from selection of the supply of power supply voltage to start of predetermined processing can be shortened in the signal processing circuit. In addition, predetermined processing is performed using a volatile memory circuit in a module supplied with power supply voltage; therefore, the access speed of the signal processing circuit can be increased. Further, a highly reliable circuit whose number of times data can be written is high is used as the nonvolatile memory circuit for the signal processing circuit; therefore, the durability and reliability of the signal processing circuit can be improved.

In particular, the following advantageous effect can be obtained in a manner such that a set of the volatile memory circuit and the nonvolatile memory circuit for storing data held in the volatile memory circuit is provided for each of the register and the control circuit of the control portion or each of the register, the control circuit, and the arithmetic portion of the control portion, that the nonvolatile memory circuit is provided for the memory, and that the supply of power supply voltage to each module is controlled by the power supply circuit.

Without moving data between modules, supply and standby of data can be performed before and after the supply of power supply voltage is stopped. Therefore, it is not necessary to provide a special signal path (a path or a scan path) for performing supply and standby of data between modules, and the size of the signal processing circuit can be increased easily.

BEST MODE FOR CARRYING OUT THE INVENTION

Figure 1A:
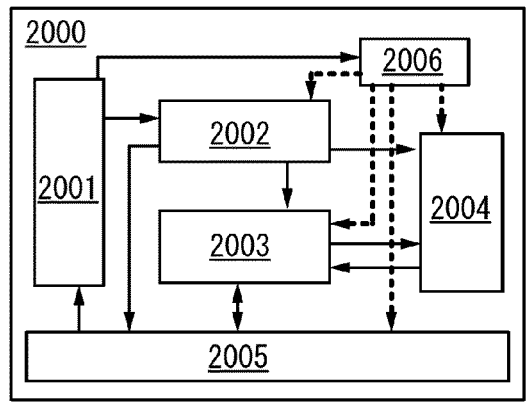
FIGS. 1A to 1E are diagrams illustrating configurations of a signal processing circuit.

Embodiments and example of the present invention will be described below with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments and example below.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that the term "electrically connected" includes the case where components are connected through an "object having any electric function". There is no particular limitation on an object having any electric function as long as electric signals can be transmitted and received between components that are connected through the object.

In addition, even when independent components are electrically connected to each other in a circuit diagram, there is the case where one conductive film has functions of a plurality of components, such as the case where part of a wiring functions as an electrode or a terminal. The "electrical connection" in this specification includes in its category such a case where one conductive film has functions of a plurality of components.

The terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

Embodiment 1

One mode of a signal processing circuit will be described. FIG. 1A is a block diagram schematically illustrating a configuration of a signal processing circuit. A signal processing circuit 2000 includes a decoder 2001, a control circuit 2002, an ALU 2003, a register 2004, a memory 2005, and a power supply circuit 2006.

The decoder 2001 decodes a command. The control circuit 2002 controls the register 2004, the ALU 2003, and the memory 2005, based on the decoded command. The register 2004 temporarily stores data input to the ALU 2003 and data output from the ALU 2003. Data input/output is performed also between the ALU 2003 and the memory 2005. The power supply circuit 2006 is controlled by the decoder 2001, and the power supply circuit 2006 controls the supply of power supply voltage to the ALU 2003, the control circuit 2002, the register 2004, and the memory 2005. Here, the power supply circuit 2006 can stop the supply of power supply voltage to all the modules (the ALU 2003, the control circuit 2002, the register 2004, and the memory 2005) and can supply power supply voltage to all the modules. Alternatively, the power supply circuit 2006 can selectively supply power supply voltage to some of the modules (any of the ALU 2003, the control circuit 2002, the register 2004, and the memory 2005) and the power supply circuit 2006 can stop the supply of power supply voltage to the other modules.

(Nonvolatile Memory Circuit)

Figure 1B:
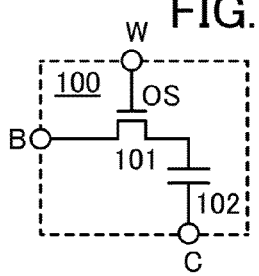

The control circuit 2002, the register 2004, and the memory 2005 can each include a nonvolatile memory circuit 100 illustrated in FIG. 1B. Note that the ALU 2003 can also include the nonvolatile memory circuit 100 illustrated in FIG. 1B. In FIG. 1B, the nonvolatile memory circuit 100 includes a transistor 101 and a capacitor 102. A gate of the transistor 101 is electrically connected to a terminal W. One of a source and a drain of the transistor 101 is electrically connected to a terminal B. The other of the source and the drain of the transistor 101 is electrically connected to one electrode of the capacitor 102. The other electrode of the capacitor 102 is electrically connected to a terminal C.

Here, a transistor with extremely low off-state current can be used as the transistor 101. The one electrode of the capacitor 102 is electrically connected to a node which is set in a floating state when the transistor 101 is turned off. Data is stored in the nonvolatile memory circuit 100 by controlling the potential (or the amount of electric charge corresponding to the potential) of the one electrode of the capacitor 102, depending on the data. For example, a state where predetermined electric charge is accumulated in the capacitor 102 is made to correspond to data "1" and a state where the predetermined electric charge is not accumulated in the capacitor 102 is made to correspond to data "0", whereby 1-bit data can be stored. Here, as the transistor 101 whose off-state current is extremely low, it is possible to use a transistor having a channel in a layer or substrate including a semiconductor whose band gap is wider than that of silicon. A compound semiconductor is an example of the semiconductor whose band gap is wider than that of silicon. Examples of the compound semiconductor include an oxide semiconductor, a nitride semiconductor, and the like. For example, a transistor having a channel in an oxide semiconductor layer can be used. FIG. 1B illustrates an example of in which a transistor having a channel in an oxide semiconductor layer is used as the transistor 101, beside which "OS" is written.

(Method for Driving Nonvolatile Memory Circuit 100)

In the nonvolatile memory circuit 100, the transistor 101 is turned on in response to a control signal input to the terminal W, and a signal potential corresponding to data is input to the terminal B. Then, when the transistor 101 is turned off by a control signal input to the terminal W, the data can be held. The nonvolatile memory circuit 100 can have a configuration in which a given potential is supplied to the terminal C. For example, a ground potential can be supplied to the terminal C. Since the off-state current of the transistor 101 is extremely low, the potential of the one electrode of the capacitor 102 can be held for a long time even after the supply of power supply voltage is stopped. Data is read from the nonvolatile memory circuit 100 in the following manner the transistor 101 is turned on in response to the control signal input to the terminal W, and the potential (or the amount of electric charge corresponding to the potential) of the one electrode of the capacitor 102 is detected from the terminal B. The nonvolatile memory circuit 100 stores data in a manner such that a signal potential corresponding to data is input to a predetermined node (the one of the pair of the electrodes of the capacitor 102), the transistor 101 with extremely low off-state current is turned off, and the node is set in a floating state. Therefore, in the nonvolatile memory circuit 100, fatigue of the nonvolatile memory circuit 100 by repeating data writing can be reduced and the number of times data can be written can be increased (Configurations of Control Circuit 2002, Register 2004, and ALU 2003)

Figure 1C:
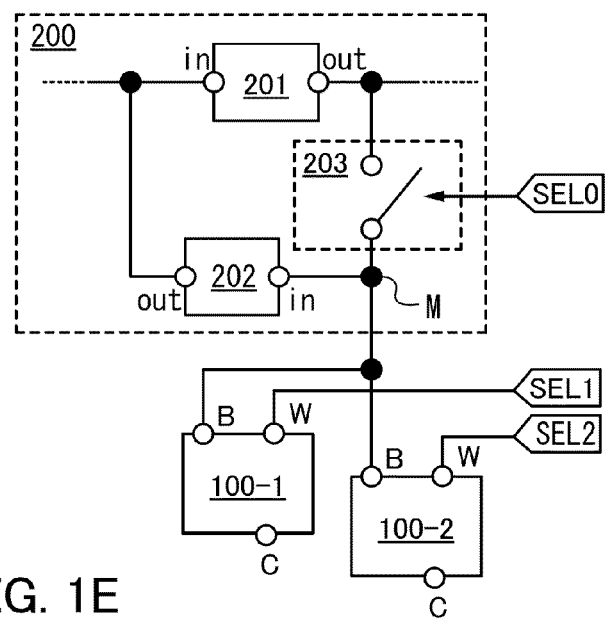

Here, the control circuit 2002 and the register 2004, or the control circuit 2002, the register 2004, and the ALU 2003 can each include a set of a volatile memory circuit and the nonvolatile memory circuit 100 illustrated in FIG. 1B. FIG. 1C is a diagram illustrating the configuration of the set. FIG. 1C illustrates an example in which the two nonvolatile memory circuits 100 in FIG. 1B (a nonvolatile memory circuit 100-1 and a nonvolatile memory circuit 100-2) are provided for a volatile memory circuit 200 for storing 1-bit data. Without limitation to the above, one nonvolatile memory circuit 100 in FIG. 1B or three or more nonvolatile memory circuits 100 in FIG. 1B may be provided for the volatile memory circuit 200 for storing 1-bit data. In particular, in the register 2004, a configuration including a set of the plurality of nonvolatile memory circuits 100 provided for the volatile memory circuit 200 for storing 1-bit data can be employed. In each of the control circuit 2002 and the ALU 2003, a configuration including a set of one nonvolatile memory circuit 100 provided for the volatile memory circuit 200 for storing 1-bit data can be employed.

The volatile memory circuit 200 can include at least two arithmetic circuits, which can constitute a feedback loop in which an output of one of the arithmetic circuits is input to the other of the arithmetic circuits and an output of the other of the arithmetic circuits is input to the one of the arithmetic circuits. In FIG. 1C, an arithmetic circuit 201 and an arithmetic circuit 202, which constitute a feedback loop in which an output of the arithmetic circuit 201 is input to the arithmetic circuit 202 and an output of the arithmetic circuit 202 is input to the arithmetic circuit 201 are included. Examples of the arithmetic circuit include an inverter circuit and a NAND circuit. A flip-flop circuit and a latch circuit can be given as examples of the nonvolatile memory circuit 200 having such a configuration.

A terminal B of the nonvolatile memory circuit 100-1 and a terminal B of the nonvolatile memory circuit 100-2 are each electrically connected to a node M which exists between an input terminal of the arithmetic circuit 202 and an output terminal of the arithmetic circuit 201. The volatile memory circuit 200 includes a switch 203 for selecting an electrical connection between the node M and the output terminal of the arithmetic circuit 201. A conduction state or a non-conduction state of the switch 203 is selected by a control signal SEL0. Note that in the case where the arithmetic circuit 201 is a circuit for selectively outputting a signal in response to a control signal (e.g., a clock signal), the switch 203 is not necessarily provided and can be omitted. A control signal SEL1 is input to a terminal W of the nonvolatile memory circuit 100-1, and a control signal SEL2 is input to a terminal W of the nonvolatile memory circuit 100-2. Note that the same potential is input to a terminal C of the nonvolatile memory circuit 100-1 and a terminal C of the nonvolatile memory circuit 100-2.

Next, a method for driving the set of the volatile memory circuit 200, the nonvolatile memory circuit 100-1, and the nonvolatile memory circuit 100-2 illustrated in FIG. 1C will be described.

(Operation During Supply of Power Supply Voltage)

While power supply voltage is supplied to the set, that is, while power supply voltage is supplied to a module which includes the set, the switch 203 is in a conduction state by the control signal SEL0. In this manner, the volatile memory circuit 200 stores data by the feedback loop constituted of the arithmetic circuit 201 and the arithmetic circuit 202. That is, in the set illustrated in FIG. 1C, input data is held by the feedback loop of the volatile memory circuit 200, and data is output from the feedback loop of the volatile memory circuit

200. Data can be held and output at high speed by the feedback loop of the volatile memory circuit 200.

(Operation of Storing Data)

As described above, while or after data is held by the feedback loop of the volatile memory circuit 200, the transistor 101 of the nonvolatile memory circuit 100-1 or the transistor 101 of the nonvolatile memory circuit 100-2 is selectively turned on in response to the control signal SEL1 and the control signal SEL2 with the switch 203 kept in a conduction state by the control signal SEL0. For example, the transistor 101 of the nonvolatile memory circuit 100-1 is turned on, and the transistor 101 of the nonvolatile memory circuit 100-2 is turned off. In this manner, the potential of the node M of the volatile memory circuit 200 is input to one electrode of the capacitor 102 of the nonvolatile memory circuit 100-1, so that the data held in the volatile memory circuit 200 can be stored in the nonvolatile memory circuit 100-1. Thus, the data can be stored.

(Operation of Data Standby)

After the data is stored, the data stored in the nonvolatile memory circuit 100-1 is made not to change in response to a signal from the volatile memory circuit 200 by turning off the transistor 101 of the nonvolatile memory circuit 100-1. Thus, standby of the data can be performed.

In the configuration in which the plurality of nonvolatile memory circuits 100 in FIG. 1B are provided for the volatile memory circuit 200 for storing 1-bit data, in the case where the volatile memory circuit 200 holds different data in different periods, a plurality of pieces of data corresponding to the periods can be stored in the different nonvolatile memory circuits 100. In particular, in the register, in the case where a configuration including a set of the plurality of nonvolatile memory circuits 100 provided for the volatile memory circuit 200 for storing 1-bit data is employed, the plurality of nonvolatile memory circuits 100 can each be referred to as a bank. In this manner, each of the states of the register in different periods can be stored in the plurality of banks.

Note that even in the case where a configuration including a set of the one nonvolatile memory circuit 100 provided for the volatile memory circuit 200 for storing 1-bit data is employed, data held in the volatile memory circuit 200 is stored in the nonvolatile memory circuit 100 through the operation similar to the above operation. Thus, standby of the data can be performed.

As described above, after standby of the data, the supply of power supply voltage is stopped.

(Operation of Supplying Data)

After the supply of power supply voltage to the set is selected, that is, after power supply voltage begins to be supplied to the module which includes the set, the switch 203 is brought out of conduction by the control signal SEL0, and the transistor 101 of the nonvolatile memory circuit 100-1 or the transistor 101 of the nonvolatile memory circuit 100-2 is selectively turned on in response to the control signal SEL1 and the control signal SEL2. For example, the transistor 101 of the nonvolatile memory circuit 100-1 is turned on, and the transistor 101 of the nonvolatile memory circuit 100-2 is turned off. In this manner, the potential (or the amount of electric charge corresponding to the potential) of the one electrode of the capacitor 102 of the nonvolatile memory circuit 100-1 is input to the node M of the volatile memory circuit 200. After that, the switch 203 is brought into conduction by the control signal SEL0. In such a manner, the data held in the nonvolatile memory circuit 100-1 can be input to the volatile memory circuit 200 and can be held by the feedback loop. Thus, the data can be supplied to the volatile memory circuit 200. Here, the speed of writing and reading data in the volatile memory circuit 200 is higher than that in the nonvolatile memory circuit 100-1 or the nonvolatile memory circuit 100-2. Therefore, the set in which the supply of power supply voltage is selected can have higher operation speed.

In the configuration in which the plurality of nonvolatile memory circuits 100 in FIG. 1B are provided for the volatile memory circuit 200 for storing 1-bit data, data held in the nonvolatile memory circuit 100 which is selected from the plurality of nonvolatile memory circuits 100 can be supplied to the volatile memory circuit 200. In particular, in the register, in the case where a configuration including a set of the plurality of nonvolatile memory circuits 100 provided for the volatile memory circuit 200 for storing 1-bit data is employed, data is selectively supplied to the volatile memory circuit 200 from the plurality of banks, so that the state of the register after the supply of power supply voltage is selected can be selected from a plurality of states.

Note that even in the case where a configuration including a set of the one nonvolatile memory circuit 100 provided for the volatile memory circuit 200 for storing 1-bit data is employed, data held in the nonvolatile memory circuit 100 can be input to the volatile memory circuit 200 through the operation similar to the above operation. Thus, the data can be supplied to the volatile memory circuit 200.

Note that in the case where a configuration in which the arithmetic circuit 201 serves as a circuit for selectively outputting a signal in response to a control signal (e.g., a clock signal) and the switch 203 is omitted is employed, the arithmetic circuit 201 is controlled so that there is no output (i.e., an output from the arithmetic circuit 201 is a restricted combination) from the arithmetic circuit 201 when the switch 203 is in a non-conduction state in the above description. The method for driving the components except the arithmetic circuit 201 can be similar to the above driving method.

The above is the description of the method for driving the set of the volatile memory circuit 200, the nonvolatile memory circuit 100-1, and the nonvolatile memory circuit 100-2 illustrated in FIG. 1C.

(Variation of Set of Volatile Memory Circuit and Nonvolatile Memory Circuit)

Figure 1D:
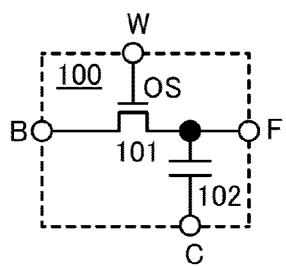
Figure 1E:
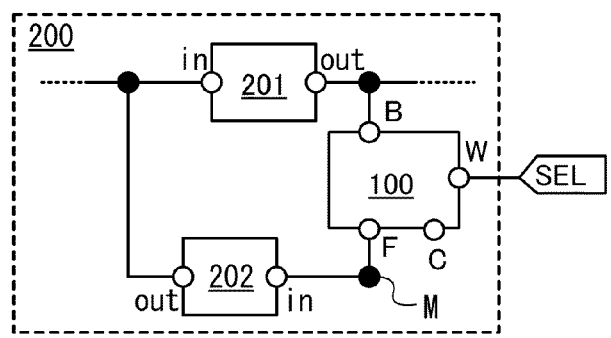

The configuration of a set of a volatile memory circuit and a nonvolatile memory circuit for storing data held in the volatile memory circuit is not limited to the configuration in FIG. 1C. For example, the configuration illustrated in FIG. 1E can be employed. Note that in FIG. 1E, the same portions as those in FIG. 1C are denoted by the same reference numerals and description thereof is omitted. In a set having the configuration in FIG. 1E, a nonvolatile memory circuit 100 is included in a volatile memory circuit 200. In FIG. 1E, a terminal F of the nonvolatile memory circuit 100 is a terminal electrically connected to one electrode of a capacitor 102, as illustrated in FIG. 1D.

A method for driving the set having the configuration in FIG. 1E will be described.

(Operation during Supply of Power Supply Voltage)

While power supply voltage is supplied to the set, that is, while power supply voltage is supplied to a module which includes the set, a transistor 101 of the nonvolatile memory circuit 100 is turned on in response to a control signal SEL. In this manner, the volatile memory circuit 200 stores data by a feedback loop constituted of an arithmetic circuit 201 and an arithmetic circuit 202. That is, in the set illustrated in FIG. 1E, input data is held by the feedback loop of the volatile memory circuit 200, and data is output from the feedback loop of the volatile memory circuit 200. Data can be held and output at high speed by the feedback loop of the volatile memory circuit 200.

(Operation of Data Storage)

As described above, while data is held by the feedback loop of the volatile memory circuit 200, the potential of a node M of the volatile memory circuit 200 is input to the one electrode of the capacitor 102 of the nonvolatile memory circuit 100, so that the data held in the volatile memory circuit 200 can be stored in the nonvolatile memory circuit 100. Thus, the data can be stored.

(Operation of Data Standby)

After the data is stored, the data stored in the nonvolatile memory circuit 100 is made not to change in response to a signal from the arithmetic circuit 201 of the volatile memory circuit 200 by turning off the transistor 101 of the nonvolatile memory circuit 100. Thus, standby of the data can be performed.

As described above, after standby of the data, the supply of power supply voltage is stopped.

(Operation of Supplying Data)

After the supply of power supply voltage to the set is selected, that is, after power supply voltage begins to be supplied again to the module which includes the set, the transistor 101 of the nonvolatile memory circuit 100 is turned on in response to the control signal SEL. In this manner, the potential (or the amount of electric charge corresponding to the potential) of the one electrode of the capacitor 102 of the nonvolatile memory circuit 100 is input to the node M of the volatile memory circuit 200. In such a manner, the data held in the nonvolatile memory circuit 100 can be held by the feedback loop of the volatile memory circuit 200. Thus, the data can be supplied to the volatile memory circuit 200. Here, the speed of writing and reading data in the volatile memory circuit 200 is higher than that in the nonvolatile memory circuit 100. Therefore, the set in which the supply of power supply voltage is selected can have higher operation speed.

Note that the following configuration is preferable when the data is supplied. In the case where the transistor 101 of the nonvolatile memory circuit 100 is turned on in response to the control signal SEL after the supply of power supply voltage is selected, a signal is not output from the arithmetic circuit 201 (i.e., an output of the arithmetic circuit 201 is a restricted combination). For example, it is preferable to use a circuit for selectively outputting a signal in response to a control signal (e.g., a clock signal) as the arithmetic circuit 201. Further, for example, a switch or the like is provided between an output terminal of the arithmetic circuit 201 and a terminal B of the volatile memory circuit 100. In that case, in the case where the transistor 101 of the nonvolatile memory circuit 100 is turned on in response to the control signal SEL after the supply of power supply voltage is selected, it is preferable to bring the switch out of conduction.

The above is the description of the method for driving the set of the volatile memory circuit 200 and the nonvolatile memory circuit 100 illustrated in FIG. 1E.

For each of the register 2004 and the control circuit 2002 or each of the register 2004, the control circuit 2002, and the ALU 2003, the set having the configuration in FIG. 1C or 1E can be provided, and the supply of power supply voltage to each module can be controlled by the power supply circuit 2006. In such a manner, the power consumption of the signal processing circuit can be drastically reduced by carrying out a normally-off driving method in which power supply voltage is supplied only when needed. Without moving data between modules, supply and standby of data can be performed before and after the supply of power supply voltage. Therefore, it is not necessary to provide a special signal path (a path or a scan path) for performing supply and standby of data between modules, and the circuit size of the signal processing circuit can be increased easily.

(Configuration of Memory 2005)

(Configuration of Memory Cell Array)

The memory 2005 can include a memory cell array including the plurality of nonvolatile memory circuits 100 in FIG. 1B arranged in matrix. For example, the configuration in FIG. 2B can be employed for the memory cell array. A memory cell array 400 illustrated in FIG. 2B includes m×n (m is a natural number and n is a natural number) nonvolatile memory circuits 100 $(i,j)$ (i is a natural number of m or less and j is a natural number of n or less). The nonvolatile memory circuit 100 $(i,j)$ can be the nonvolatile memory circuit 100 in FIG. 1B. Hereinafter, the nonvolatile memory circuit 100 $(i,j)$ is also referred to as a memory cell.

Figure 2A:
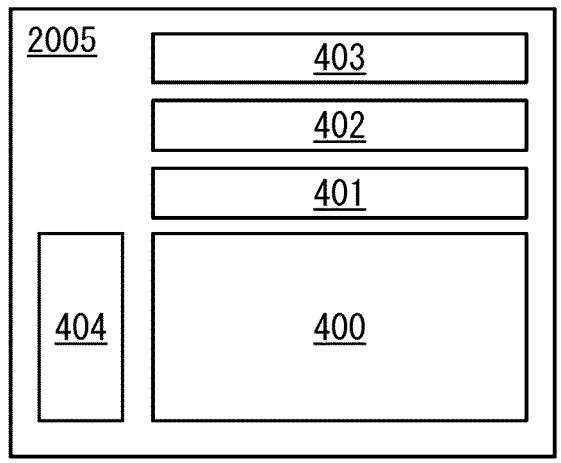
FIGS. 2A and 2B are diagrams illustrating a configuration of a memory.
Figure 2B:
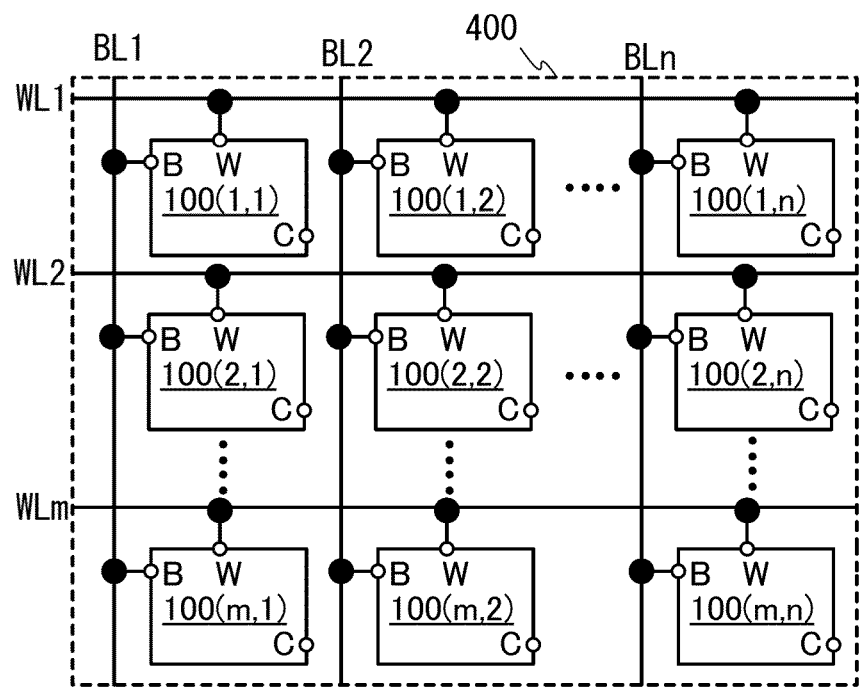

In FIG. 2B, a wiring (BLj) that is electrically connected to the terminal B is used in common among the memory cells arranged in one column. For example, a wiring BL1 that is electrically connected to the terminal B is used in common among the memory cells arranged in a first column. The wiring BLj can be referred to as a bit line.

In FIG. 2B, a wiring (WLi) that is electrically connected to the terminal W is used in common among the memory cells arranged in one row. For example, a wiring WL1 that is electrically connected to the terminal W is used in common among the memory cells arranged in a first row. The wiring WLi can be referred to as a word line.

However, this embodiment is not limited to this configuration. The plurality of wirings BLj may be provided in the memory cells arranged in one column, or the plurality of wirings WLi may be provided in the memory cells arranged in one row. In the m×n memory cells, the terminals C may be electrically connected to one electrode or one wiring or may be electrically connected to different electrodes or different wirings.

In the memory cell array 400 illustrated in FIG. 2B, data is selectively written to and read from the memory cell in a row specified in response to a signal input to the wiring WLi. Specifically, the transistors 101 in the memory cells in rows other than the memory cells in the i-th row to which data is written are turned off and the transistors 101 in the memory cells in the i-th row to which data is written is turned on in response to a signal input to the wiring WLi; thus, the data is selectively written. Further, the transistors 101 in the memory cells in rows other than the memory cells in the i-th row from which data is read are turned off and the transistors 101 in the memory cells in the i-th row from which data is read is turned on in response to a signal input to the wiring WLi; thus, the data is selectively read. Note that a method for writing and reading data to and from a specified memory cell is similar to the method for driving the nonvolatile memory circuit 100 which is described above; thus, description thereof is omitted.

(Configuration except Memory Cell Array)

The memory 2005 can include any of or all of a row decoder, a column decoder, a precharge circuit, a sense amplifier, and a temporary memory circuit in addition to the memory cell array 400. Note that some of these circuits can be merged into a single circuit. For example, the sense amplifier may function as a temporary memory circuit.

The row decoder and the column decoder each have a function of selecting a given memory cell in the memory cell array 400. The memory 2005 writes and reads data to and from the memory cell selected by the row decoder and the column decoder. The precharge circuit has a function of setting (precharging) the potential of a bit line included in the memory cell array 400 to a predetermined potential before data is read from the memory cell. Since data can be read from the memory cell after the potential of the bit line is set (precharged) to the predetermined potential by the precharge circuit, the speed of reading data from the memory cell can be increased. The sense amplifier has a function of amplifying the potential of the bit line that corresponds to data held in the memory cell and outputting the amplified potential. Data can be read more quickly and accurately by the sense amplifier. The temporary memory circuit is also referred to as a page buffer or a latch circuit and has a function of temporarily holding data input from the outside of the memory 2005. The temporary memory circuit may have a function of holding data read from the memory cell array.

FIG. 2A schematically illustrates one mode of the configuration of the memory 2005. In FIG. 2A, the memory 2005 includes the memory cell array 400, a column decoder 403, a row decoder 404, a precharge circuit 402, and a sense amplifier 401.

Note that although FIG. 2A illustrates the configuration in which the precharge circuit 402 and the sense amplifier 401 are provided on a side of the memory cell array 400 where the column decoder 403 is provided, one mode of the present invention is not limited to this configuration. One or both of the precharge circuit 402 and the sense amplifier 401 may be provided on a side that faces the column decoder 403 with the memory cell array 400 provided therebetween. The precharge circuit 402 and the sense amplifier 401 may be merged into a single circuit.

Here, arrangement of the circuits is not limited to the arrangement schematically illustrated in FIG. 2A, which is merely one mode of the configuration of the memory 2005. For example, in practice, the other circuits (the column decoder 403, the row decoder 404, the precharge circuit 402, and the sense amplifier 401) can be formed so as to overlap with the memory cell array 400. In addition, the memory cell array 400 can be divided and the divided memory cell arrays can be stacked to overlap (can be multilayered). In this manner, memory capacity can be increased while the area of the memory cell array 400 is reduced.

(Configuration of Sense Amplifier)

Next, one specific mode of the configuration of the sense amplifier 401 in FIG. 2A will be described. The sense amplifier 401 can include a plurality of sense amplifiers. Each of the sense amplifiers can be provided per bit line provided in the memory cell array 400. The potential of the bit line can be amplified by each of the sense amplifiers and can be detected from an output terminal of each of the sense amplifiers. Here, the potential of the bit line is based on a signal potential held in a memory cell that is electrically connected to the bit line and from which data is read. Thus, a signal output from the output terminal of each of the sense amplifiers corresponds to data held in the memory cell from which data is read. In this manner, data held in each memory cell in the memory cell array 400 can be detected by the sense amplifier 401.

The sense amplifier can be formed using an inverter or a buffer. For example, the sense amplifier can be formed using a latch circuit (a latch sense amplifier). The latch sense amplifier can amplify an input signal and can hold the amplified signal. Thus, even when electric charge corresponding to a signal potential held in the capacitor 102 is changed (damaged) at the time of reading data from the memory cell (the nonvolatile memory circuit 100), a signal corresponding to the signal potential can be held in the latch sense amplifier and can be written to the memory cell (the nonvolatile memory circuit 100) again.

One more specific embodiment of the sense amplifier 401 will be described below with reference to FIGS. 3A and 3B.

Figure 3A:
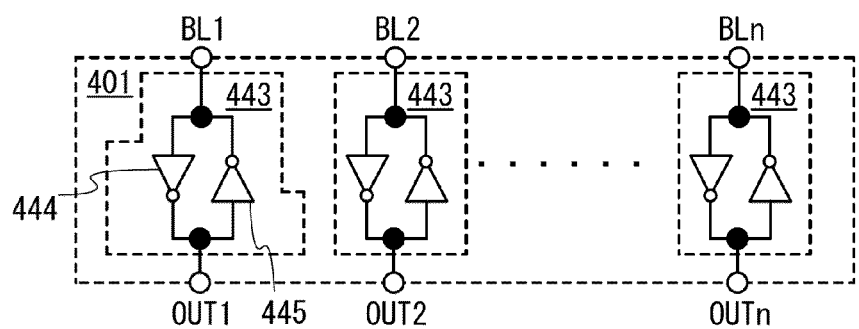
FIGS. 3A to 3C are diagrams illustrating configurations of a sense amplifier and a precharge circuit.
Figure 3B:
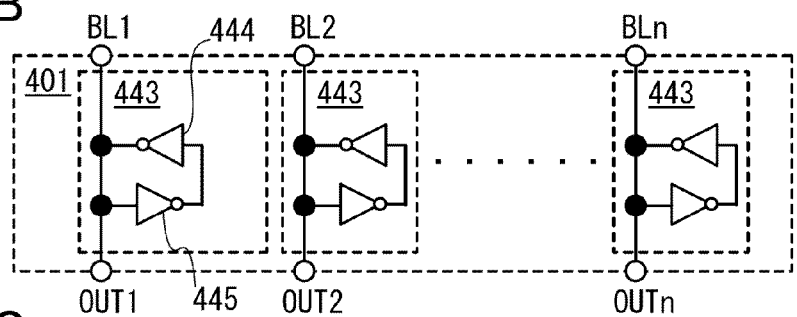

The sense amplifier 401 illustrated in FIGS. 3A and 3B is an example of a latch sense amplifier which includes (or is configured by) latch circuits 443. The latch circuit 443 can be formed using an inverter 444 and an inverter 445, for example. The sense amplifier 401 includes the n latch circuits 443, and each of the n latch circuits 443 is provided in the bit lines BL1 to BLn provided in the memory cell array 400. The potentials of the bit lines BL1 to BLn can be amplified by the n latch circuits 443 and can be output from the output terminals OUT1 to OUTn. Here, the potential of the bit line is based on a signal potential held in a memory cell that is electrically connected to the bit line and from which data is selectively read. Thus, a signal (an amplified signal) output from the output terminal of the latch circuit 443 corresponds to data held in the memory cell from which data is selectively read. In this manner, data held in each memory cell in the memory cell array 400 can be detected by the sense amplifier 401 including the n latch circuits 443.

Further, each of the n latch circuits 443 can hold an amplified signal. Thus, even when data is damaged at the time of reading the data from the memory cell in the memory cell array 400, a corresponding signal can be held in the n latch circuits 443 and can be written to the memory cell again.

Since the sense amplifier 401 that includes the latch circuit 443 illustrated in each of FIGS. 3A and 3B has a function of holding a signal as described above, the sense amplifier 401 can be used as a temporary memory circuit. For example, the sense amplifier 401 that includes the latch circuit 443 can be used as a circuit (e.g., a page buffer) for temporarily holding data input from the outside of the memory 2005.

(Configuration of Precharge Circuit)

Figure 3C:
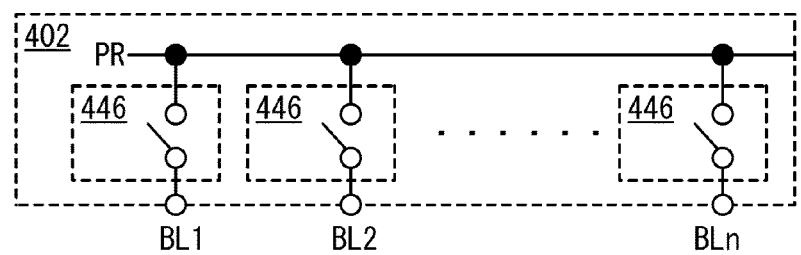

Next, one specific embodiment of the configuration of the precharge circuit 402 in FIG. 2A will be described with reference to FIG. 3C. In FIG. 3C, the precharge circuit 402 includes a precharge line PR and a plurality of switches 446. Each of the switches 446 can be provided in the bit lines BL1 to BLn in the memory cell array 400. An electrical connection between each bit line and the precharge line PR is selected by each switch 446, and the potential (the precharge potential) of the precharge line PR can be input to each bit line. For example, an analog switch, a transistor, or the like can be used as the switch 446. Alternatively, an arithmetic circuit to which one or both of a clock signal and an inversion signal of the clock signal are input can be used as the switch 446.

The above is the description of the memory 2005.

As described above, in the memory 2005 including the nonvolatile memory circuit 100, regular data rewriting (hereinafter also referred to as refresh operation) is not needed or the frequency of refresh operation can be markedly decreased. With the use of the memory 2005, a normally-off driving method can be carried out easily and the power consumption of the signal processing circuit can be reduced.

As described above, since the signal processing circuit 2000 described in this embodiment can continue to hold data for a long time even after the supply of power supply voltage is stopped, a normally-off driving method can be carried out. Accordingly, power consumption of the signal processing circuit 2000 can be drastically reduced. The signal processing circuit 2000 can start predetermined processing with data held, shortly after the supply of power supply voltage is selected. Therefore, time from selection of the supply of power supply voltage to start of predetermined processing can be shortened in the signal processing circuit 2000. In addition, predetermined processing is performed using a volatile memory circuit in a module supplied with power supply voltage; therefore, the access speed of the signal processing circuit 2000 can be increased. Further, a highly reliable circuit whose number of times data can be written is high is used as the nonvolatile memory circuit 100 for the signal processing circuit 2000; therefore, the durability and reliability of the signal processing circuit 2000 can be improved.

In particular, the following advantageous effect can be obtained in a manner such that a set of the volatile memory circuit 200 and the nonvolatile memory circuit 100 for storing data held in the volatile memory circuit 200 is provided for each of the register 2004 and the control circuit 2002 or each of the register 2004, the control circuit 2002, and the ALU 2003, that the nonvolatile memory circuit 100 is provided for the memory 2005, and that the supply of power supply voltage for each module is controlled by the power supply circuit 2006.

Without moving data between modules, supply and standby of data can be performed before and after the supply of power supply voltage. Therefore, it is not necessary to provide a special signal path (a path or a scan path) for performing supply and standby of data between modules, and the circuit size of the signal processing circuit 2000 can be increased easily.

This embodiment can be combined with any of the other embodiments as appropriate.

Embodiment 2

Figure 4:
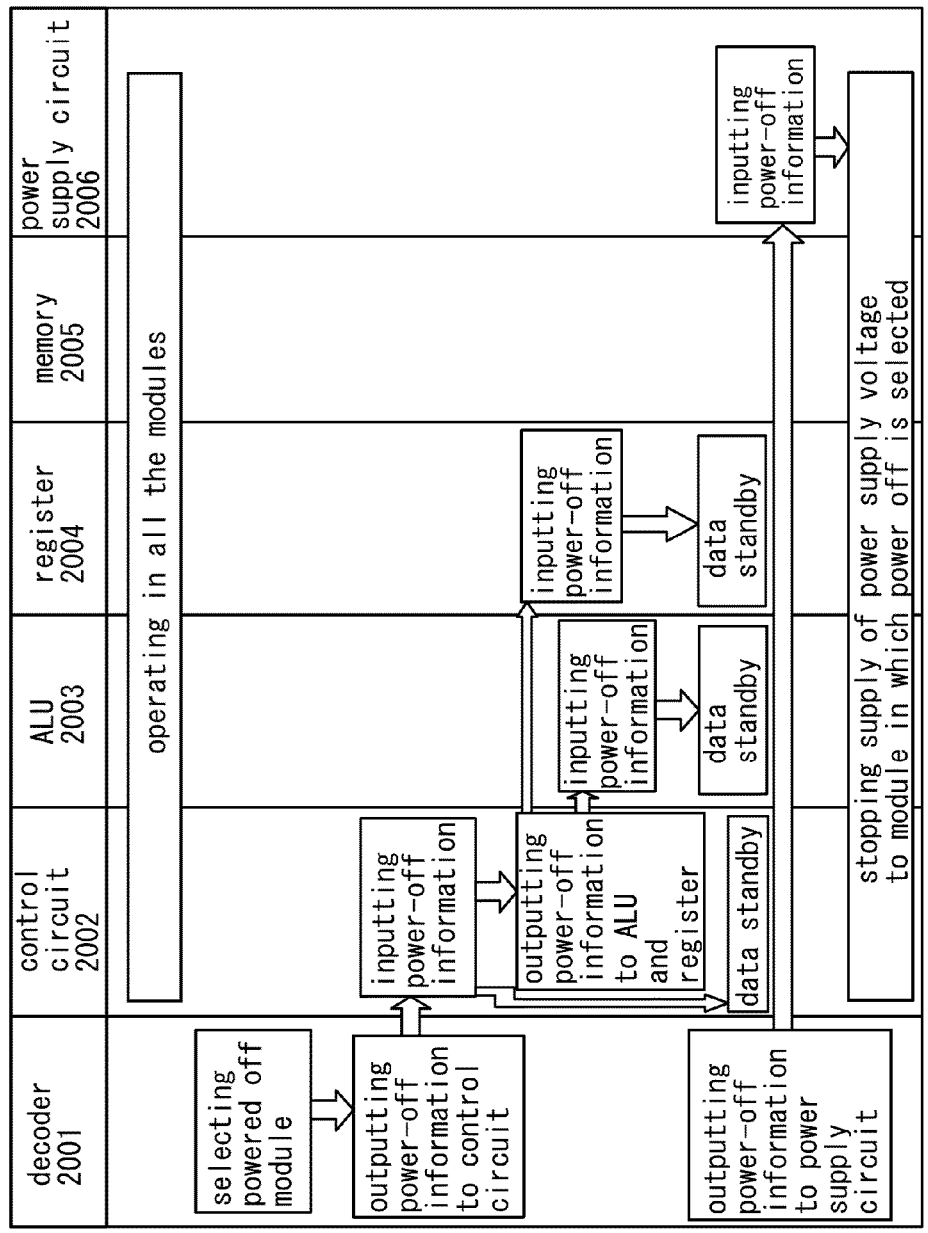
FIG. 4 is a flowchart illustrating a method for driving a signal processing circuit.
Figure 5:
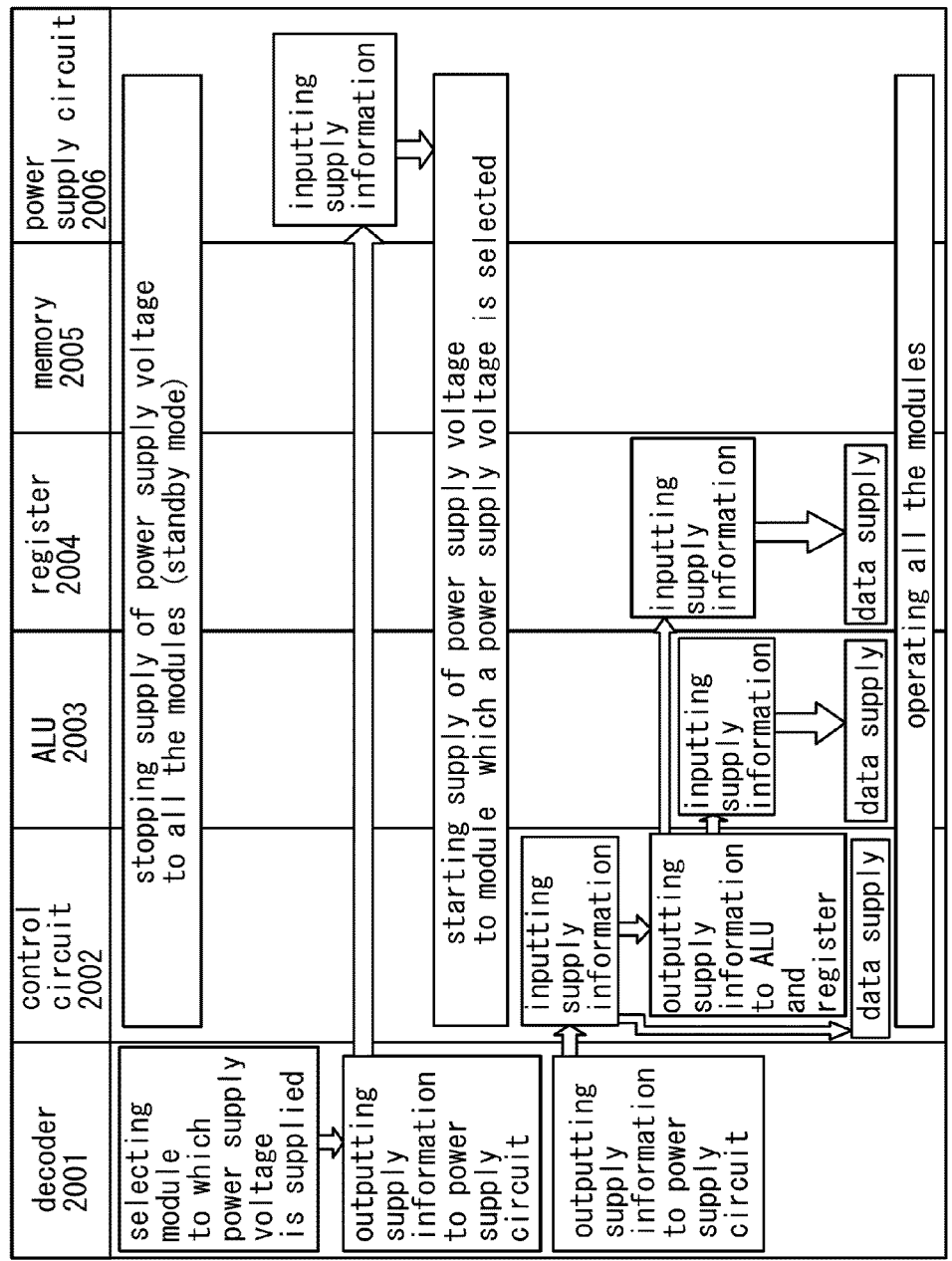
FIG. 5 is a flowchart illustrating a method for driving a signal processing circuit.
Figure 15:
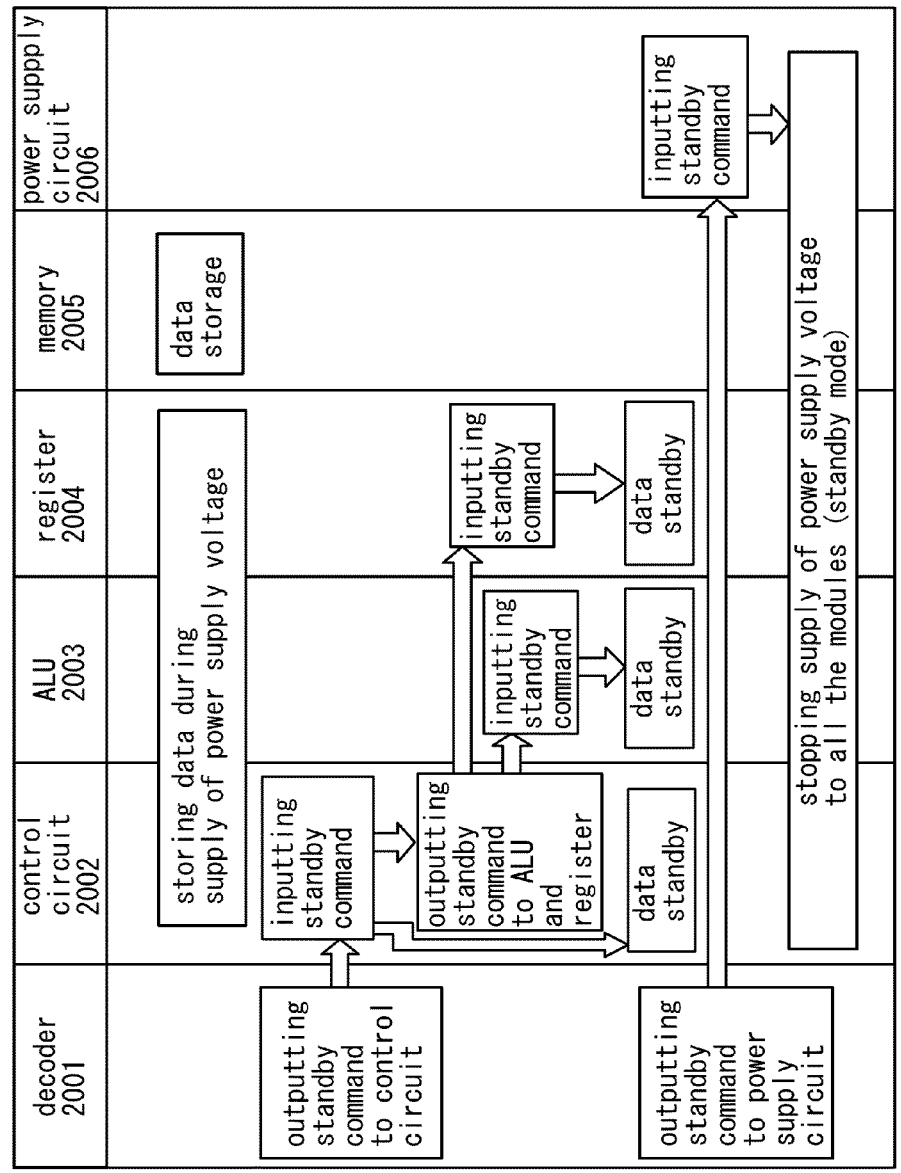
FIG. 15 is a flowchart illustrating a method for driving a signal processing circuit.

One mode of the normally-off driving method of the signal processing circuit of the present invention will be described in more detail with reference to a flowchart. FIG. 15 is a flowchart illustrating operation to reach a state in which the supply of power supply voltage is stopped in all the modules of the signal processing circuit (hereinafter such a state is also referred to as a standby mode). FIG. 5 is a flowchart illustrating operation of selecting the mode of supplying power supply voltage to all the modules or some of the modules from a standby mode. FIG. 4 is a flowchart illustrating operation after power supply voltage is supplied to all the modules or some of the modules and before the supply of power supply voltage is stopped in all the modules or some of the modules. Note that the reference numerals used in FIGS. 1A to 1E will be used for the description.

FIG. 15 illustrates operation of the decoder 2001, the control circuit 2002, the ALU 2003, the register 2004, the memory 2005, and the power supply circuit 2006 before a state in which the supply of power supply voltage is stopped in all the modules of the signal processing circuit 2000 (a standby mode).

While power supply voltage is supplied to the signal processing circuit 2000, data is stored in each of the control circuit 2002, the ALU 2003, and the register 2004 ("storing data during supply of power supply voltage" in FIG. 15). The operation of data storage in the control circuit 2002, the ALU 2003, and the register 2004 is similar to that in Embodiment 1. In addition, data is written to the memory 2005 ("data storage" in FIG. 15).

After that, the decoder 2001 outputs a command to stop the supply of power supply voltage in all the modules (hereinafter referred to as a standby command) to the control circuit 2002 ("outputting standby command to control circuit" in FIG. 15). In this manner, the standby command is input to the control circuit 2002 ("inputting standby command" in FIG. 15). On the basis of the input standby command, the control circuit 2002 outputs a standby command to all the modules. In FIG. 15, the supply of power supply voltage is stopped in the control circuit 2002, the ALU 2003, the register 2004, and the memory 2005; therefore, the control circuit 2002 outputs a standby command to the ALU 2003 and the register 2004 ("outputting standby command to ALU and register" in FIG. 15), and data in the volatile memory circuit in the control circuit 2002 is put on standby in the nonvolatile memory circuit which forms a set with the volatile memory circuit ("data standby" in FIG. 15). The configuration and data standby operation of the set in the control circuit 2002 are similar to those in Embodiment 1. In addition, when the standby command is input to the ALU 2003 from the control circuit 2002 ("inputting standby command" in FIG. 15), the ALU 2003 puts data which is held in its volatile memory circuit on standby in the nonvolatile memory circuit which forms a set with the volatile memory circuit ("data standby" in FIG. 15). The configuration and data standby operation of the set in the ALU 2003 are similar to those in Embodiment 1. When the standby command is input to the register 2004 from the control circuit 2002 ("inputting standby command" in FIG. 15), the register 2004 puts data which is held in its volatile memory circuit on standby in the nonvolatile memory circuit which forms a set with the volatile memory circuit ("data standby" in FIG. 15). The configuration and data standby operation of the set in the register 2004 are similar to those in Embodiment 1.

In this manner, after data standby is completed in the control circuit 2002, the ALU 2003, and the register 2004, the decoder 2001 outputs a standby command to the power supply circuit 2006 ("outputting standby command to power supply circuit" in FIG. 15). When the standby command is input to the power supply circuit 2006 ("inputting standby command" in FIG. 15), the power supply circuit 2006 stops the supply of power supply voltage to the modules on the bases of the standby command ("stopping supply of power supply voltage to all the modules (standby mode)" in FIG. 15). Note that as described in Embodiment 1, since the memory 2005 includes, as a memory cell, the nonvolatile memory circuit which can continue to hold data even when the supply of power supply voltage is stopped, the supply of power supply voltage can be stopped without performing data backup or the like. Here, stopping the supply of power supply voltage in a predetermined module refers to, in the case where a voltage corresponding to a difference between a high power potential and a low power potential is supplied to the module as a power potential, operation of stopping the supply of one of the potential or operation of making the one of the potentials the same as the other of the potentials.

The above is the description of the operation to reach a state (standby mode) in which the supply of power supply voltage is stopped in all the modules of the signal processing circuit 2000. Next, the operation of selecting the mode of supplying power supply voltage to all the modules or some of the modules from the standby mode will be described.

FIG. 5 illustrates operation of the decoder 2001, the control circuit 2002, the ALU 2003, the register 2004, the memory 2005, and the power supply circuit 2006 before supplying power supply voltage is selected in all the modules or some of the modules from a standby mode.

First, the decoder 2001 selects a module to which power supply voltage is supplied ("selecting module to which power supply voltage is supplied" in FIG. 5). Historical information on commands which have been previously received by the decoder 2001 can be used for this selection. For example, a module which will be operated may be predicted and the supply of power supply voltage to the module may be selected. FIG. 5 illustrates an example in which the supply of power supply voltage is restarted in the control circuit 2002, the ALU 2003, the register 2004, and the memory 2005. However, power supply voltage can be selectively supplied to some of these modules.

After the module to which power supply voltage is supplied is selected, information on which module supplied with power supply voltage (hereinafter referred to as supply information) is output to the power supply circuit 2006 ("outputting supply information to power supply circuit" in FIG. 5). When the supply information is input to the power supply circuit 2006 in this manner ("inputting supply information" in FIG. 5), the power supply circuit 2006 supplies power supply voltage to the module on the basis of the supply information ("starting supply of power supply voltage to module in which supply of power supply voltage is selected" in FIG. 5). Note that in the case where the memory 2005 is included in the module in which the supply of power supply voltage is selected, power supply voltage is supplied also to the memory 2005.

After power supply voltage is supplied, the decoder 2001 outputs supply information to the control circuit 2002 ("outputting supply information to control circuit" in FIG. 5). In this manner, the supply information is input to the control circuit 2002 ("inputting supply information" in FIG. 5). On the bases of the supply information input to the control circuit 2002, supply information is output to the module to which the power supply voltage is supplied. FIG. 5 illustrates an example in which power supply voltage is supplied to the control circuit 2002, the ALU 2003, the register 2004, and the memory 2005. The control circuit 2002 outputs supply information to the ALU 2003 and the register 2004 ("outputting supply information to ALU and register" in FIG. 5), and data in the nonvolatile memory circuit in the control circuit 2002 is input to the volatile memory circuit which forms a set with the nonvolatile memory circuit ("data supply" in FIG. 5). The configuration and data supply operation of the set in the control circuit 2002 are similar to those in Embodiment 1. In addition, when the supply information is input to the ALU 2003 from the control circuit 2002 ("inputting supply information" in FIG. 5), the ALU 2003 inputs data which is held in its nonvolatile memory circuit to the volatile memory circuit which forms a set with the nonvolatile memory circuit ("data supply" in FIG. 5). The configuration and data supply operation of the set in the ALU 2003 are similar to those in Embodiment 1. When the supply information is input to the register 2004 from the control circuit 2002 ("inputting supply information" in FIG. 5), the register 2004 inputs data which is held in its nonvolatile memory circuit to the volatile memory circuit which forms a set with the nonvolatile memory circuit ("data supply" in FIG. 5). The configuration and data supply operation of the set in the register 2004 are similar to those in Embodiment 1. Note that as described in Embodiment 1, the memory 2005 includes, as a memory cell, the nonvolatile memory circuit which can continue to hold data even when the supply of power supply voltage is stopped.

As described above, power supply voltage can be supplied to the control circuit 2002, the ALU 2003, the register 2004, and the memory 2005, and these modules can be operated and predetermined processing can be performed immediately ("operating all the modules" in FIG. 5). Note that although an example in which power supply voltage is supplied to the control circuit 2002, the ALU 2003, the register 2004, and the memory 2005 is illustrated in FIG. 5, one mode of the present invention is not limited thereto. While power supply voltage is supplied to some of these modules, the supply of power supply voltage can kept stopped in the other modules. In this case, operation of providing data is performed only in the module to which power supply voltage is supplied by the supply information, and some of the modules are set in an operation state.

The above is the description of the operation before the mode of supplying power supply voltage is selected in all the modules or some of the modules from the standby mode.

FIG. 4 illustrates operation of the decoder 2001, the control circuit 2002, the ALU 2003, the register 2004, the memory 2005, and the power supply circuit 2006 after power supply voltage is supplied to all the modules or some of the modules and before the supply of power supply voltage is stopped in all the modules or some of the modules.

First, the decoder 2001 selects a module in which the supply of power supply voltage is stopped ("selecting powered off module" in FIG. 4). Historical information on commands which have been previously received by the decoder 2001 and the supply information can be used for this selection. For example, in the case where there is historical information on successive reception and so on of commands which do not require operation of a specific module and power supply voltage is supplied to the module by the supply information, stop of the supply of power supply voltage to the module may be selected by predicting that the module does not operate for a while. The decoder 2001 can acquire up-to-date historical information every given period. FIG. 4 illustrates an example in which the supply of power supply voltage to all the modules (the control circuit 2002, the ALU 2003, the register 2004, and the memory 2005) is stopped after power supply voltage is supplied to these modules ("operating in all the modules" in FIG. 4). However, supply of power supply voltage can be selectively stopped in some of these modules.

After the module in which the supply of power supply voltage is stopped is selected, information on which module supplied with power supply voltage is stopped (hereinafter referred to as power-off information) is output to the control circuit 2002 ("outputting power-off information to control circuit" in FIG. 4). In this manner, the power-off information is input to the control circuit 2002 ("inputting power-off information" in FIG. 4). On the basis of the power-off information input to the control circuit 2002, power-off information is output to the module in which the supply of power supply voltage is stopped. FIG. 4 illustrates an example in which the supply of power supply voltage is stopped in the control circuit 2002, the ALU 2003, the register 2004, and the memory 2005. The control circuit 2002 outputs power-off information to the ALU 2003 and the register 2004 ("outputting power-off information to ALU and register" in FIG. 4), and data in the volatile memory circuit in the control circuit 2002 is put on standby in the nonvolatile memory circuit which forms a set with the volatile memory circuit ("data standby" in FIG. 4). The configuration and data standby operation of the set in the control circuit 2002 are similar to those in Embodiment 1. In addition, when the power-off information is input to the ALU 2003 from the control circuit 2002 ("inputting power-off information" in FIG. 4), the ALU 2003 inputs data which is held in its volatile memory circuit to the nonvolatile memory circuit which forms a set with the volatile memory circuit ("data standby" in FIG. 4). The configuration and data standby operation of the set in the ALU 2003 are similar to those in Embodiment 1. When the power-off information is input to the register 2004 from the control circuit 2002 ("inputting power-off information" in FIG. 4), the register 2004 puts data which is held in its volatile memory circuit on standby in the nonvolatile memory circuit which forms a set with the volatile memory circuit ("data standby" in FIG. 4). The configuration and data standby operation of the set in the register 2004 are similar to those in Embodiment 1.

In this manner, after data standby is completed in the control circuit 2002, the ALU 2003, and the register 2004 in the modules in which the supply of power supply voltage is stopped, the decoder 2001 outputs power-off information to the power supply circuit 2006 ("outputting power-off information to power supply circuit" in FIG. 4). When the power-off information is input to the power supply circuit 2006 ("inputting power-off information" in FIG. 4), the power supply circuit 2006 stops the supply of power supply voltage to the modules on the bases of the power-off information ("stopping supply of power supply voltage to module in which power off is selected" in FIG. 4). Note that in the case where the memory 2005 is included in the modules in which power off is selected, the supply of power supply voltage to the memory 2005 is also stopped. Note that as described in Embodiment 1, since the memory 2005 includes, as a memory cell, the nonvolatile memory circuit which can continue to hold data even when the supply of power supply voltage is stopped, the supply of power supply voltage can be stopped without performing data backup or the like. Here, stopping the supply of power supply voltage in a predetermined module refers to, in the case where a voltage corresponding to a difference between a high power potential and a low power potential is supplied to the module as a power potential, operation of stopping the supply of one of the potentials or operation of making the one of the potentials the same as the other of the potentials.

The above is the description of the operation after power supply voltage is supplied to all the modules or some of the modules and before the supply of power supply voltage is stopped in all the modules or some of the modules.

As described above, the signal processing circuit 2000 can carry out a normally-off driving method in which power supply voltage is supplied only when needed to operate all the modules or some of the modules. Accordingly, the power consumption of the signal processing circuit 2000 can be drastically reduced. Each module of the signal processing circuit 2000 can start predetermined processing with data held, shortly after the supply of power supply voltage is selected. Therefore, time from selection of the supply of power supply voltage to start of predetermined processing can be shortened in the signal processing circuit 2000. In addition, predetermined processing is performed using a volatile memory circuit in a module supplied with power supply voltage; therefore, the access speed of the signal processing circuit 2000 can be increased. Further, a highly reliable circuit in which the number of times data can be written is high is used as the nonvolatile memory circuit 100 for the signal processing circuit 2000; therefore, the durability and reliability of the signal processing circuit 2000 can be improved.

In particular, the following advantageous effect can be obtained in a manner such that a set of the volatile memory circuit 200 and the nonvolatile memory circuit 100 for storing data held in the volatile memory circuit 200 is provided for each of the register 2004 and the control circuit 2002 or each of the register 2004, the control circuit 2002, and the ALU 2003, that the nonvolatile memory circuit 100 is provided for the memory 2005, and that the supply of power supply voltage for each module is controlled by the power supply circuit 2006.

Without moving data between modules, supply and standby of data can be performed before and after the supply of power supply voltage. Therefore, it is not necessary to provide a special signal path (a path or a scan path) for performing supply and standby of data between modules, and the circuit size of the signal processing circuit 2000 can be increased easily.

This embodiment can be combined with any of the other embodiments as appropriate.

Embodiment 3

In this embodiment, a more specific configuration of the signal processing circuit 2000 described in Embodiment 1 will be described. Note that the reference numerals used in FIGS. 1A to 1E will be used for the description.

Figure 6A:
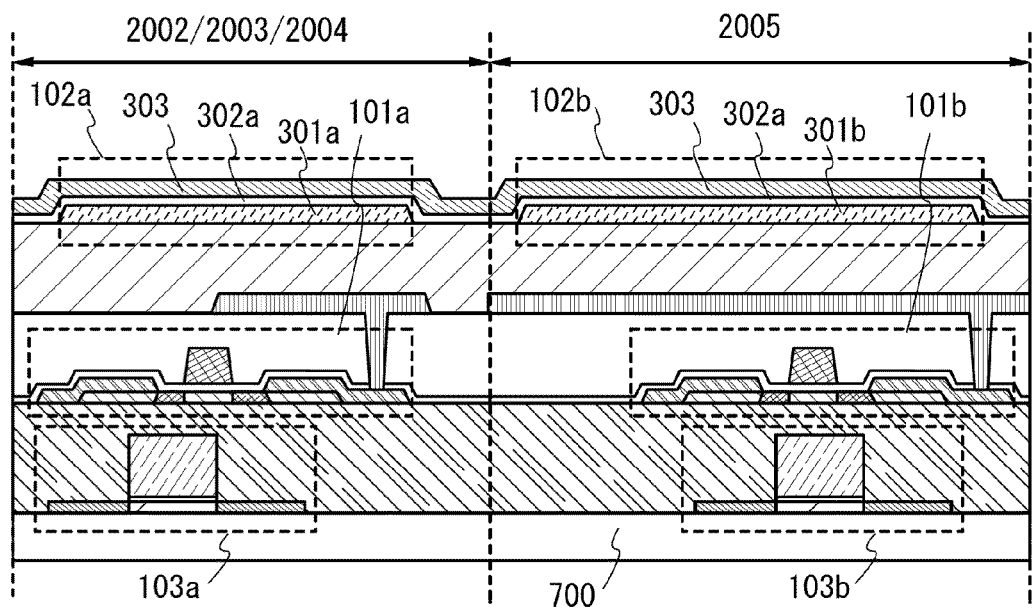
FIGS. 6A and 6B are a cross-sectional view and a perspective schematic view illustrating a configuration of a signal processing circuit.

FIG. 6A is a cross-sectional view of the signal processing circuit 2000. In FIG. 6A, the left half is a cross-sectional view of a region in which the control circuit 2002, the ALU 2003, and the register 2004 are formed. Among the sets of the volatile memory circuit 200 and the nonvolatile memory circuit 100 in the control circuit 2002, the ALU 2003, and the register 2004, a transistor 103a included in the volatile memory circuit 200, a transistor 101a included in the nonvolatile memory circuit 100 (corresponding to the transistor 101 in FIG. 1B or 1D), and a capacitor 102a (corresponding to the capacitor 102 in FIG. 1B or 1D) are typically illustrated. In FIG. 6A, the right half is a cross-sectional view of a region in which the memory 2005 is formed. A transistor 101b (corresponding to the transistor 101 in FIG. 1B or 1D) and a capacitor 102b (corresponding to the capacitor 102 in FIG. 1B or 1D) which are included in a memory cell (the nonvolatile memory circuit 100) of the memory 2005 are typically illustrated. Note that, for example, a transistor 103b can be provided below the transistor 101b included in the memory cell of the memory 2005 to overlap with each other. In FIG. 6A, the transistor 103a and the transistor 103b are formed over a substrate 700, the transistor 101a and the transistor 101b are formed above the transistor 103a and the transistor 103b with an interlayer insulating layer provided therebetween, and the capacitor 102a and the capacitor 102b are formed above the transistor 101a and the transistor 101b.

In FIG. 6A, the transistor 103a and the transistor 103b can be formed in the same steps. The transistor 101a and the transistor 101b can be formed in the same steps. Here, forming a plurality of transistors in the same steps means that gate electrodes of the plurality of transistors are formed by etching of one conductive film; gate insulating films of the plurality of transistors are formed by using one insulating film (or by etching of one insulating film); and source electrodes and drain electrodes of the plurality of transistors are formed by etching of one conductive film. Note that in the case of transistors having channels formed in semiconductor layers, the same steps include formation of the active layers of the plurality of transistors by etching of one semiconductor layer (semiconductor film).

In FIG. 6A, the capacitor 102a and the capacitor 102b can be formed in the same steps. Here, forming a plurality of capacitors in the same steps means that ones of pairs of electrodes of the plurality of capacitors is formed by etching of one conductive film; dielectric layers of the plurality of capacitors are formed by using one insulating film (or by etching of one insulating film); and the others of the pairs of electrodes of the plurality of capacitors are formed by using one conductive film (or by etching of one conductive film).

Figure 6B:
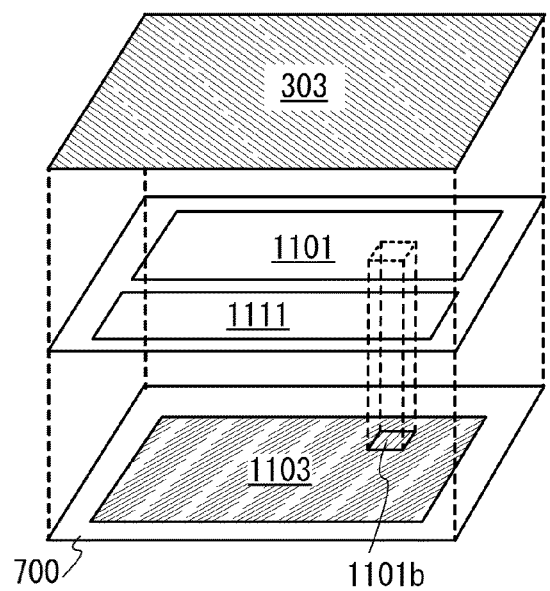

Note that in FIGS. 6A and 6B, the capacitor 102a includes one of a pair of electrodes 301a, a dielectric layer 302a, and the other of the pair of electrodes 303. The capacitor 102b includes one of a pair of electrodes 301b, the dielectric layer 302a, and the other of the pair of electrodes 303. The dielectric layer 302a of the capacitor 102a and the dielectric layer 302a of the capacitor 102b can be provided in common without being separated from each other. In addition, the other of the pair of electrodes 303 of the capacitor 102a and the other of the pair of electrodes 303 of the capacitor 102b can be provided in common without being separated from each other. In this case, a conductive layer (the other of the pair of electrodes 303 of the capacitor 102a and the other of the pair of electrodes 303 of the capacitor 102b) which is provided in common without being separated from each other can be used as a shielding layer (e.g., an electric-field shielding layer) or a light-shielding layer of the signal processing circuit 2000. For example, when the conductive layer is provided so as to cover elements such as transistors included in the signal processing circuit 2000 (e.g., the transistor 103a, the transistor 103b, the transistor 101a, and the transistor 101b), the adverse effect of an external electric field or the like on the elements included in the signal processing circuit 2000 can be reduced. As described above, when the other of the pair of electrodes 303 of the capacitor 102a and the other of the pair of electrodes 303 of the capacitor 102b function as a shielding layer or a light-blocking layer, the highly reliable signal processing circuit 2000 can be provided without increasing the number of manufacturing processes (or steps).

FIG. 6B is a perspective view schematically illustrating a configuration of the signal processing circuit 2000. The signal processing circuit 2000 can include a circuit group 1103 which is formed over the substrate 700 and includes transistors similar to the transistor 103a and the transistor 103b; a circuit group 1101 and a circuit group 1111 which are provided above the circuit group 1103 so as to overlap with the circuit group 1103 and includes transistors similar to the transistor 101a and the transistor 101b; and a region which is provided above the circuit group 1101 and the circuit group 1111 so as to overlap with the circuit group 1101 and the circuit group 1111 and which includes a plurality of capacitors similar to the capacitor 102a and the capacitor 102b (in FIG. 6B, only the other of the pair of electrodes 303 of each of the capacitors is typically illustrated). Here, the other of the pair of electrodes 303 of the capacitor 102a and the other of the pair of electrodes 303 of the capacitor 102b can be provided in common without being separated from each other so as to cover the circuit group 1103, the circuit group 1101, and the circuit group 1111. In this manner, the other of the pair of electrodes 303 of the capacitor 102a and the other of the pair of electrodes 303 of the capacitor 102b are used as a shielding layer of the signal processing circuit 2000.

The circuit group 1103 can be the circuits included in the signal processing circuit 2000 except the nonvolatile memory circuit 100. The circuit group 1103 includes the elements included in the volatile memory circuit 200, the elements included in the memory 2005 except the memory cell array 400 (e.g., the row decoder 404, the column decoder 403, the sense amplifier 401, and the precharge circuit 402), and the like. The circuit group 1111 can include the transistors 101 included in the nonvolatile memory circuits 100 which each form a set with the volatile memory circuit 200 in the circuits included in the signal processing circuit 2000, for example. The circuit group 1101 can be provided with the transistors 101 included in the nonvolatile memory circuits 100 included in the memory cell array 400 of the memory 2005 in the circuits included in the signal processing circuit 2000, for example. The capacitors 102 included in the nonvolatile memory circuits 100 in the circuits included in the signal processing circuit 2000 can be provided above these circuit groups.

Here, it is preferable that a part 1101b of the circuit group 1103 be provided with the elements included in the memory 2005 except the memory cell array 400 (e.g., the row decoder 404, the column decoder 403, the sense amplifier 401, and the precharge circuit 402), and that this region (the part 1101b) overlap with the circuit group 1101. Here, the circuit group 1101 is provided with the transistors 101 in the nonvolatile memory circuits 100 included in the memory cell array 400. Therefore, a circuit portion for controlling data input/output can be provided near the memory cell array 400.

Figure 7:
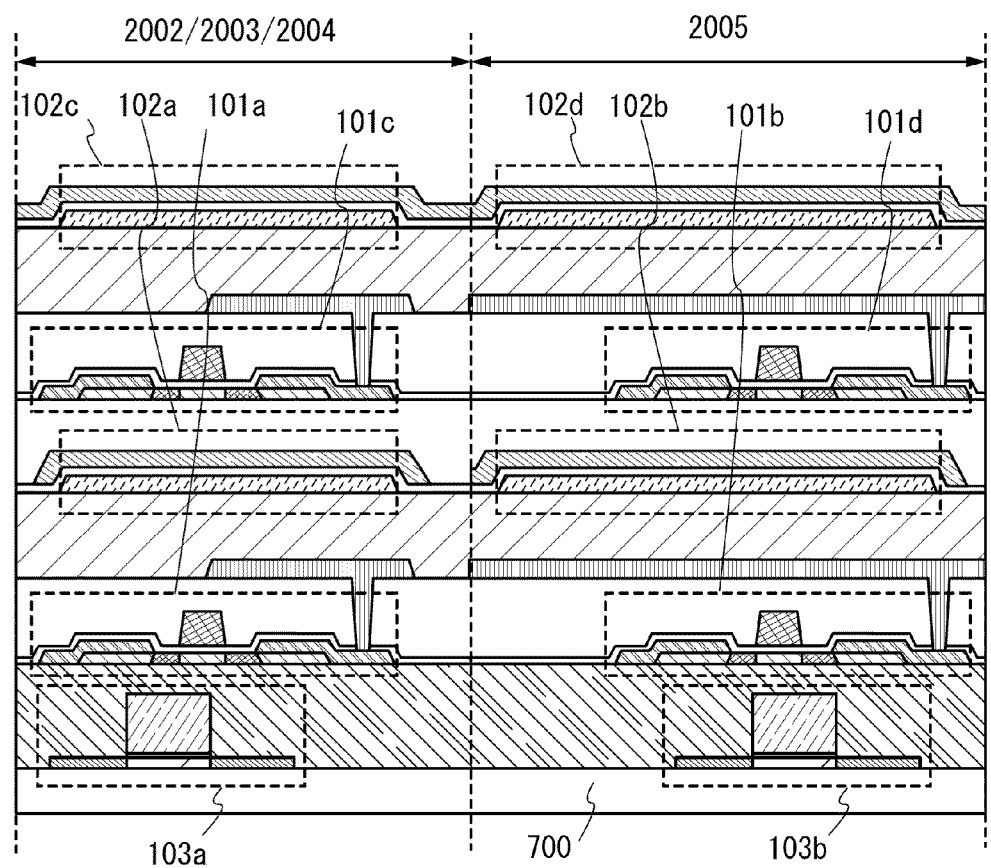
FIG. 7 is a cross-sectional view illustrating a configuration of a signal processing circuit.

Although FIGS. 6A and 6B illustrate the structure in which the transistor 101a and the transistor 101b are formed above the transistor 103a and the transistor 103b and the capacitor 102a and the capacitor 102b are formed above the transistor 101a and the transistor 101b, one mode of the present invention is not limited thereto. The layer including the transistor 101a and the transistor 101b and the layer including the capacitor 102a and the capacitor 102b may be stacked above the transistor 103a and the transistor 103b. FIG. 7 illustrates a structure example of this case. In FIG. 7, above the transistor 103a and the transistor 103b, the layer including the transistor 101a and the transistor 101b, the layer including the capacitor 102a and the capacitor 102b, a layer including a transistor 101c and a transistor 101d, and a layer including a capacitor 102c and a capacitor 102d are provided. Here, unlike in the structure in FIG. 6B, the other of the pair of electrodes of the capacitor 102a and the other of the pair of electrodes of the capacitor 102b are separated from each other. This is to electrically connect circuits which are provided above the capacitor 102a and the capacitor 102b and circuits which are provided below the capacitor 102a and the capacitor 102b to each other. In FIG. 7, the other of a pair of electrodes of the capacitor 102c and the other of a pair of electrodes of the capacitor 102d which are provided in common without being separated from each other can function as a shielding layer of the signal processing circuit 2000. In this manner, in a multilayer structure of the layer including the transistor 101a and the transistor 101b and the layer including the capacitor 102a and the capacitor 102b which are provided above the transistor 103a and the transistor 103b, the other of the pair of electrodes of the capacitor 102c and the other of the pair of electrodes of the capacitor 102d which are provided in an uppermost layer are provided in common without being separated and can each function as a shielding layer.

This embodiment can be combined with any of the other embodiments as appropriate.

Embodiment 4

A method for forming the signal processing circuit 2000 illustrated in FIG. 1A will be described. In this embodiment, a method for forming the signal processing circuit 2000 is described giving a transistor 103 as an example of the elements included in circuits included in the signal processing circuit 2000 except the nonvolatile memory circuit 100, and giving a transistor 101 having a channel in an oxide semiconductor layer and a capacitor 102 as examples of the elements included in the nonvolatile memory circuits 100 included in the signal processing circuit 2000. The case where a transistor having a channel in a silicon layer is used as the transistor 103 is described here as an example.

Figure 8A:
FIGS. 8A to 8D are cross-sectional views illustrating a manufacturing process of a signal processing circuit.

First, as illustrated in FIG. 8A, an insulating film 701 and a semiconductor film 702 that has been separated from a single crystal semiconductor substrate are formed over a substrate 700.

Although there is no particular limitation on a material which can be used as the substrate 700, it is necessary that the material have at least heat resistance high enough to withstand subsequent heat treatment. For example, a glass substrate formed by a fusion process or a float process, a quartz substrate, a semiconductor substrate, a ceramic substrate, or the like can be used as the substrate 700. In the case where the temperature for the subsequent heat treatment is high, a glass substrate whose strain point is higher than or equal to 730° C. is preferably used as the glass substrate.

In this embodiment, an example in which the semiconductor film 702 is formed using single crystal silicon is given as a method for forming the transistor 103. Note that a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is provided therebetween. After the bond substrate and the substrate 700 overlap with each other, a pressure of approximately greater than or equal to 1 N/cm$^2$ and less than or equal to 500 N/cm$^2$, preferably greater than or equal to 11 N/cm$^2$ and less than or equal to 20 N/cm$^2$ is applied to part of the bond substrate and part of the substrate 700 so that the substrates are attached to each other. When the pressure is applied to part of the bond substrate and part of the substrate 700, bonding between the bond substrate and the insulating film 701 starts from the parts, which results in bonding of the entire surface where the bond substrate and the insulating film 701 are in close contact with each other. After that, heat treatment is performed, so that microvoids that exist in the fragile layer are combined, and the volume of the microvoids is increased. Accordingly, a single crystal semiconductor film which is part of the bond substrate is separated from the bond substrate along the fragile layer. The temperature of the heat treatment is set so as not to exceed the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not etched to have a predetermined shape or may be added to the semiconductor film 702 which is etched to have a predetermined shape. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not etched to have a predetermined shape or the semiconductor film 702 which is etched to have a predetermined shape in order to finely control the threshold voltage.

Note that although the single crystal semiconductor film is used in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As a known crystallization technique, laser crystallization using a laser beam or crystallization using a catalytic element can be used. Alternatively, crystallization using a catalytic element and laser crystallization can be used in combination. When a heat-resistant substrate such as a quartz substrate is used, crystallization combined with thermal crystallization using an electrically heated furnace, lamp heating crystallization using infrared light, crystallization using a catalytic element, or high-temperature heating at approximately 950° C. may be used.

Figure 8B:
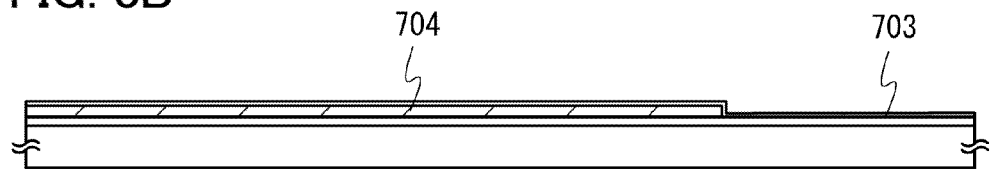

Next, as illustrated in FIG. 8B, the semiconductor film 702 is processed into a predetermined shape, so that a semiconductor layer 704 is formed. Then, a gate insulating film 703 is formed over the semiconductor layer 704.

For example, the gate insulating film 703 can be formed using a single layer or a stack of layers of a film including silicon oxide, silicon nitride oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$, (x>0, y>0, z>0)), or the like by plasma-enhanced CVD, sputtering, or the like.

Note that in this specification, an oxynitride is a substance which includes more oxygen than nitrogen, and a nitride oxide is a substance which includes more nitrogen than oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by plasma-enhanced CVD.

Figure 8C:
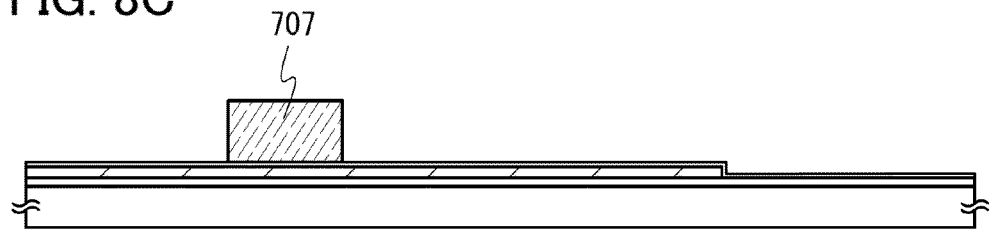

Next, as illustrated in FIG. 8C, a gate electrode 707 is formed.

A conductive film is formed and then is processed into a predetermined shape, so that the gate electrode 707 can be formed. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the metal as a main component or a compound containing the metal may be used. Alternatively, a semiconductor film such as polycrystalline silicon doped with an impurity element such as phosphorus imparting conductivity may be used.

Note that although the gate electrode 707 is formed using a single-layer conductive film in this embodiment, this embodiment is not limited to this structure. The gate electrode 707 may be formed of a plurality of stacked conductive films.

As a combination of two conductive films, tantalum nitride or tantalum can be used for a first conductive film and tungsten can be used for a second conductive film. As well as the example, any of the following combination can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of a three-layer structure in which three or more conductive films are stacked, a layered structure of a molybdenum film, an aluminum film, and a molybdenum film is preferably used.

A light-transmitting oxide conductive film of indium oxide, indium tin oxide, indium zinc oxide, zinc oxide, zinc aluminum oxide, zinc aluminum oxynitride, gallium zinc oxide, or the like can be used as the gate electrode 707.

Alternatively, the gate electrode 707 may be selectively formed by a droplet discharge method without the use of a mask. A droplet discharge method is a method for forming a predetermined pattern by discharge or ejection of a droplet containing a predetermined composition from an orifice, and includes an ink-jet method in its category.

In addition, the gate electrode 707 can be formed in a manner such that a conductive film is formed and then is etched by an inductively coupled plasma (ICP) etching method under appropriately controlled conditions (e.g., the amount of electric power applied to a coiled electrode layer, the amount of electric power applied to an electrode layer on the substrate side, and the electrode temperature on the substrate side) to be tapered in a desired shape. Further, an angle and the like of the tapered shape may be controlled by the shape of a mask. Note that for an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 8D:
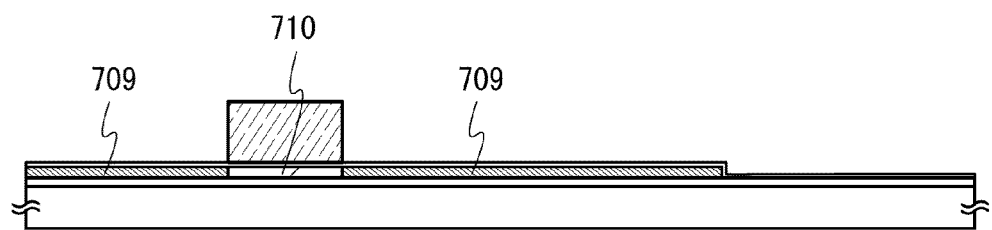

Next, as illustrated in FIG. 8D, when an impurity element imparting one conductivity is added to the semiconductor layer 704 with the gate electrode 707 used as a mask, a channel formation region 710 overlapping with the gate electrode 707 and a pair of impurity regions 709 between which the channel formation region 710 is provided are formed in the semiconductor layer 704.

In this embodiment, the case where an impurity element imparting p-type conductivity (e.g., boron) is added to the semiconductor layer 704 is described as an example.

Figure 9A:
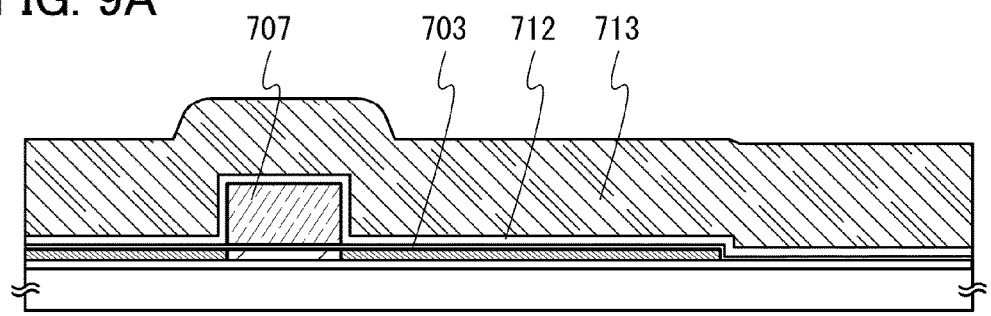
FIGS. 9A to 9C are cross-sectional views illustrating a manufacturing process of a signal processing circuit.

Next, as illustrated in FIG. 9A, an insulating film 712 and an insulating film 713 are formed to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating film 712 and the insulating film 713. In particular, the insulating film 712 and the insulating film 713 are preferably formed using a low dielectric constant (low-k) material because capacitance due to overlapping of electrodes or wirings can be sufficiently reduced. Note that a porous insulating film including such a material may be employed as the insulating film 712 and the insulating film 713. Since the porous insulating film has lower dielectric constant than a dense insulating film, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although an example in which the insulating film 712 and the insulating film 713 are formed over the gate electrode 707 is shown, in the present invention, only one insulating film may be formed over the gate electrode 707, or a plurality of insulating films of three or more layers may be stacked.

Figure 9B:
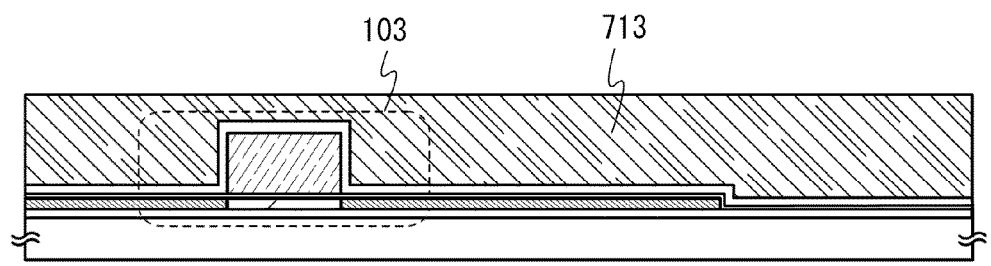

Next, as illustrated in FIG. 9B, the insulating film 713 is subjected to chemical mechanical polishing (CMP) or etching, so that the upper surface of the insulating film 713 is planarized. Note that in order to improve the characteristics of the transistor 101 which is formed later, it is preferable to flatten a surface of the insulating film 713 as much as possible.

Through the above steps, the transistor 103 can be formed.

Figure 9C:
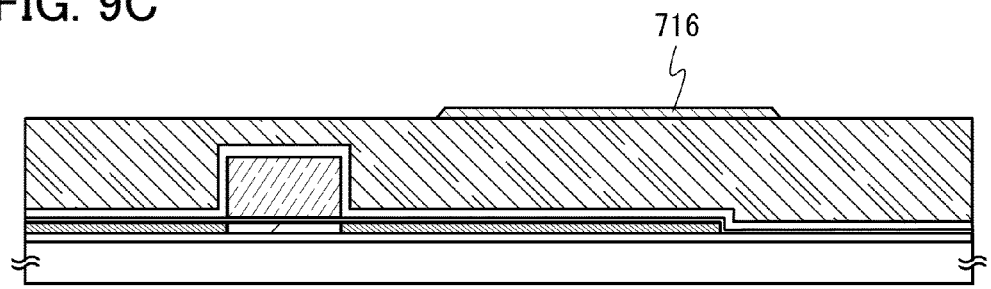

Next, a method for forming the transistor 101 is described. First, as illustrated in FIG. 9C, an oxide semiconductor layer 716 is formed over the insulating film 713.

The oxide semiconductor layer 716 can be formed by processing an oxide semiconductor film formed over the insulating film 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is deposited by sputtering. Alternatively, the oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is deposited by sputtering, dust on surfaces of the insulating film 713 is preferably removed by reverse sputtering in which an argon gas is introduced and plasma is generated. The reverse sputtering is a method in which, without application of voltage to a target side, an RF power source is used for application of voltage to a substrate side in an argon atmosphere, and plasma is generated in the vicinity of the substrate so that a substrate surface is modified. Note that nitrogen, helium, or the like may be used instead of the argon atmosphere. Alternatively, an argon atmosphere to which oxygen, nitrous oxide, or the like is added may be used. Alternatively, an argon atmosphere to which chlorine, carbon tetrafluoride, or the like is added may be used.

An oxide semiconductor to be used preferably contains at least indium (In) or zinc (Zn). In particular, In and Zn are preferably contained. As a stabilizer for reducing variation in electric characteristics of a transistor including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. In addition, any of the above oxide semiconductors may contain an element other than In, Ga, Sn, and Zn, for example, $SiO_2$.

Note that here, for example, an "In—Ga—Zn-based oxide" means an oxide containing In, Ga, and Zn as main components and there is no particular limitation on the ratio of In, Ga, and Zn. The In—Ga—Zn-based oxide may contain a metal element other than the In, Ga, and Zn.

As the oxide semiconductor, a material represented by $InMO_3(ZnO)_m$ (m>0 is satisfied, and m is not an integer) may be used. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3: 1/3), In:Sn:Zn=2:1:3 (=1/3:1/6:1/2), or In:Sn:Zn=2:1:5 (=1/4:1/8:5/8), or any of oxides whose composition is in the neighborhood of the above compositions can be used.

However, the composition is not limited to those described above, and a material having an appropriate composition may be used depending on required semiconductor characteristics (e.g., mobility, threshold voltage, and variation). In order to obtain required semiconductor characteristics, it is preferable that the carrier concentration, the impurity concentration, the defect density, the atomic ratio of a metal element to oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga: Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

Note that $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| \, dx \, dy \qquad \text{[FORMULA 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

In this embodiment, a 30-nm-thick In—Ga—Zn-based oxide semiconductor thin film which is obtained by sputtering using a target including indium (In), gallium (Ga), and zinc (Zn) is used as the oxide semiconductor film. A target with a composition ratio of metals, In:Ga:Zn=1:1:0.5, In:Ga: Zn=1:1:1, or In:Ga:Zn=1:1:2 can be used as the target, for example. The filling rate of the target including In, Ga, and Zn is higher than or equal to 90% and lower than or equal to 100%, preferably higher than or equal to 95% and lower than 100%. With the use of the target with a high filling rate, a dense oxide semiconductor film is formed.

In this embodiment, the oxide semiconductor film is deposited in a manner such that the substrate is held in a treatment chamber kept in a reduced pressure state, moisture remaining in the treatment chamber is removed, a sputtering gas from which hydrogen and moisture are removed is introduced, and the target is used. The substrate temperature may be higher than or equal to 100° C. and lower than or equal to 600° C., preferably higher than or equal to 200° C. and lower than or equal to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an evacuation unit. For example, a hydrogen atom, a compound containing a hydrogen atom, such as water ($H_2O$) (preferably a compound containing a carbon atom), and the like are evacuated from the treatment chamber with the use of a cryopump. Thus, the concentration of impurities contained in the oxide semiconductor film deposited in the treatment chamber can be lowered.

As an example of the deposition condition, the following condition is employed: the distance between the substrate and the target is 100 mm, the pressure is 0.6 Pa, the direct current (DC) power is 0.5 kW, and the atmosphere is an oxygen atmosphere (the proportion of the oxygen flow rate is 100%). Note that it is preferable that pulsed direct-current (DC) power be used because dust generated during deposition can be reduced and the film thickness can be uniform.

Further, when the leakage rate of the treatment chamber of the sputtering apparatus is set lower than or equal to $1 \times 10^{-10}$ $Pa \cdot m^3$/second, entry of impurities such as alkali metal or hydride into the oxide semiconductor film that is being formed by sputtering can be reduced. Furthermore, with the use of the adsorption vacuum pump as an evacuation system, counter flow of impurities such as alkali metal, a hydrogen atom, a hydrogen molecule, water, a hydroxyl group, or hydride from the evacuation system can be reduced.

When the purity of the target is set to 99.99% or higher, alkali metal, a hydrogen atom, a hydrogen molecule, water, a hydroxyl group, hydride, or the like mixed into the oxide semiconductor film can be reduced. In addition, with the use of the target, the concentration of an alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and evacuated by preheating of the substrate 700 over which the insulating film 712 and the insulating film 713 are formed in a preheating chamber of the sputtering apparatus, as pretreatment for deposition. The temperature of the preheating is higher than or equal to 100° C. and lower than or equal to 400° C., preferably higher than or equal to 150° C. and lower than or equal to 300° C. As an evacuation unit provided in the preheating chamber, a cryopump is preferable. Note that the preheating treatment can be omitted. This preheating may be similarly performed on the substrate 700 over which a conductive layer 719 and a conductive layer 720 are formed before the deposition of a gate insulating film 721 in a later step.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, parallel plate reactive ion etching (RIE) or inductively coupled plasma (ICP) etching can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, organic acid such as citric acid or oxalic acid, or the like can be used. In this embodiment, ITO-07N (produced by KANTO CHEMICAL CO., INC.) is used.

A resist mask for forming the oxide semiconductor layer 716 may be formed by an ink-jet method. When the resist mask is formed by an ink-jet method, a photomask is not used; thus, manufacturing cost can be reduced.

Note that it is preferable that reverse sputtering be performed before a conductive film is formed in a subsequent step so that resist residues and the like that attach onto surfaces of the oxide semiconductor layer 716 and the insulating film 713 are removed.

Note that the oxide semiconductor film deposited by sputtering or the like contains moisture or hydrogen (including a hydroxyl group) as an impurity in some cases. Moisture or hydrogen easily forms a donor level and thus serves as an impurity in the oxide semiconductor. Thus, in one mode of the present invention, in order to reduce impurities such as moisture or hydrogen in the oxide semiconductor film (in order to perform dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately longer than or equal to 3 minutes and shorter than or equal to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus with which heat treatment is performed using a high-temperature gas. As the gas, an inert gas which does not react with an object by heat treatment, such as nitrogen or a rare gas (e.g., argon), is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably higher than or equal to 6N (99.9999%), more preferably higher than or equal to 7N (99.99999%) (that is, the impurity concentration is lower than or equal to 1 ppm, preferably lower than or equal to 0.1 ppm).

Note that it has been pointed out that an oxide semiconductor is insensitive to impurities, there is no problem when a considerable amount of metal impurities is contained in the film, and soda-lime glass which contains a large amount of alkali metal such as sodium and which is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film which is in contact with an oxide semiconductor layer is an oxide and Na diffuses into the insulating film. In addition, in the oxide semiconductor layer, Na cuts or enters a bond between metal and oxygen which are included in an oxide semiconductor. As a result, for example, deterioration of characteristics of a transistor, such as a normally-on state of the transistor due to shift of the threshold voltage in a negative direction, or a decrease in mobility, occurs. Variation in characteristics also occurs. Such deterioration of characteristics of the transistor and variation in characteristics due to the impurity remarkably appear when the concentration of hydrogen in the oxide semiconductor layer is extremely low. Thus, when the concentration of hydrogen in the oxide semiconductor layer is lower than or equal to $1\times10^{18}/cm^3$, preferably lower than or equal to $1\times10^{17}/cm^3$, the concentration of the impurity is preferably lowered. Specifically, the measurement value of a Na concentration by secondary ion mass spectrometry is preferably lower than or equal to $5\times10^{16}/cm^3$, more preferably lower than or equal to $1\times10^{16}/cm^3$, still more preferably lower than or equal to $1\times10^{15}/cm^3$. Similarly, the measurement value of a Li concentration is preferably lower than or equal to $5\times10^{15}/cm^3$, more preferably lower than or equal to $1\times10^{15}/cm^3$. Similarly, the measurement value of a K concentration is preferably lower than or equal to $5\times10^{15}/cm^3$, more preferably lower than or equal to $1\times10^{15}/cm^3$.

Through the above steps, the concentration of hydrogen in the oxide semiconductor layer 716 can be lowered. Accordingly, the oxide semiconductor layer can be stable. In addition, the heat treatment at a temperature lower than or equal to the glass transition temperature makes it possible to form an oxide semiconductor layer with extremely low carrier density and a wide band gap. Thus, the transistor can be formed using a large substrate, so that mass productivity can be increased. In addition, by using the oxide semiconductor layer in which the hydrogen concentration is reduced, it is possible to manufacture a transistor with high withstand voltage and extremely low off-state current. The heat treatment can be performed at any time after the oxide semiconductor layer is deposited.

Note that the oxide semiconductor layer may be either amorphous or crystalline. The oxide semiconductor layer having crystallinity can be formed using, for example, a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where a crystal part (crystal region) and an amorphous part (amorphous region) are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Nitrogen may be substituted for part of oxygen which is a constituent of the CAAC-OS film.

The CAAC-OS film becomes a conductor, a semiconductor, or an insulator depending on its composition or the like. The CAAC-OS film transmits or does not transmit visible light depending on its composition or the like.

As an example of such a CAAC-OS film, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC-OS film will be described in detail with reference to FIGS. 16A to 16E, FIGS. 17A to 17C, and FIGS. 18A to 18C. In FIGS. 16A to 16E, FIGS. 17A to 17C, and FIGS. 18A to 18C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane). Furthermore, in FIGS. 16A to 16E, O surrounded by a circle represents tetracoordinate O and O surrounded by a double circle represents tricoordinate O.

Figure 16A:
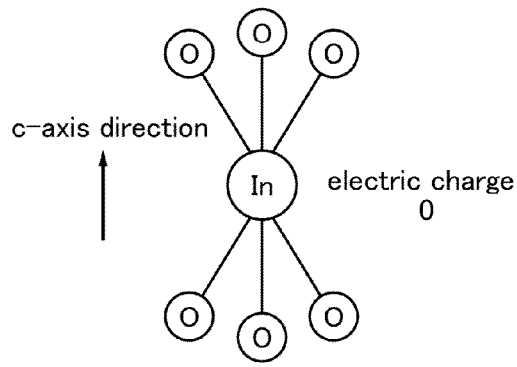
FIGS. 16A to 16E are diagrams each illustrating a crystal structure of an oxide material.

FIG. 16A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 16A is actually an octahedral structure, but is illustrated as a planar structure for simplicity. Note that three tetracoordinate O atoms exist in each of an upper half and a lower half in FIG. 16A. In the small group illustrated in FIG. 16A, electric charge is 0 (zero).

Figure 16D:
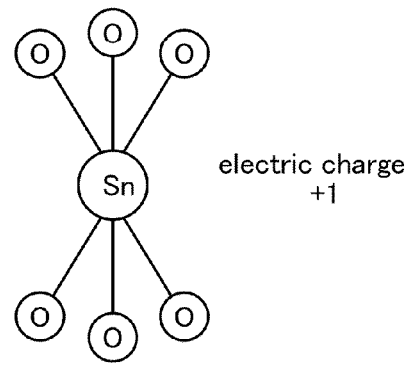
Figure 16B:
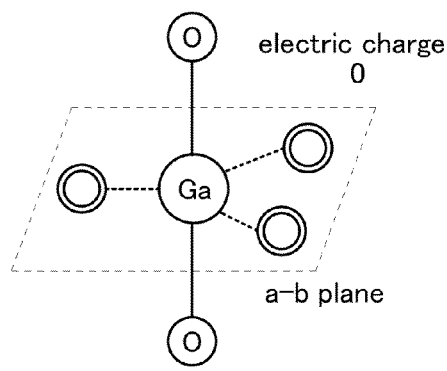

FIG. 16B illustrates a structure including one pentacoordinate Ga atom, three tricoordinate oxygen (hereinafter referred to as tricoordinate O) atoms proximate to the Ga atom, and two tetracoordinate O atoms proximate to the Ga atom (or near neighbor Ga atom). All the tricoordinate O atoms exist on the a-b plane. One tetracoordinate O atom exists in each of an upper half and a lower half in FIG. 16B. An In atom can also have the structure illustrated in FIG. 16B because an In atom can have five ligands. In the small group illustrated in FIG. 16B, electric charge is 0.

Figure 16E:
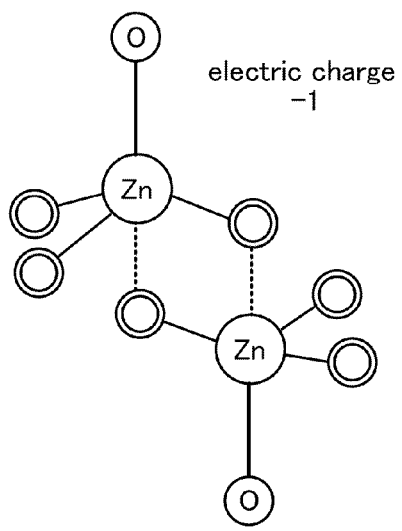
Figure 16C:
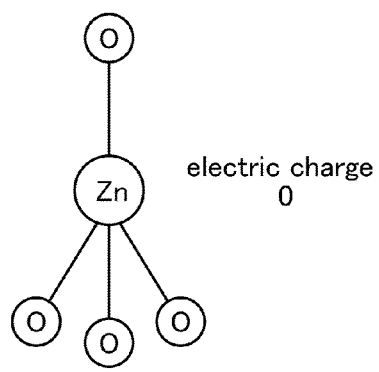

FIG. 16C illustrates a structure including one tetracoordinate Zn atom and four tetracoordinate O atoms proximate to the Zn atom. In FIG. 16C, one tetracoordinate O atom exists in an upper half and three tetracoordinate O atoms exist in a lower half In the small group illustrated in FIG. 16C, electric charge is 0.

FIG. 16D illustrates a structure including one hexacoordinate Sn atom and six tetracoordinate O atoms proximate to the Sn atom. In FIG. 16D, three tetracoordinate O atoms exist in each of an upper half and a lower half In the small group illustrated in FIG. 16D, electric charge is +1.

FIG. 16E illustrates a small group including two Zn atoms. In FIG. 16E, one tetracoordinate O atom exists in each of an upper half and a lower half In the small group illustrated in FIG. 16E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 16A has three proximate In atoms in the downward direction, and the three O atoms in the lower half has three proximate In atoms in the upward direction. The one O atom in the upper half with respect to the pentacoordinate Ga atom in FIG. 16B has one proximate Ga atom in the downward direction, and the one O atom in the lower half has one proximate Ga atom in the upward direction. The one O atom in the upper half with respect to the one tetracoordinate Zn atom in FIG. 16C has one proximate Zn atom in the downward direction, and the three O atoms in the lower half has three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded to each other. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition, a medium group can also be formed in a different manner by combining a plurality of small groups so that the total electric charge of the layered structure is 0.

Figure 17A:
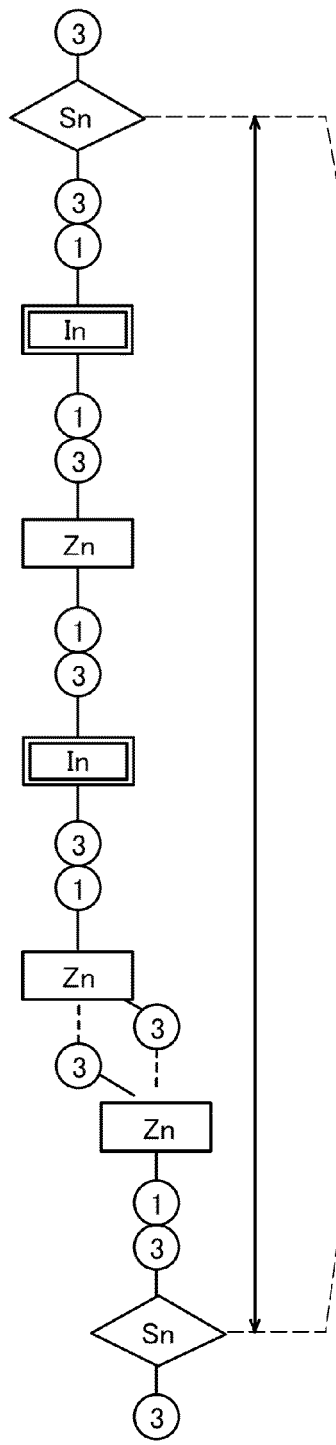
FIGS. 17A to 17C are diagrams illustrating a crystal structure of an oxide material.
Figure 17B:
Figure 17C:
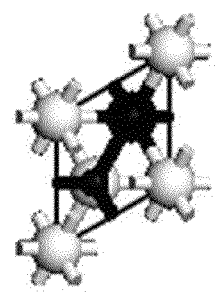

FIG. 17A illustrates a model of a medium group included in a layered structure of an In—Sn—Zn-based oxide. FIG. 17B illustrates a large group including three medium groups. FIG. 17C illustrates an atomic arrangement where the layered structure in FIG. 17B is observed from the c-axis direction.

In FIG. 17A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 17A, one tetracoordinate O atom existing in each of an upper half and a lower half with respect to an In atom is denoted by circled 1. FIG. 17A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 17A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 16E can be given. For example, with one small group including two Zn atoms, electric charge of one small group including a Sn atom can be cancelled, so that the total electric charge of the layered structure can be 0.

When the large group illustrated in FIG. 17B is repeated, a crystal of an In—Sn—Zn-based oxide ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a single-component metal oxide such as an In-based oxide, a Sn-based oxide, or a Zn-based oxide; and the like.

Figure 18A:
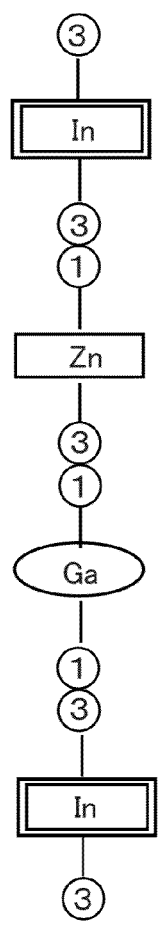
FIGS. 18A to 18C are diagrams illustrating a crystal structure of an oxide material.

For example, FIG. 18A illustrates a model of a medium group included in a layered structure of an In—Ga—Zn-based oxide.

In the medium group included in the layered structure of the In—Ga—Zn-based oxide in FIG. 18A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 18B:
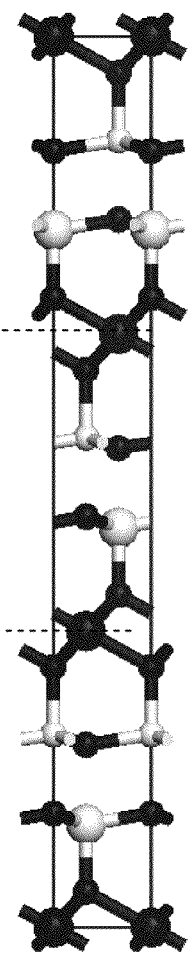
Figure 18C:
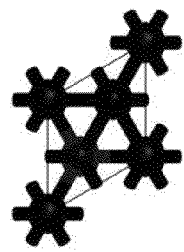

FIG. 18B illustrates a large group including three medium groups. Note that FIG. 18C illustrates an atomic arrangement in the case where the layered structure in FIG. 18B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 18A but also a medium group in which the arrangement of the In atom, the Ga atom, and the Zn atom is different from that in FIG. 18A.

In a CAAC-OS film, metal atoms and oxygen atoms are bonded in an orderly manner compared with in an amorphous oxide semiconductor film. That is to say, in the case where an oxide semiconductor is amorphous, the coordination numbers might vary between various metal atoms, but the coordination numbers of metal atoms are almost the same as each other in the CAAC-OS film. Therefore, microscopic defects of oxygen can be reduced and instability and moving of charge that are due to attachment and detachment of hydrogen atoms (including hydrogen ions) or alkali metal atoms can be reduced.

Accordingly, a transistor is formed using an oxide semiconductor film including the CAAC-OS film, whereby the amount of shift of the threshold voltage of the transistor, which occurs after light irradiation and a bias-temperature (BT) stress test are performed on the transistor, can be reduced. Accordingly, a transistor having stable electric characteristics can be formed.

Figure 10A:
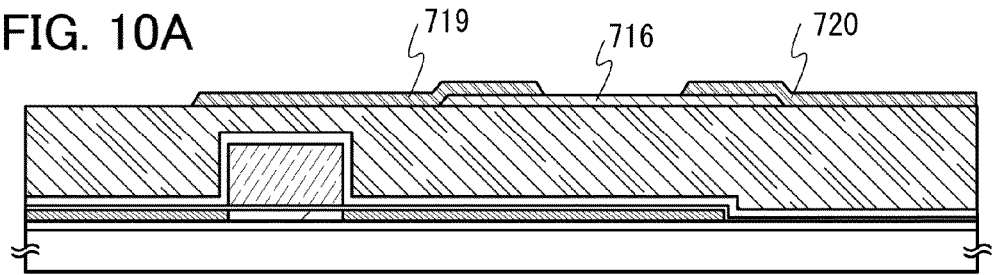
FIGS. 10A to 10D are cross-sectional views illustrating a manufacturing process of a signal processing circuit.

Next, as illustrated in FIG. 10A, the conductive layer 719 which is in contact with the oxide semiconductor layer 716 and the conductive layer 720 which is in contact with the oxide semiconductor layer 716 are formed. The conductive layer 719 and the conductive layer 720 function as source and drain electrodes.

Specifically, the conductive layer 719 and the conductive layer 720 can be formed in a manner such that a conductive film is formed by sputtering or vacuum vapor deposition and then is processed into a predetermined shape.

As the conductive film which serves as the conductive layer 719 and the conductive layer 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive layer 719 and the conductive layer 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesion with an oxide film. Thus, for the conductive layer 719 and the conductive layer 720, a layered structure is employed in which a conductive film including a Cu—Mg—Al alloy, a Mo—Ti alloy, Ti, or Mo is used for a lower layer and a conductive film including Cu is used for an upper layer. Consequently, the adhesion between an insulating film which is an oxide film and the conductive layer 719 and the conductive layer 720 can be increased.

For the conductive film which serves as the conductive layer 719 and the conductive layer 720, a conductive metal oxide may be used. As the conductive metal oxide, indium oxide, tin oxide, zinc oxide, indium tin oxide, indium zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that each material and etching conditions are adjusted as appropriate so that the oxide semiconductor layer 716 is not removed as much as possible during etching of the conductive film. Depending on the etching conditions, an exposed portion of the oxide semiconductor layer 716 is partly etched, so that a groove (a depression portion) is formed in some cases.

In this embodiment, a titanium film is used as the conductive film. Thus, the conductive film can be selectively etched by wet etching using a solution (an ammonia hydrogen peroxide mixture) containing ammonia and hydrogen peroxide water. Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

Note that in order to reduce the number of photomasks used in a photolithography process and to reduce the number of processes, an etching process may be performed using a resist mask formed using a multi-tone mask through which light is transmitted to have a plurality of intensities. A resist mask formed using a multi-tone mask has a plurality of thicknesses, and can be changed in shape by etching; thus, the resist mask can be used in a plurality of etching processes for processing films into different patterns. Accordingly, a resist mask corresponding to at least two or more kinds of different patterns can be formed by one multi-tone mask. Thus, the number of exposure masks and the number of corresponding photolithography processes can be reduced, so that the process can be simplified.

Further, an oxide conductive film functioning as source and drain regions may be provided between the oxide semiconductor layer 716, and the conductive layer 719 and the conductive layer 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive layer 719 and the conductive layer 720 may be performed concurrently.

With provision of the oxide conductive film functioning as source and drain regions, resistance between the oxide semiconductor layer 716, and the conductive layer 719 and the conductive layer 720 can be lowered, so that the transistor can operate at high speed. In addition, with provision of the oxide conductive film functioning as source and drain regions, the withstand voltage of the transistor can be increased.

Next, plasma treatment may be performed using a gas such as $N_2O$, $N_2$, or Ar. With this plasma treatment, water and the like attached onto an exposed surface of the oxide semiconductor layer are removed. Alternatively, plasma treatment may be performed using a mixture gas of oxygen and argon.

Figure 10B:
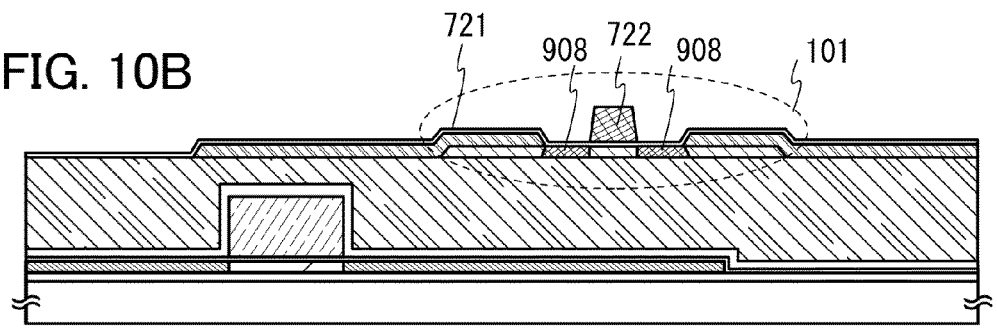

After the plasma treatment, as illustrated in FIG. 10B, the gate insulating film 721 is formed to cover the conductive layer 719 and the conductive layer 720 and the oxide semiconductor layer 716. Then, a gate electrode 722 is formed over the gate insulating film 721 to overlap with the oxide semiconductor layer 716.

Then, a pair of high-concentration regions 908 is formed by adding a dopant imparting n-type conductivity to the oxide semiconductor layer 716, using the gate electrode 722 as a mask, after the gate electrode 722 is formed. Note that a region of the oxide semiconductor layer 716, which overlaps with the gate electrode 722 with the gate insulating film 721 provided therebetween, is a channel formation region. The oxide semiconductor layer 716 includes the channel formation region between the pair of high-concentration regions 908. Addition of dopant for formation of the pair of high-concentration regions 908 can be performed by ion implantation. A rare gas such as helium, argon, or xenon; a Group 15 atom such as nitrogen, phosphorus, arsenic, or antimony; or the like can be used as the dopant, for example. For example, in the case where nitrogen is used as the dopant, the concentration of nitrogen atoms in the high-concentration region 908 is preferably higher than or equal to $5\times10^{19}/cm^3$ and lower than or equal to $1\times10^{22}/cm^3$. The high-concentration region 908 to which the dopant imparting n-type conductivity is added has higher conductivity than other regions in the oxide semiconductor layer 716. Thus, with provision of the pair of high-concentration regions 908 in the oxide semiconductor layer 716, resistance between the source and drain electrodes (the conductive layer 719 and the conductive layer 720) can be lowered.

When the resistance between the source and drain electrodes (the conductive layer 719 and the conductive layer 720) is lowered, high on-state current and high-speed operation can be secured even when the transistor 101 is miniaturized. In addition, by miniaturization of the transistor 101, the area of a memory cell array including the transistor can be reduced, so that memory capacity per unit area can be increased.

In the case where an In—Ga—Zn-based oxide semiconductor is used for the oxide semiconductor layer 716, an oxide semiconductor in the pair of high-concentration regions 908 has a wurtzite crystal structure by heat treatment at a temperature higher than or equal to 300° C. and lower than or equal to 600° C. for 1 hour after the addition of nitrogen. When the oxide semiconductor in the pair of high-concentration regions 908 has a wurtzite crystal structure, the conductivity of the pair of high-concentration regions 908 can be further increased and the resistance between the source and drain electrodes (the conductive layer 719 and the conductive layer 720) can be further lowered. Note that in order to effectively lower the resistance between the source and drain electrodes (the conductive layer 719 and the conductive layer 720) by forming an oxide semiconductor with a wurtzite crystal structure, the concentration of nitrogen atoms in the high-concentration region 908 is preferably higher than or equal to $1\times10^{20}/cm^3$ and lower than or equal to 7 at. % in the case where nitrogen is used as the dopant. Even in the case where the concentration of nitrogen atoms is lower than the above range, an oxide semiconductor with a wurtzite crystal structure can be obtained in some cases.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen, such as a silicon oxide film or a silicon oxynitride film, is formed on a side which is closer to the oxide semiconductor layer 716 than the insulating film having a high barrier property. Then, the insulating film having a high barrier property is formed to overlap with the conductive layer 719 and the conductive layer 720, and the oxide semiconductor layer 716 with the insulating film having low proportion of nitrogen provided therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 with a structure in which a 100-nm-thick silicon nitride film formed by sputtering is stacked over a 200-nm-thick silicon oxide film formed by sputtering is formed. The substrate temperature during deposition may be higher than or equal to room temperature and lower than or equal to 300° C., and is 100° C. in this embodiment.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the content of water in the gas be lower than or equal to 20 ppm, preferably lower than or equal to 1 ppm, more preferably lower than or equal to 10 ppb. In this embodiment, for example, heat treatment is performed at 250° C. in a nitrogen atmosphere for 1 hour. Alternatively, RTA treatment for a short time at a high temperature may be performed before the conductive layer 719 and the conductive layer 720 are formed in a manner similar to that of the heat treatment performed on the oxide semiconductor layer for reduction of moisture or hydrogen. Even when oxygen defects are generated in the oxide semiconductor layer 716 by the heat treatment performed on the oxide semiconductor layer 716 by performing heat treatment after the gate insulating film 721 containing oxygen is provided, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric ratio can be satisfied. The oxide semiconductor layer 716 preferably contains oxygen whose composition exceeds the stoichiometric composition. As a result, the oxide semiconductor layer 716 can be made substantially intrinsic and variation in electric characteristics of the transistor due to oxygen defects can be reduced; thus, electric characteristics can be improved. The timing of this heat treatment is not particularly limited as long as it is after the formation of the gate insulating film 721. When this heat treatment serves as heat treatment in another step (e.g., heat treatment during formation of a resin film or heat treatment for lowering the resistance of a transparent conductive film), the oxide semiconductor layer 716 can be made substantially intrinsic without the increase in the number of steps.

Alternatively, the oxygen defects that serve as donors in the oxide semiconductor layer 716 may be reduced by performing heat treatment on the oxide semiconductor layer 716 in an oxygen atmosphere so that oxygen is added to the oxide semiconductor. The heat treatment is performed at a temperature, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably higher than or equal to 6N (99.9999%), more preferably higher than or equal to 7N (99.99999%) (that is, the impurity concentration in oxygen is lower than or equal to 1 ppm, preferably lower than or equal to 0.1 ppm).

Alternatively, oxygen may be added to the oxide semiconductor layer 716 by ion implantation, ion doping, or the like so that oxygen defects that serve as donors are reduced. For example, oxygen made to be plasma with a microwave of 2.45 GHz may be added to the oxide semiconductor layer 716.

The gate electrode 722 can be formed in a manner such that a conductive film is formed over the gate insulating film 721 and then is etched. The gate electrode 722 can be formed using a material similar to that of the gate electrode 707 and the conductive layer 719 and the conductive layer 720.

The thickness of the gate electrode 722 is greater than or equal to 10 nm and less than or equal to 400 nm, preferably greater than or equal to 100 nm and less than or equal to 200 nm. In this embodiment, after a 150-nm-thick conductive film for the gate electrode is formed by sputtering using a tungsten target, the conductive film is processed into a desired shape by etching, so that the gate electrode 722 is formed. A resist mask may be formed by an ink-jet method. When the resist mask is formed by an ink-jet method, a photomask is not used; thus, manufacturing cost can be reduced.

Through the above steps, the transistor 101 is formed.

In the transistor 101, the source and drain electrodes (the conductive layer 719 and the conductive layer 720) do not overlap with the gate electrode 722. In other words, a gap which is larger than the thickness of the gate insulating film 721 is provided between the source and drain electrodes (the conductive layer 719 and the conductive layer 720) and the gate electrode 722. Thus, in the transistor 101, parasitic capacitance formed between the source and drain electrodes and the gate electrode can be reduced. Consequently, high-speed operation can be performed Note that the transistor 101 is not limited to a transistor having a channel in an oxide semiconductor layer, and it is possible to use a transistor that includes a semiconductor material whose band gap is wider than that of silicon and whose intrinsic carrier density is lower than that of silicon in a channel formation region. As such a semiconductor material, for example, silicon carbide, gallium nitride, or the like can be used instead of an oxide semiconductor. With a channel formation region including such a semiconductor material, a transistor with extremely low off-state current can be obtained.

Although the transistor 101 is described as a single-gate transistor, a multi-gate transistor including a plurality of channel formation regions can be formed when a plurality of gate electrodes which are electrically connected are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film which is in contact with the oxide semiconductor layer, the state of an interface with the oxide semiconductor layer can be kept well.

An insulating material containing an element that belongs to Group 13 is an insulating material containing one or more elements that belong to Group 13. Examples of the insulating material containing an element that belongs to Group 13 include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where an insulating film is formed in contact with an oxide semiconductor layer containing gallium, when a material containing gallium oxide is used for the insulating film, favorable characteristics can be kept at the interface between the oxide semiconductor layer and the insulating film. For example, when the oxide semiconductor layer and the insulating film containing gallium oxide are provided in contact with each other, pileup of hydrogen at the interface between the oxide semiconductor layer and the insulating film can be reduced. Note that a similar effect can be obtained in the case where an element that belongs to the same group as a constituent element of the oxide semiconductor is used for the insulating film. For example, it is effective to form an insulating film with the use of a material containing aluminum oxide. Aluminum oxide does not easily transmit water. Thus, it is preferable to use the material including aluminum oxide in order to prevent water from entering the oxide semiconductor layer.

The insulating film which is in contact with the oxide semiconductor layer 716 preferably contains oxygen in a proportion higher than that in the stoichiometric composition, by heat treatment in an oxygen atmosphere, oxygen doping, or the like. "Oxygen doping" refers to addition of oxygen to a bulk. Note that the term "bulk" is used in order to clarify that oxygen is added not only to a surface of a thin film but also to the inside of the thin film. In addition, the term "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is formed using gallium oxide, the composition of gallium oxide can be set to be $Ga_2O_X$ ($X=3+\alpha$, $0<\alpha<1$) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ ($X=3+\alpha$, $0<\alpha<1$) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_XAl_{2-X}O_{3+\alpha}$ ($0<X<2$, $0<\alpha<1$) by heat treatment in an oxygen atmosphere or oxygen doping.

By oxygen doping, an insulating film including a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be an intrinsic or substantially intrinsic oxide semiconductor.

The insulating film including a region where the proportion of oxygen is higher than that in the stoichiometric composition may be used for either the insulating film placed on an upper side of the oxide semiconductor layer or the insulating film placed on a lower side of the oxide semiconductor layer of the insulating films which are in contact with the oxide semiconductor layer 716; however, it is preferable to use such an insulating film for both the insulating films which are in contact with the oxide semiconductor layer 716. The above advantageous effect can be enhanced with a structure where the oxide semiconductor layer 716 is sandwiched between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ ($X=3+\alpha$, $0<\alpha<1$). Alternatively, one of the insulating films on the upper side and the lower side may be formed using $Ga_2O_X$ ($X=3+\alpha$, $0<\alpha<1$) and the other may be formed using aluminum oxide whose composition is $Al_2O_X$ ($X=3+\alpha$, $0<\alpha<1$).

The insulating film which is in contact with the oxide semiconductor layer 716 may be formed by a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) may be formed thereover. Note that the insulating film on the lower side of the oxide semiconductor layer 716 may be formed by a stack of insulating films each including a region where the proportion of oxygen is higher than that in the stoichiometric composition. Alternatively, both the insulating films on the upper side and the lower side of the oxide semiconductor layer 716 may be formed by a stack of insulating films each including a region where the proportion of oxygen is higher than that in the stoichiometric composition.

Figure 10C:
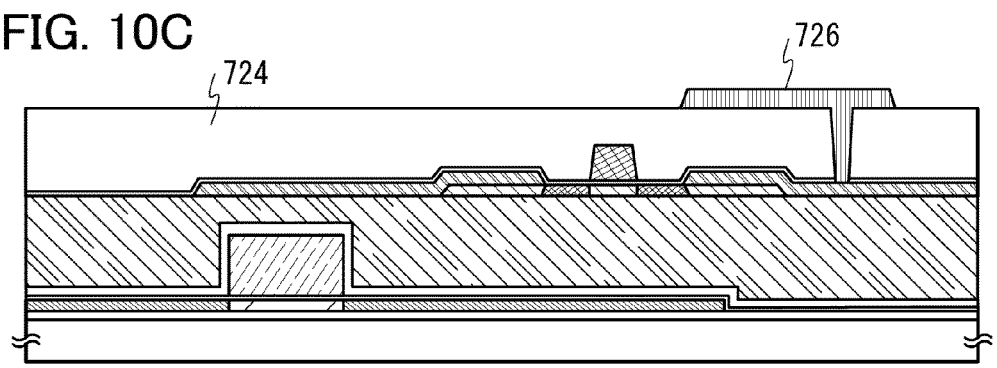

Next, as illustrated in FIG. 10C, an insulating film 724 is formed so as to cover the gate insulating film 721 and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one mode of the present invention is not limited to this structure. The insulating film 724 may have a layered structure of two or more layers.

Next, an opening is formed in the gate insulating film 721 and the insulating film 724, so that part of the conductive layer 720 is exposed. After that, a wiring 726 which is in contact with the conductive layer 720 through the opening is formed over the insulating film 724.

A conductive film is formed by PVD or CVD and then is etched, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by PVD and a thin titanium film (with a thickness of approximately 5 nm) is formed by PVD, and then an aluminum film is formed so as to be embedded in the opening. Here, the titanium film formed by PVD has a function of reducing an oxide film (e.g., a native oxide film) formed on a surface over which the titanium film is formed, to decrease the contact resistance with the lower electrode or the like (here, the conductive layer 720). In addition, hillocks of the aluminum film can be prevented. A copper film may be formed by a plating method after a barrier film of titanium, titanium nitride, or the like is formed.

Figure 10D:
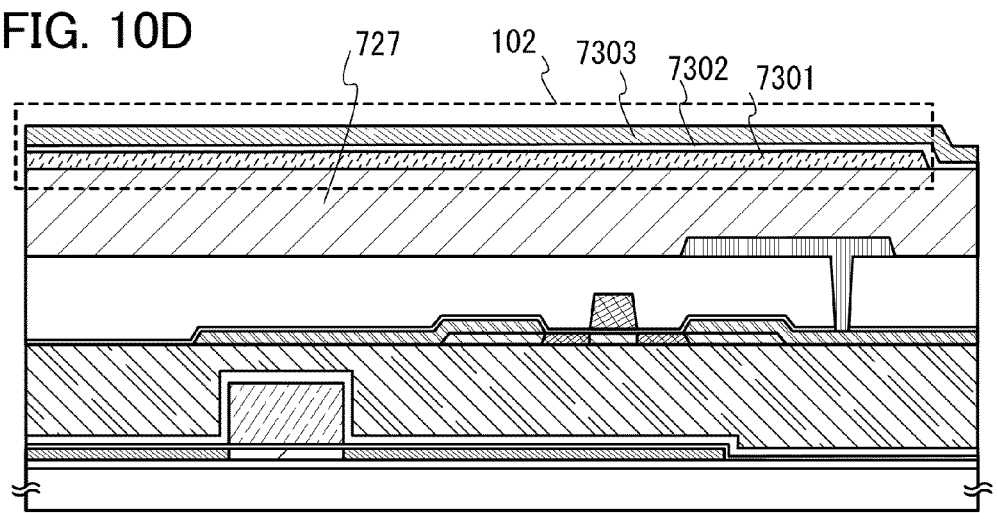

Next, as illustrated in FIG. 10D, an insulating film 727 is formed so as to cover the wiring 726. Further, a conductive film is formed over the insulating film 727 and then is etched, so that a conductive layer 7301 is formed. After that, an insulating film 7302 is formed so as to cover the conductive layer 7301, and a conductive film 7303 is formed over the insulating film 7302. In this manner, the capacitor 102 can be formed. One of a pair of electrodes of the capacitor 102 corresponds to the conductive layer 7301, the other of the pair of electrodes of the capacitor 102 corresponds to the conductive film 7303, and a dielectric layer of the capacitor 102 corresponds to the insulating film 7302. Here, the insulating film 727, the conductive layer 7301, the insulating film 7302, and the conductive film 7303 can be formed using materials similar to those of other insulating films and conductive layers.

Through the series of steps, the signal processing circuit 2000 can be formed.

This embodiment can be combined with any of the other embodiments as appropriate.

Embodiment 5

In this embodiment, a transistor including an oxide semiconductor layer with a structure different from the structure in Embodiment 4 will be described. Note that the same portions as those in FIGS. 10A to 10D are denoted by the same reference numerals and the description thereof is omitted.

Figure 11A:
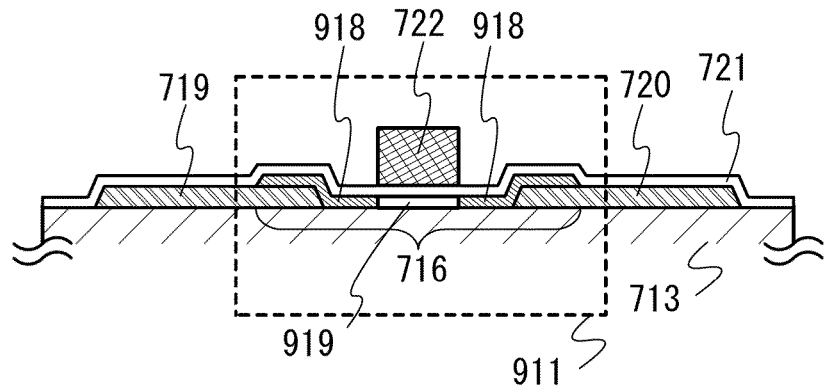
FIGS. 11A to 11C are cross-sectional views each illustrating a structure of a transistor having a channel in an oxide semiconductor layer.

A transistor 911 illustrated in FIG. 11A is a top-gate transistor in which the gate electrode 722 is formed over the oxide semiconductor layer 716 and is also a bottom-contact transistor in which the source and drain electrodes (the conductive layer 719 and the conductive layer 720) are formed below the oxide semiconductor layer 716.

The oxide semiconductor layer 716 includes a pair of high-concentration regions 918 that can be obtained by adding a dopant imparting n-type conductivity to the oxide semiconductor layer 716 after the gate electrode 722 is formed. In addition, a region of the oxide semiconductor layer 716, which overlaps with the gate electrode 722 with the gate insulating film 721 provided therebetween, is a channel formation region 919. The oxide semiconductor layer 716 includes the channel formation region 919 between the pair of high-concentration regions 918.

The pair of high-concentration regions 918 can be formed in a manner similar to that of the pair of high-concentration regions 908 described in Embodiment 4.

Figure 11B:
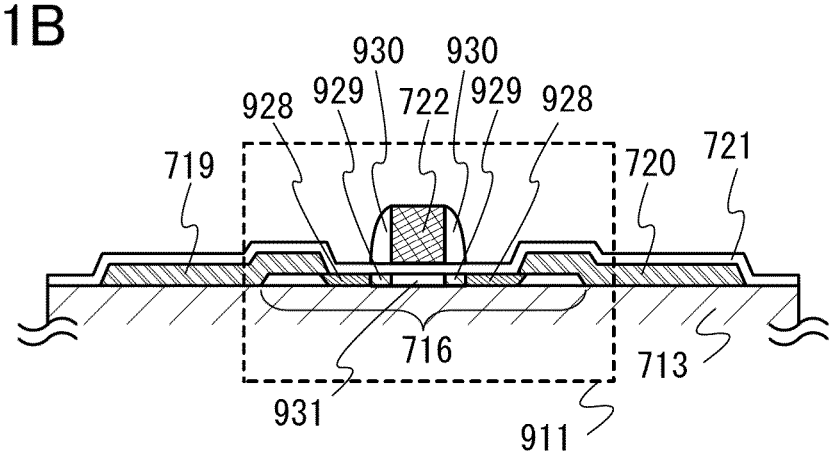

A transistor 911 illustrated in FIG. 11B is a top-gate transistor in which the gate electrode 722 is formed over the oxide semiconductor layer 716 and is also a bottom-contact transistor in which the source and drain electrodes (the conductive layer 719 and the conductive layer 720) are formed over the oxide semiconductor layer 716. The transistor 911 further includes sidewalls 930 that are provided at ends of the gate electrode 722 and are formed using an insulating film.

The oxide semiconductor layer 716 includes a pair of high-concentration regions 928 and a pair of low-concentration regions 929 that can be obtained by adding a dopant imparting n-type conductivity to the oxide semiconductor layer 716 after the gate electrode 722 is formed. In addition, a region of the oxide semiconductor layer 716, which overlaps with the gate electrode 722 with the gate insulating film 721 provided therebetween, is a channel formation region 931. The oxide semiconductor layer 716 includes the pair of low-concentration regions 929 between the pair of high-concentration regions 928 and the channel formation region 931 between the pair of low-concentration regions 929. Further, the pair of low-concentration regions 929 is provided in a region of the oxide semiconductor layer 716, which overlaps with the sidewalls 930 with the gate insulating film 721 provided therebetween.

The pair of high-concentration regions 928 and the pair of low-concentration regions 929 can be formed in a manner similar to that of the pair of high-concentration regions 908 described in Embodiment 4.

Figure 11C:
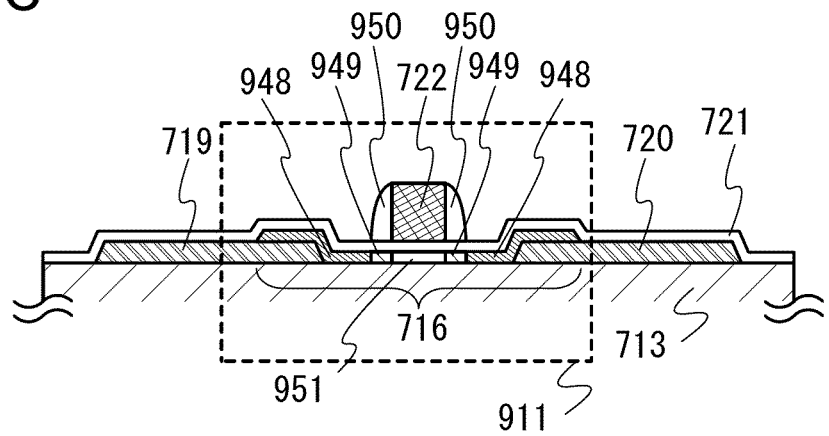

The transistor 911 illustrated in FIG. 11C is a top-gate transistor in which the gate electrode 722 is formed over the oxide semiconductor layer 716 and is also a bottom-contact transistor in which the source and drain electrodes (the conductive layer 719 and the conductive layer 720) are formed below the oxide semiconductor layer 716. The transistor 911 further includes sidewalls 950 that are provided at ends of the gate electrode 722 and are formed using an insulating film.

The oxide semiconductor layer 716 includes a pair of high-concentration regions 948 and a pair of low-concentration regions 949 that can be obtained by adding a dopant imparting n-type conductivity to the oxide semiconductor layer 716 after the gate electrode 722 is formed. In addition, a region of the oxide semiconductor layer 716, which overlaps with the gate electrode 722 with the gate insulating film 721 provided therebetween, is a channel formation region 951. The oxide semiconductor layer 716 includes the pair of low-concentration regions 949 between the pair of high-concentration regions 948 and the channel formation region 951 between the pair of low-concentration regions 949. Further, the pair of low-concentration regions 949 is provided in a region of the oxide semiconductor layer 716, which overlaps with the sidewalls 950 with the gate insulating film 721 provided therebetween.

The pair of high-concentration regions 948 and the pair of low-concentration regions 949 can be formed in a manner similar to that of the pair of high-concentration regions 908 described in Embodiment 4.

Note that as one of methods for forming a high-concentration region functioning as a source region or a drain region in a transistor including an oxide semiconductor through a self-aligning process, a method has been disclosed by which a surface of an oxide semiconductor layer is exposed, argon plasma treatment is performed, and the resistance of a region in the oxide semiconductor layer that is exposed to plasma is lowered (S. Jeon et al., "180 nm Gate Length Amorphous InGaZnO Thin Film Transistor for High Density Image Sensor Applications", IEDM Tech. Dig., pp. 504-507, 2010).

However, in the formation method, it is necessary to remove a gate insulating film partly so that a region serving as a source region or a drain region is exposed after the gate insulating film is formed. Thus, when the gate insulating film is removed, the oxide semiconductor layer which is below the gate insulating film is partly over etched, so that the thickness of the region serving as the source region or the drain region is decreased. Consequently, the resistance of the source region or the drain region is increased and defects in characteristics of the transistor due to over etching easily occur.

In order to miniaturize the transistor, it is necessary to employ dry etching with high processing accuracy. The over etching particularly occurs easily in the case where dry etching, which cannot sufficiently secure selectivity of the oxide semiconductor layer with respect to the gate insulating film, is employed.

For example, the over etching does not become a problem as long as the oxide semiconductor layer has sufficient large thickness. However, in the case where the channel length is less than or equal to 200 nm, it is necessary that the thickness of a region of the oxide semiconductor layer, which serves as a channel formation region, be less than or equal to 20 nm, preferably less than or equal to 10 nm in order to prevent a short channel effect. In the case where such a thin oxide semiconductor layer is used, the over etching of the oxide semiconductor layer is unfavorable because the resistance of the source region or the drain region is increased and defects in characteristics of the transistor occur as described above.

However, when dopant is added to the oxide semiconductor layer while the oxide semiconductor layer is not exposed and the gate insulating film is left as in one mode of the present invention, the over etching of the oxide semiconductor layer can be prevented and excessive damage to the oxide semiconductor layer can be reduced. Further, an interface between the oxide semiconductor layer and the gate insulating film is kept clean. Thus, the characteristics and reliability of the transistor can be improved.

This embodiment can be combined with any of the other embodiments as appropriate.

Embodiment 6

In this embodiment, a transistor including an oxide semiconductor layer with a structure different from the structures in Embodiment 4 and Embodiment 5 will be described. Note that the same portions as those in FIGS. 10A to 10D are denoted by the same reference numerals and the description thereof is omitted. In a transistor 101 described in this embodiment, the gate electrode 722 is provided so as to overlap with the conductive layer 719 and the conductive layer 720. In addition, the transistor 101 of this embodiment is different from the transistor 101 described in Embodiment 4 or 5 in that an impurity element imparting conductivity is not added to the oxide semiconductor layer 716, using the gate electrode 722 as a mask.

Figure 12A:
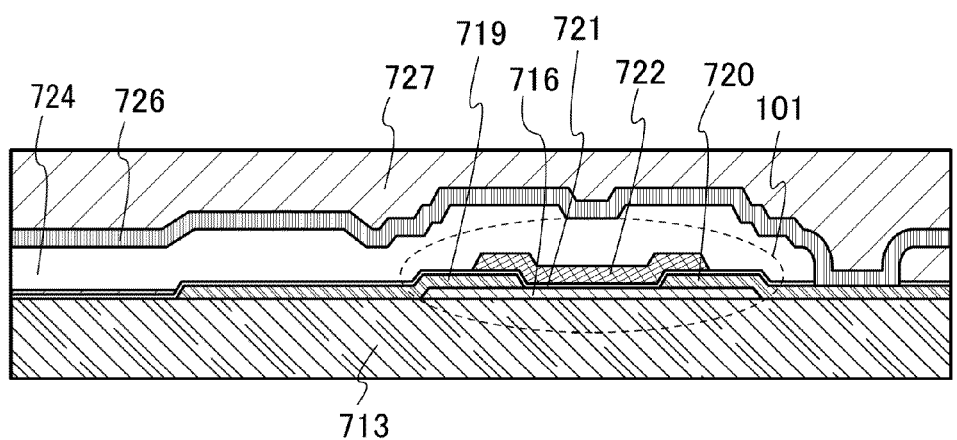
FIGS. 12A and 12B are cross-sectional views each illustrating a structure of a transistor having a channel in an oxide semiconductor layer.
Figure 12B:
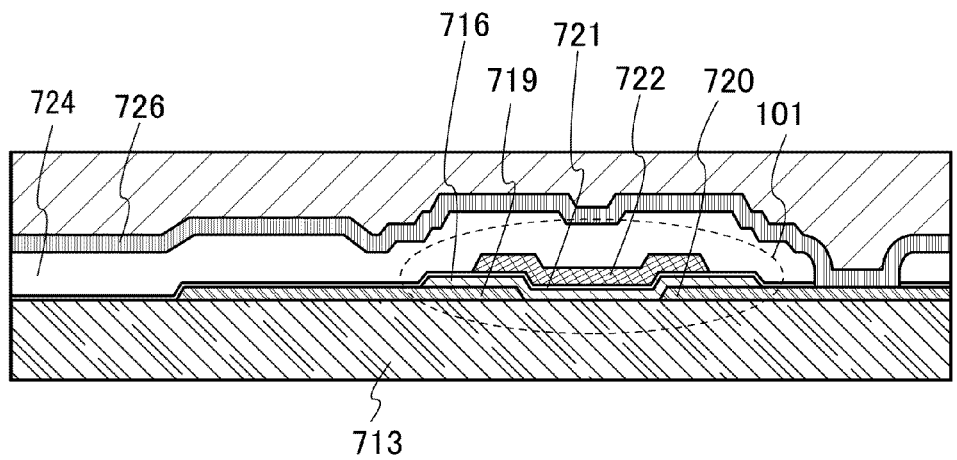

FIG. 12A illustrates an example of the transistor 101 in which the oxide semiconductor layer 716 is provided below the conductive layer 719 and the conductive layer 720, whereas FIG. 12B illustrates an example of the transistor 101 in which the oxide semiconductor layer 716 is provided above the conductive layer 719 and the conductive layer 720. Note that although the upper surface of the insulating film 724 is not flattened in each of FIGS. 12A and 12B, one mode of the present invention is not limited to this structure. The upper surface of the insulating film 724 may be planarized.

This embodiment can be combined with any of the other embodiments as appropriate.

Embodiment 7

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically. In this embodiment, the field-effect mobility of an ideal oxide semiconductor without a defect inside the semiconductor is calculated theoretically, and calculation results of characteristics of minute transistors that are manufactured using such an oxide semiconductor are shown.

Assuming that the original mobility and the measured field-effect mobility of a semiconductor are $\mu_0$ and $\mu$, respectively, and a potential barrier (such as a grain boundary) exists in the semiconductor, the measured field-effect mobility is expressed by the following formula.

$$\mu = \mu_0 \exp\left(-\frac{E}{kT}\right) \quad \text{[FORMULA 2]}$$

Here, E represents the height of the potential barrier, k represents the Boltzmann constant, and T represents the absolute temperature. When the potential barrier is assumed to be attributed to a defect, the height of the potential barrier is expressed by the following formula according to the Levinson model.

$$E = \frac{e^2 N^2}{8\varepsilon n} = \frac{e^3 N^2 t}{8\varepsilon C_{ox} V_g} \quad \text{[FORMULA 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region is expressed by the following formula.

$$I_d = \frac{W \mu V_g V_d C_{ox}}{L} \exp\left(-\frac{E}{kT}\right) \quad \text{[FORMULA 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \quad \text{[FORMULA 5]}$$

The right side of Formula 5 is a function of $V_g$. From the equation, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm²/Vs from Formula 2 and Formula 3. The measured mobility of an In—Sn—Zn-based oxide including a defect is approximately 40 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by the following formula.

$$\frac{1}{\mu_1} = \frac{1}{\mu_0} + \frac{D}{B}\exp\left(-\frac{x}{G}\right) \qquad \text{[FORMULA 6]}$$

Here, D represents the electric field in the gate direction, and B and G are constants. B and G can be obtained from actual measurement results, and according to the above measurement results, B is $4.75 \times 10^7$ cm/s and G is 10 nm (the depth to which the influence of interface scattering reaches). When D is increased (i.e., when the gate voltage is increased), the second term of Formula 6 is increased, so that the mobility $\mu_1$ is decreased.

Figure 19:
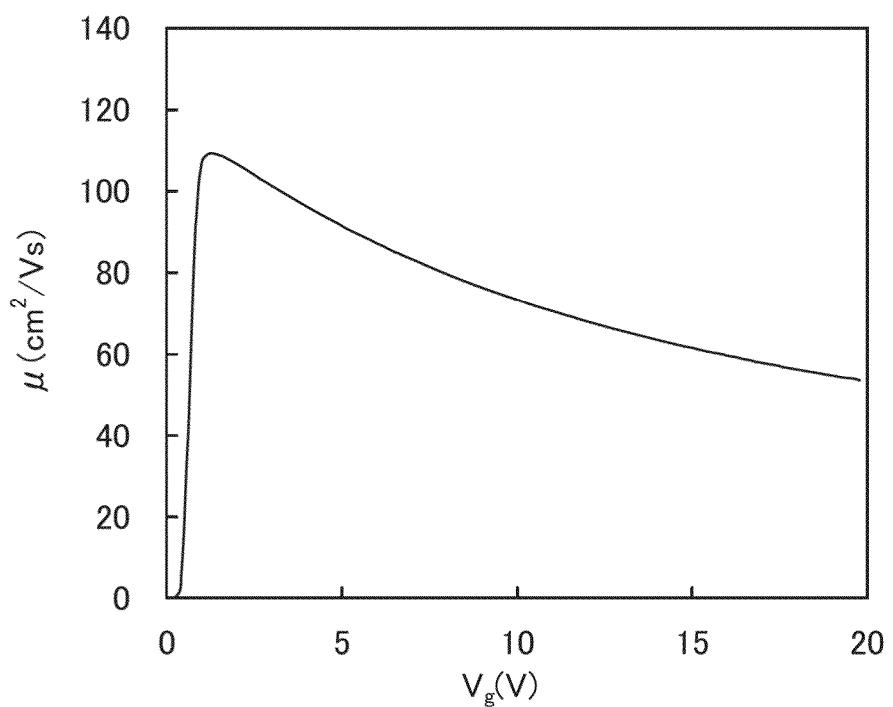
FIG. 19 shows gate voltage dependence of mobility obtained by calculation.

Calculation results of the mobility $\mu_2$ of a transistor having a channel including an ideal oxide semiconductor without a defect inside the semiconductor are shown in FIG. 19. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 19, the mobility has a peak of 100 cm²/Vs or more at a gate voltage that is a little over 1 V and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors formed using an oxide semiconductor having such a mobility are shown in FIGS. 20A to 20C, FIGS. 21A to 21C, and FIGS. 22A to 22C. FIGS. 23A and 23B illustrate cross-sectional structures of the transistors used for the calculation. The transistors illustrated in FIGS. 23A and 23B each include a semiconductor region 803*a* and a semiconductor region 803*c* which have n⁺-type conductivity in an oxide semiconductor layer. The resistivity of the semiconductor region 803*a* and the resistivity of the semiconductor region 803*c* are each $2 \times 10^{-3}$ Ωcm.

The transistor in FIG. 23A is formed over a base insulating layer 801 and an embedded insulator 802 that is embedded in the base insulating layer 801 and formed of aluminum oxide. The transistor includes the semiconductor region 803*a*, the semiconductor region 803*c*, an intrinsic semiconductor region 803*b* that is placed between the semiconductor regions 803*a* and 803*c* and serves as a channel formation region, and a gate 805. The width of the gate 805 is 33 nm.

A gate insulating film 804 is formed between the gate 805 and the semiconductor region 803*b*. A sidewall insulator 806*a* and a sidewall insulator 806*b* are formed on both side surfaces of the gate 805, and an insulator 807 is formed over the gate 805 so as to prevent a short circuit between the gate 805 and another wiring. The sidewall insulator has a width of 5 nm. A source 808*a* and a drain 808*b* are provided in contact with the semiconductor region 803*a* and the semiconductor region 803*c*, respectively. Note that the channel width of this transistor is 40 nm.

The transistor in FIG. 23B is the same as the transistor in FIG. 23A in that it is formed over the base insulating layer 801 and the embedded insulator 802 formed of aluminum oxide and that it includes the semiconductor region 803*a*, the semiconductor region 803*c*, the intrinsic semiconductor region 803*b* provided therebetween, the gate 805 having a width of 33 nm, the gate insulating film 804, the sidewall insulator 806*a*, the sidewall insulator 806*b*, the insulator 807, the source 808*a*, and the drain 808*b*.

The difference between the transistor in FIG. 23A and the transistor in FIG. 23B is the conductivity type of semiconductor regions under the sidewall insulator 806*a* and the sidewall insulator 806*b*. In the transistor in FIG. 23A, the semiconductor regions under the sidewall insulator 806*a* and the sidewall insulator 806*b* are part of the semiconductor region 803*a* having n⁺-type conductivity and part of the semiconductor region 803*c* having n⁺-type conductivity, whereas in the transistor in FIG. 23*b*, the semiconductor regions under the sidewall insulator 806*a* and the sidewall insulator 806*b* are part of the intrinsic semiconductor region 803*b*. In other words, there is a region with a width $L_{off}$ in which the gate 805 does not overlap with the semiconductor region 803*a* (the semiconductor region 803*c*). This region is called an offset region, and the width $L_{off}$ is called an offset length. As is seen from the drawing, the offset length is equal to the width of the sidewall insulator 806*a* (the sidewall insulator 806*b*).

Figure 20A:
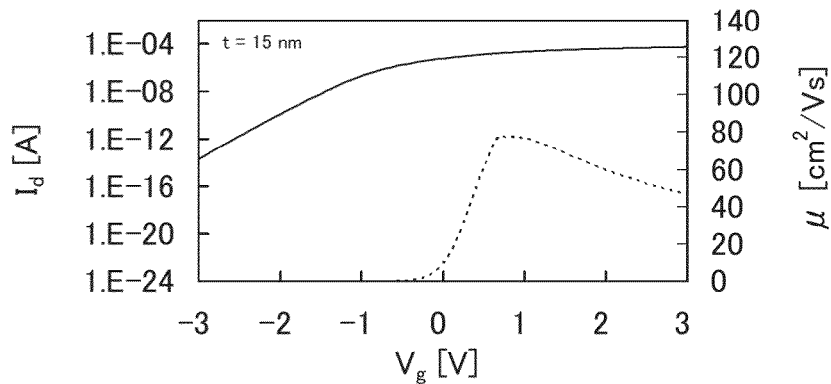
FIGS. 20A to 20C are graphs each showing gate voltage dependence of drain current and mobility, which is obtained by calculation.
Figure 20B:
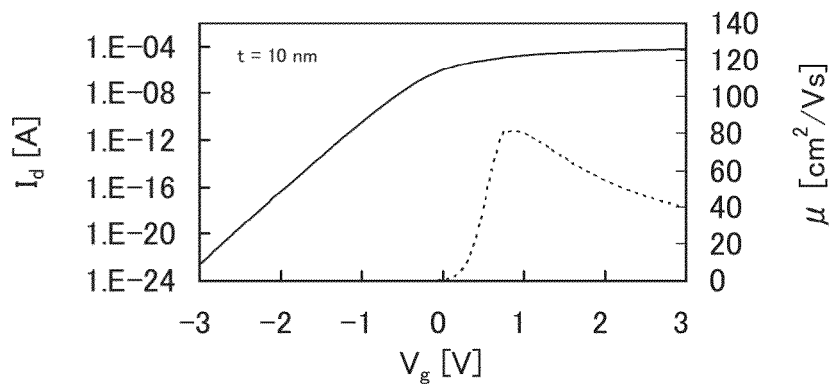
Figure 20C:
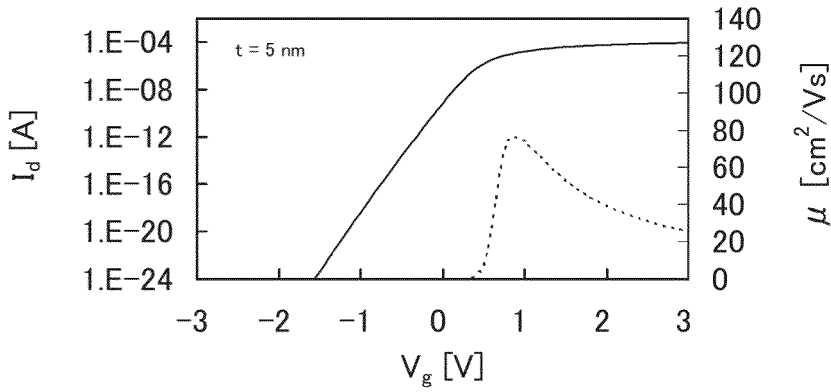

The other parameters used in calculation are as described above. For the calculation, device simulation software Sentaurus Device manufactured by Synopsys, Inc. was used. FIGS. 20A to 20C show the gate voltage ($V_g$: a potential difference between the gate and the source) dependence of the drain current ($I_d$, a solid line) and the mobility (μ, a dotted line) of the transistor having the structure illustrated in FIG. 23A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 20A shows the gate voltage dependence of the transistor in the case where the thickness of the gate insulating layer is 15 nm, FIG. 20B shows that of the transistor in the case where the thickness of the gate insulating layer is 10 nm, and FIG. 20C shows that of the transistor in the case where the thickness of the gate insulating layer is 5 nm. As the gate insulating layer is thinner, the drain current $I_d$ in the off state (the off-state current) in particular is significantly decreased. In contrast, there is no noticeable change in the peak value of the mobility μ and the drain current $I_d$ in the on state (the on-state current). The graphs show that the drain current exceeds 10 μA at a gate voltage of around 1 V.

Figure 21A:
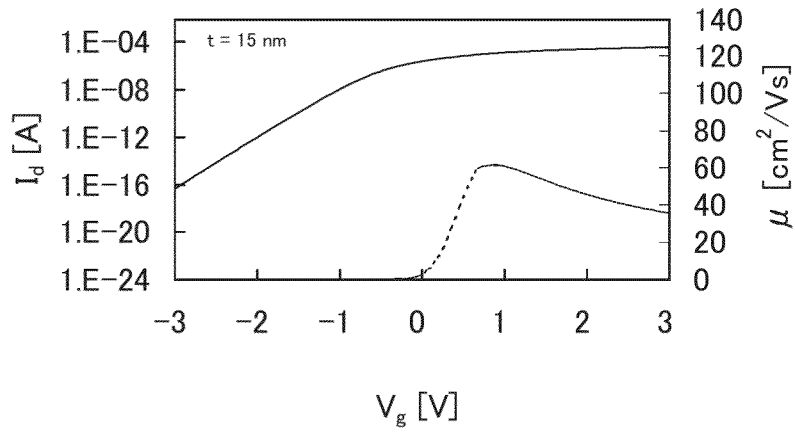
FIGS. 21A to 21C are graphs each showing gate voltage dependence of drain current and mobility, which is obtained by calculation.
Figure 21B:
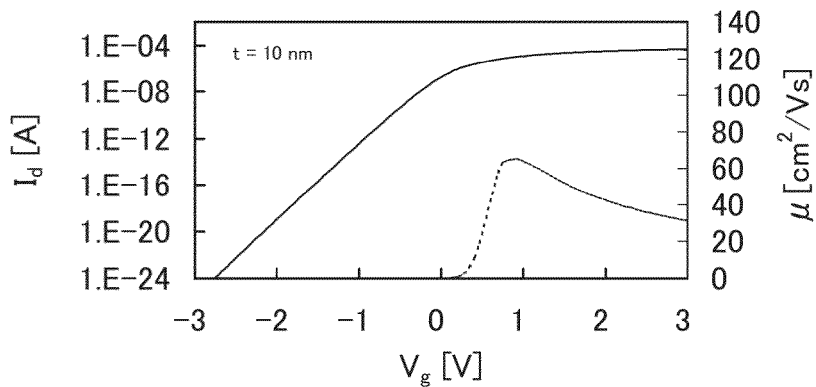
Figure 21C:
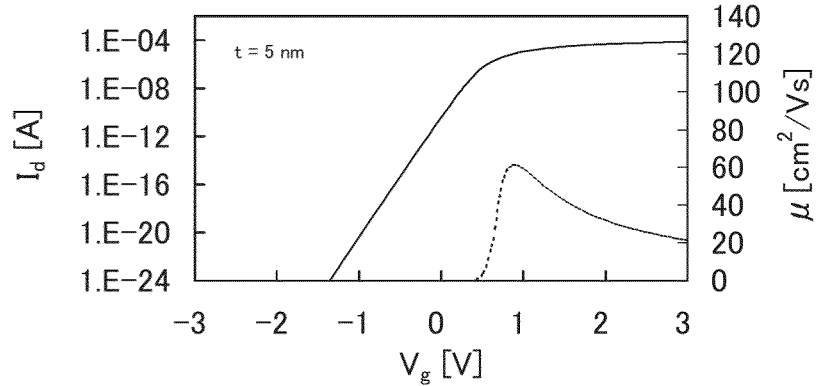

FIGS. 21A to 21C show the gate voltage $V_g$ dependence of the drain current $I_d$ (a solid line) and the mobility μ (a dotted line) of the transistor having the structure in FIG. 23B and an offset length $L_{off}$ of 5 nm. The drain current $I_d$ is obtained by calculation under the assumption that the drain voltage is +1 V and the mobility μ is obtained by calculation under the assumption that the drain voltage is +0.1 V. FIG. 21A shows the gate voltage dependence of the transistor in the case where the thickness of the gate insulating layer is 15 nm, FIG. 21B shows that of the transistor in the case where the thickness of the gate insulating layer is 10 nm, and FIG. 21C shows that of the transistor in the case where the thickness of the gate insulating layer is 5 nm.

Figure 22A:
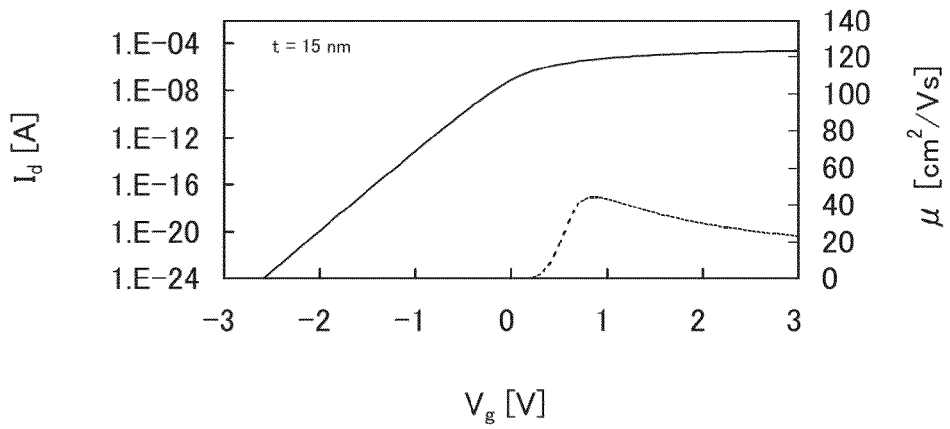
FIGS. 22A to 22C are graphs each showing gate voltage dependence of drain current and mobility, which is obtained by calculation.
Figure 22B:
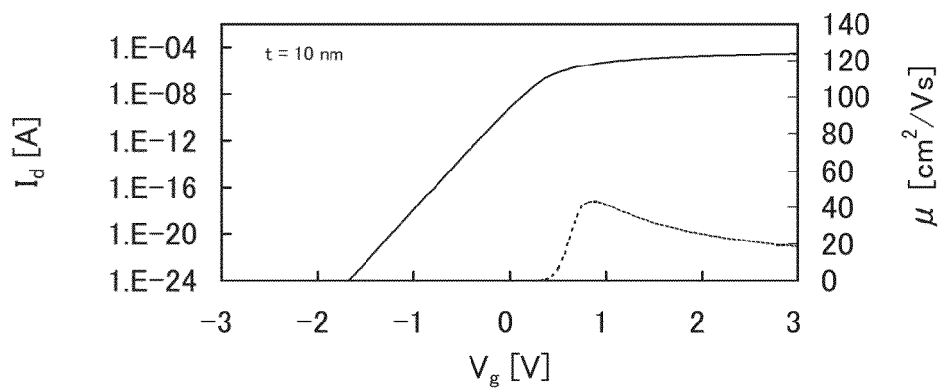
Figure 22C:
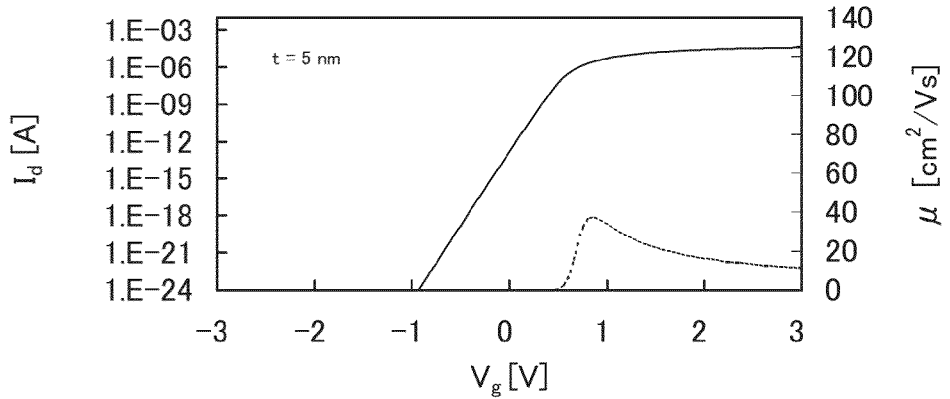
Figure 23A:
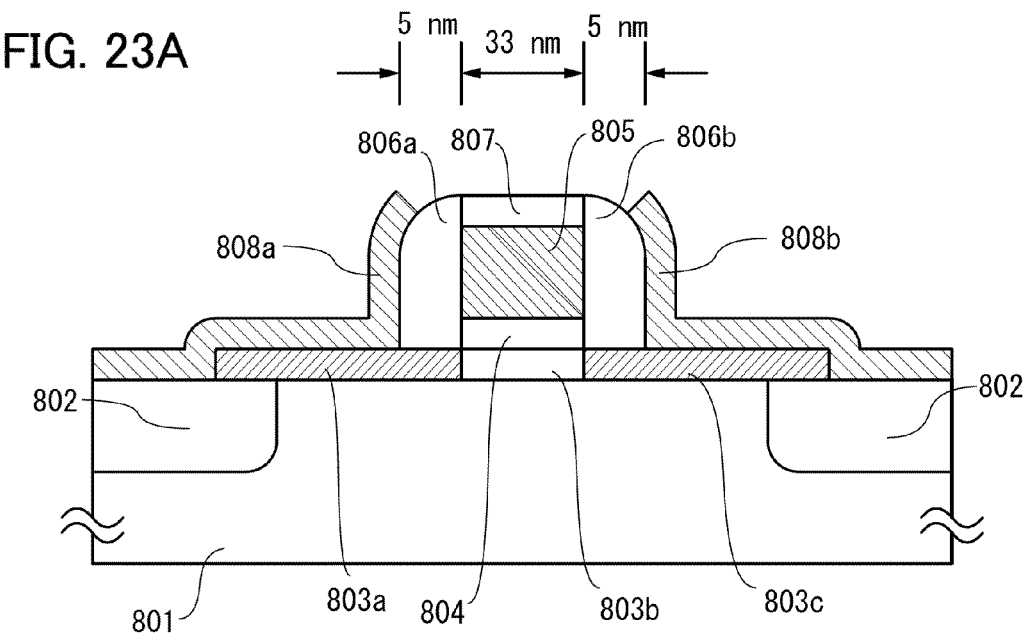
FIGS. 23A and 23B are views each illustrating a cross-sectional structure of a transistor used in calculation.
Figure 23B:
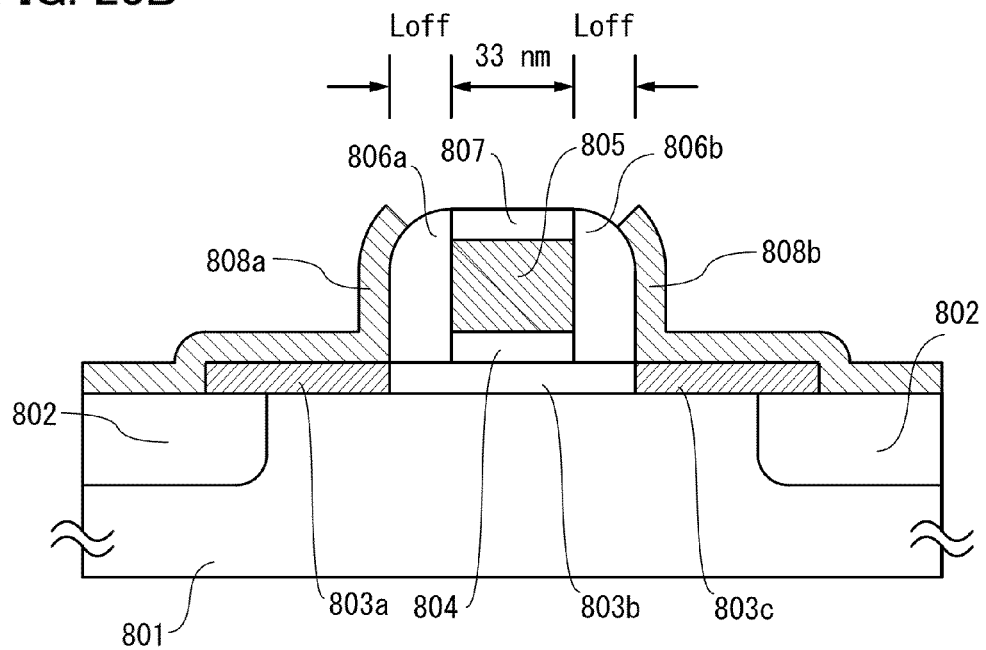

FIGS. 22A to 22C show the gate voltage dependence of the drain current $I_d$ (a solid line) and the mobility μ (a dotted line) of the transistor having the structure in FIG. 23B and an offset length $L_{off}$ of 15 nm. The drain current $I_d$ is obtained by calculation under the assumption that the drain voltage is +1 V and the mobility μ is obtained by calculation under the assumption that the drain voltage is +0.1 V. FIG. 22A shows the gate voltage dependence of the transistor in the case where the thickness of the gate insulating layer is 15 nm, FIG. 22B shows that of the transistor in the case where the thickness of the gate insulating layer is 10 nm, and FIG. 22C shows that of the transistor in the case where the thickness of the gate insulating layer is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 20A to 20C, approximately 60 cm$^2$/Vs in FIGS. 21A to 21C, and approximately 40 cm$^2$/Vs in FIGS. 22A to 22C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

This embodiment can be combined with any of the other embodiments as appropriate.

Embodiment 8

A transistor which includes an oxide semiconductor including In, Sn, and Zn as main components in a channel formation region and which can be used for a signal processing circuit according to one mode of the present invention can have favorable characteristics by depositing the oxide semiconductor while heating a substrate or by performing heat treatment after an oxide semiconductor film is formed. Note that a main component refers to an element included in a composition at 5 atomic % or more.

By intentionally heating the substrate after deposition of the oxide semiconductor film including In, Sn, and Zn as main components, the field-effect mobility of the transistor can be improved. Further, the threshold voltage of the transistor can be positively shifted to make the transistor normally off.

Figure 24A:
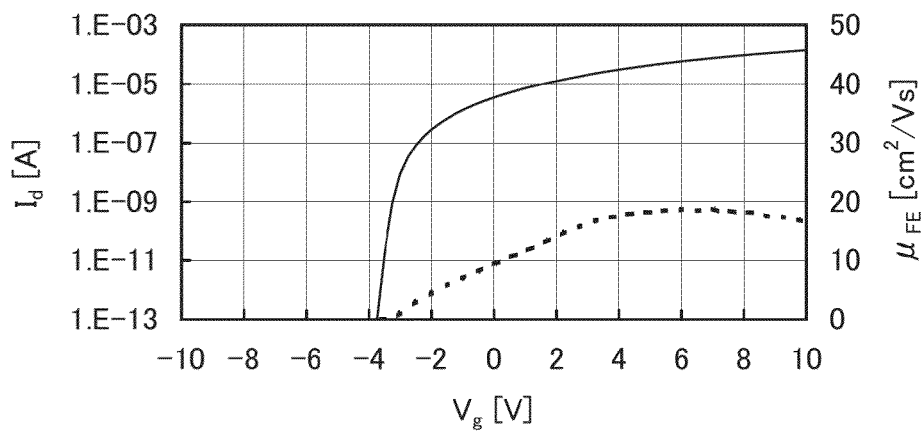
FIGS. 24A to 24C are graphs each showing characteristics of a transistor including an oxide semiconductor film.
Figure 24B:
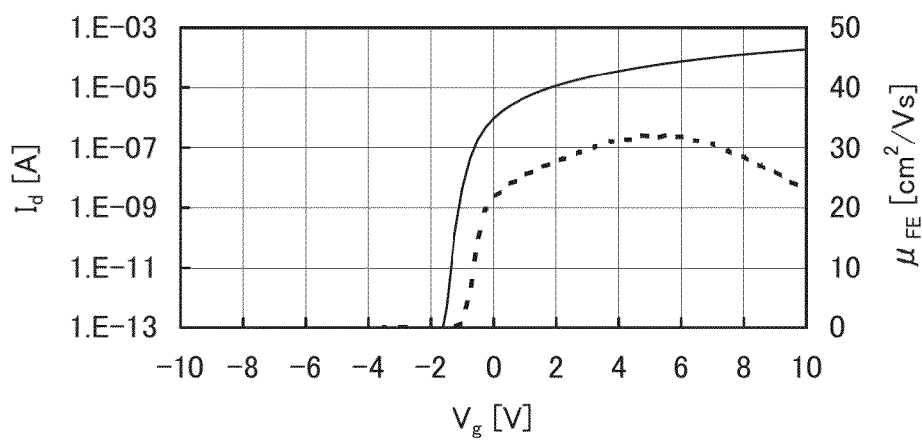
Figure 24C:
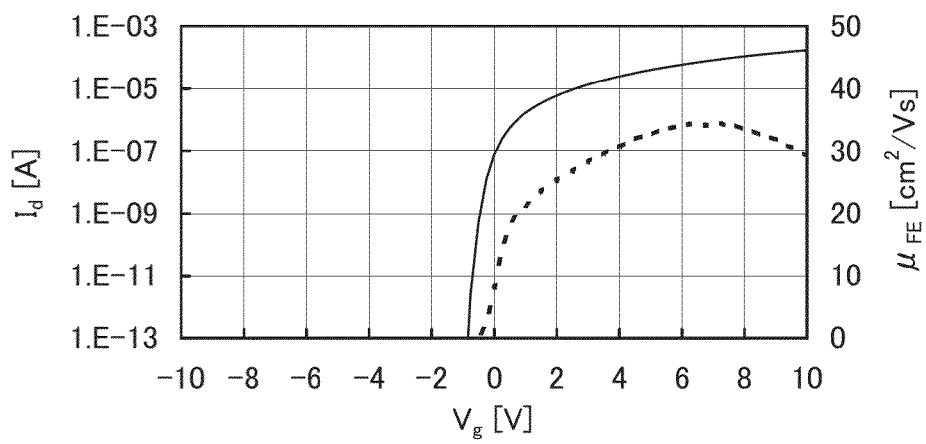

For example, FIGS. 24A to 24C each show characteristics of a transistor that includes an oxide semiconductor film including In, Sn, and Zn as main components and having a channel length L of 3 μm and a channel width W of 10 μm, and a gate insulating film with a thickness of 100 nm. Note that $V_d$ was set to 10 V.

FIG. 24A shows characteristics of a transistor whose oxide semiconductor film including In, Sn, and Zn as main components was formed by sputtering without heating a substrate intentionally. The field-effect mobility of the transistor is 18.8 cm$^2$/Vs. On the other hand, when the oxide semiconductor film including In, Sn, and Zn as main components is formed while heating the substrate intentionally, the field-effect mobility can be improved. FIG. 24B shows characteristics of a transistor whose oxide semiconductor film including In, Sn, and Zn as main components was formed while heating a substrate at 200° C. The field-effect mobility of the transistor is 32.2 cm$^2$/Vs.

The field-effect mobility can be further improved by performing heat treatment after the oxide semiconductor film including In, Sn, and Zn as main components is formed. FIG. 24C shows characteristics of a transistor whose oxide semiconductor film including In, Sn, and Zn as main components was deposited by sputtering at 200° C. and then subjected to heat treatment at 650° C. The field-effect mobility of the transistor is 34.5 cm$^2$/Vs.

The intentional heating of the substrate can reduce moisture taken into the oxide semiconductor film during the deposition by sputtering. Further, the heat treatment after deposition enables hydrogen, a hydroxyl group, or moisture to be released and removed from the oxide semiconductor film. In this manner, the field-effect mobility can be improved. It is presumed that such an improvement in field-effect mobility is achieved not only by removal of impurities by dehydration or dehydrogenation but also by a reduction in interatomic distance due to an increase in density. In addition, the oxide semiconductor can be crystallized by being purified by removal of impurities from the oxide semiconductor. In the case of using such a purified non-single-crystal oxide semiconductor, ideally, a field-effect mobility exceeding 100 cm$^2$/Vs is expected to be realized.

The oxide semiconductor including In, Sn, and Zn as main components may be crystallized in the following manner: oxygen ions are implanted into the oxide semiconductor; hydrogen, a hydroxyl group, or moisture included in the oxide semiconductor is released by heat treatment; and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during deposition and/or the heat treatment after the deposition contributes not only to improving field-effect mobility but also to making the transistor normally off. In a transistor in which an oxide semiconductor film that includes In, Sn, and Zn as main components and that is formed without heating a substrate intentionally is used as a channel formation region, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 24A and 24B.

Note that the threshold voltage can also be controlled by changing the ratio of In, Sn, and Zn; when the composition ratio of In, Sn, and Zn is 2:1:3, a normally-off transistor can be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is higher than or equal to 150° C., preferably higher than or equal to 200° C., further preferably higher than or equal to 400° C. When deposition or heat treatment is performed at a high temperature, the transistor can be normally off.

By intentionally heating the substrate during deposition and/or by performing heat treatment after the deposition, the stability against a gate-bias stress can be increased. For example, when a gate bias is applied with an intensity of 2

MV/cm at 150° C. for one hour, drift of the threshold voltage can be less than ±1.5 V, preferably less than ±1.0 V.

A BT test was performed on the following two transistors: Sample 1 on which heat treatment was not performed after deposition of an oxide semiconductor film; and Sample 2 on which heat treatment at 650° C. was performed after deposition of an oxide semiconductor film.

First, $V_g$–$I_d$ characteristics of the transistors were measured at a substrate temperature of 25° C. and $V_{ds}$ of 10 V. Then, the substrate temperature was set to 150° C. and $V_{ds}$ was set to 0.1 V. After that, $V_g$ of 20 V was applied so that the intensity of an electric field applied to the gate insulating film was 2 MV/cm, and the condition was kept for one hour. Next, $V_g$ was set to 0 V. Then, $V_g$–$I_d$ characteristics of the transistors were measured at a substrate temperature of 25° C. and $V_{ds}$ of 10 V. This process is called a positive BT test.

In a similar manner, first, $V_g$–$I_d$ characteristics of the transistors were measured at a substrate temperature of 25° C. and $V_{ds}$ of 10 V. Then, the substrate temperature was set to 150° C. and $V_{ds}$ was set to 0.1 V. After that, $V_g$ of –20 V was applied so that the intensity of an electric field applied to the gate insulating film was –2 MV/cm, and the condition was kept for one hour. Next, $V_g$ was set to 0 V. Then, $V_g$–$I_d$ characteristics of the transistors were measured at a substrate temperature of 25° C. and $V_{ds}$ of 10 V. This process is called a negative BT test.

Figure 25A:
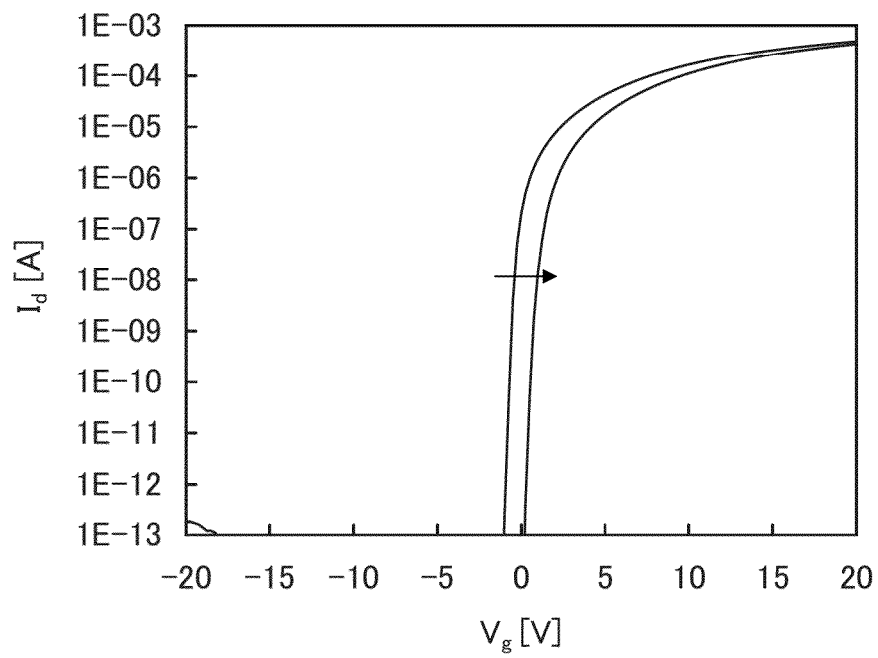
FIGS. 25A and 25B are graphs each showing $V_g$-$I_d$ characteristics after a BT test of a transistor of Sample 1.
Figure 25B:
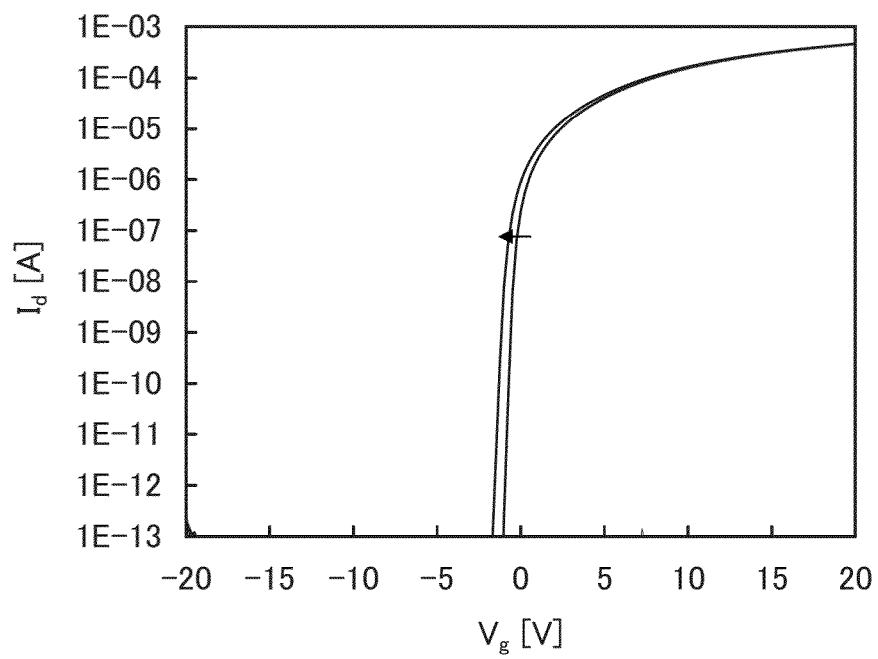
Figure 26A:
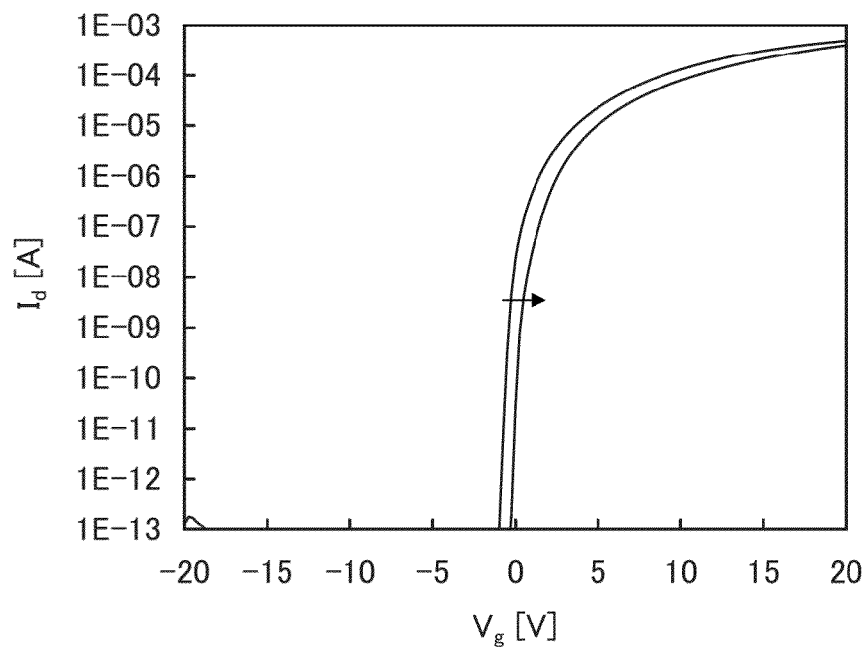
FIGS. 26A and 26B are graphs each showing $V_g$-$I_d$ characteristics after a BT test of a transistor of Sample 2.
Figure 26B:
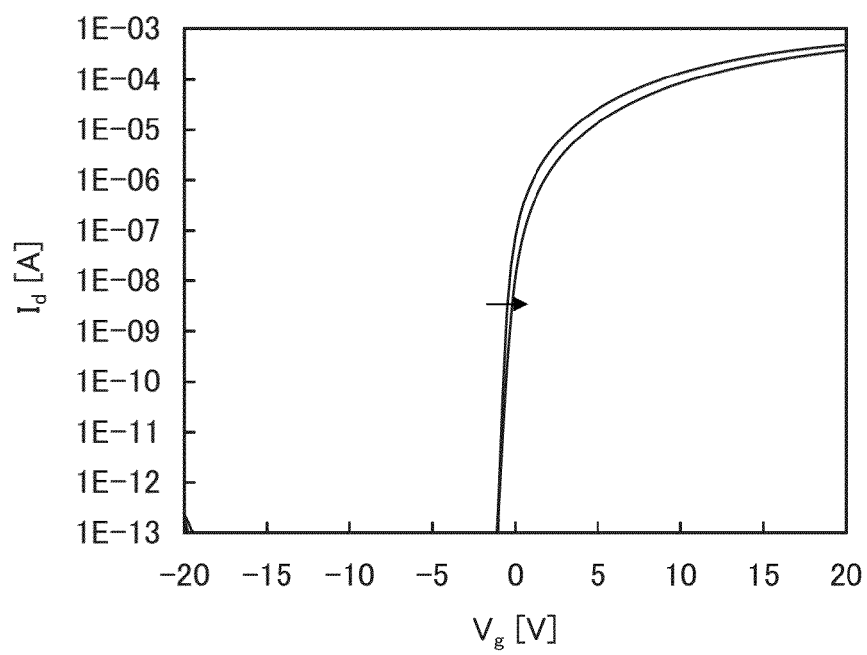

FIGS. 25A and 25B show results of the positive BT test and the negative BT test, respectively, of Sample 1. FIGS. 26A and 26B show results of the positive BT test and the negative BT test, respectively, of Sample 2.

The amount of shift in the threshold voltage of Sample 1 due to the positive BT test and that due to the negative BT test were 1.80 V and –0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the advantageous effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancy is easily caused in the oxide semiconductor or at an interface between the oxide semiconductor and a film in contact with the oxide semiconductor; when excess oxygen is included in the oxide semiconductor by the heat treatment, oxygen vacancy caused later can be compensated for with excess oxygen. The excess oxygen is mainly oxygen existing between lattices. When the concentration of oxygen is set in the range of $1\times10^{16}/cm^3$ to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film that is formed by sputtering, using a target having a composition ratio of In:Sn:Zn=1:1:1, without heating a substrate intentionally is analyzed by X-ray diffraction (XRD), a halo pattern is observed. This deposited oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for forming Sample A and Sample B will be described below.

An In—Sn—Zn-based oxide film with a thickness of 100 nm was deposited over a quartz substrate that had been subjected to dehydrogenation treatment.

The In—Sn—Zn-based oxide film was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature during deposition was set at 200° C. A sample formed in this manner was used as Sample A.

Next, a sample formed by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample formed in this manner was used as Sample B.

Figure 27:
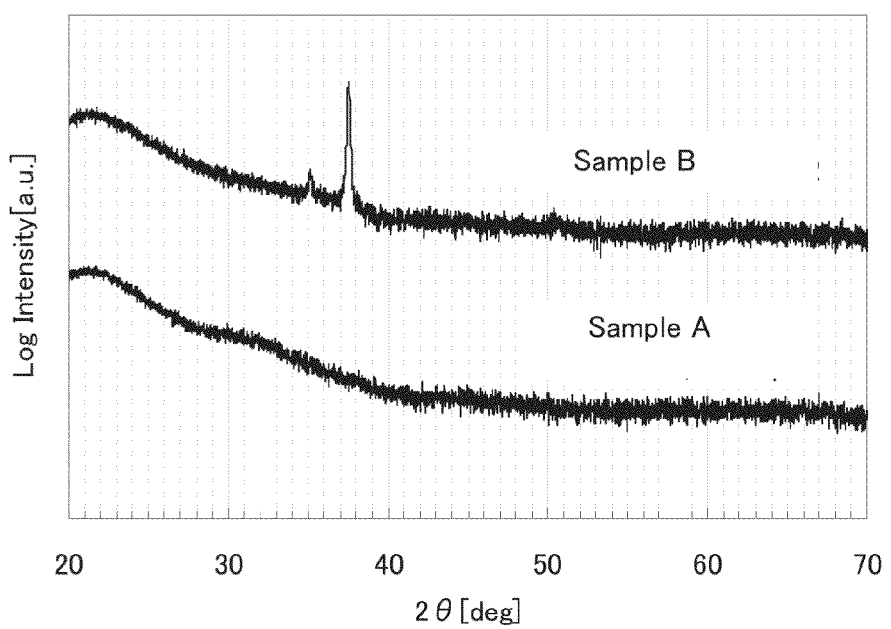
FIG. 27 shows XRD spectra of Sample A and Sample B.

FIG. 27 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an advantageous effect of preventing hydrogen and a hydroxyl group, which are unfavorable impurities for an oxide semiconductor, from being included in the film or an advantageous effect of removing hydrogen and a hydroxyl group from the film. That is, an oxide semiconductor can be purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 28:
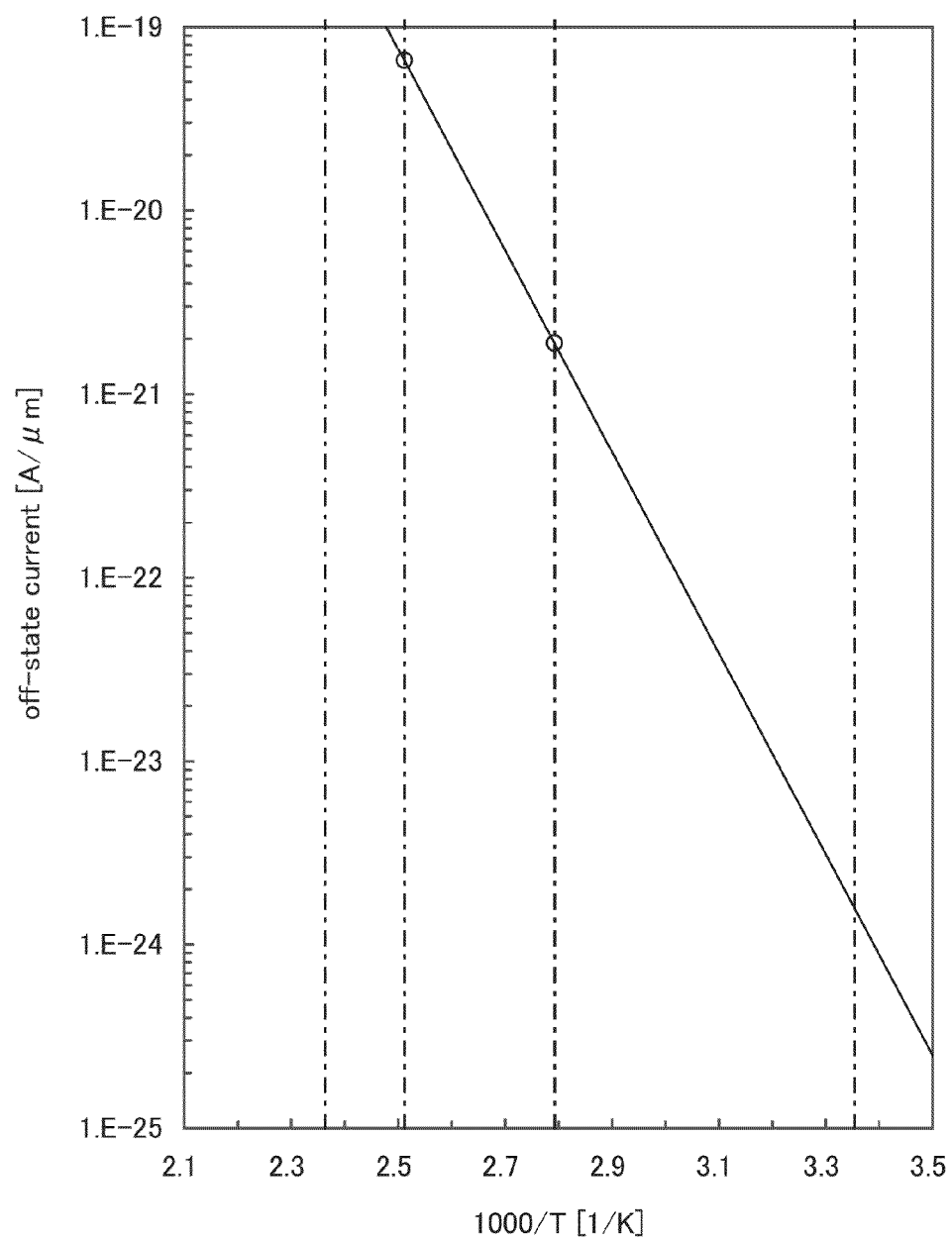
FIG. 28 is a graph showing a relation between off-state current and substrate temperature in measurement of a transistor.

FIG. 28 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 28, the off-state current can be lower than or equal to 1 aA/μm ($1\times10^{-18}$ A/μm), lower than or equal to 100 zA/μm ($1\times10^{-19}$ A/μm), and lower than or equal to 1 zA/μm ($1\times10^{-21}$ A/μm) when the substrate temperature is 125° C., 85° C., and room temperature (27° C.), respectively. Preferably, the off-state current can be lower than or equal to 0.1 aA/μm ($1\times10^{-19}$ A/μm), lower than or equal to 10 zA/μm ($1\times10^{-20}$ A/μm), and lower than or equal to 0.1 zA/μm ($1\times10^{-22}$ A/μm) at 125° C., 85° C., and room temperature, respectively.

Note that in order to prevent hydrogen and moisture from being included in the oxide semiconductor film during deposition of the film, it is preferable to increase the purity of a sputtering gas by sufficiently suppressing leakage from the outside of a deposition chamber and degasification through an inner wall of the deposition chamber. For example, a gas with a dew point of lower than or equal to −70° C. is preferably used as the sputtering gas in order to prevent moisture from being included in the film. In addition, it is preferable to use a target that is highly purified so as not to include impurities such as hydrogen and moisture. Although it is possible to remove moisture from a film of an oxide semiconductor including In, Sn, and Zn as main components by heat treatment, a film that does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of the transistor of the sample on which heat treatment at 650° C. was performed after deposition of the oxide semiconductor film was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 29:
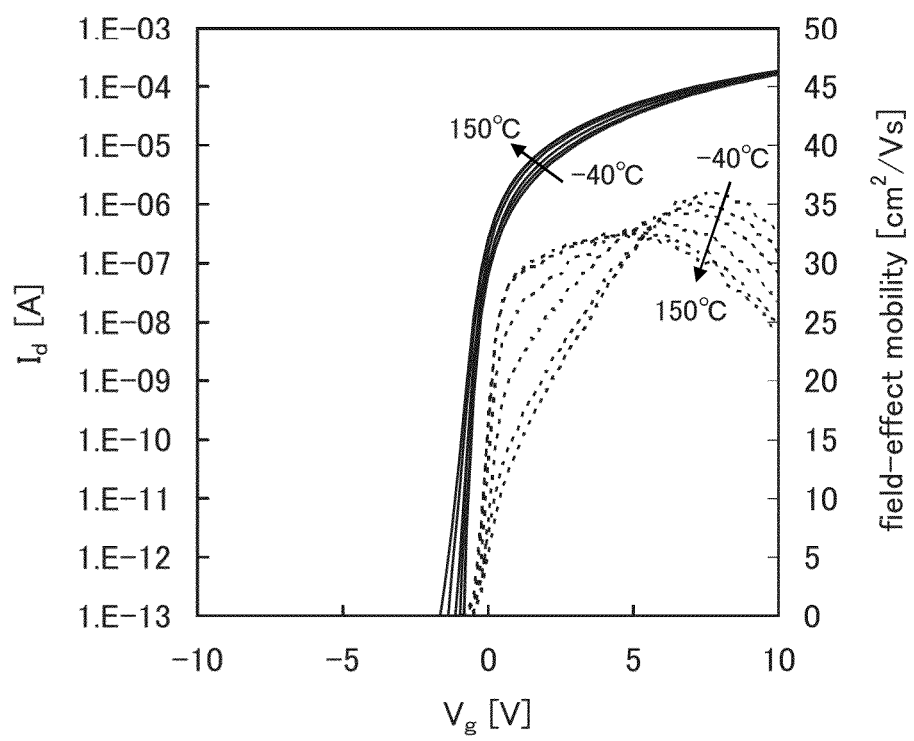
FIG. 29 is a graph showing $V_g$ dependence of $I_d$ and field-effect mobility.
Figure 30A:
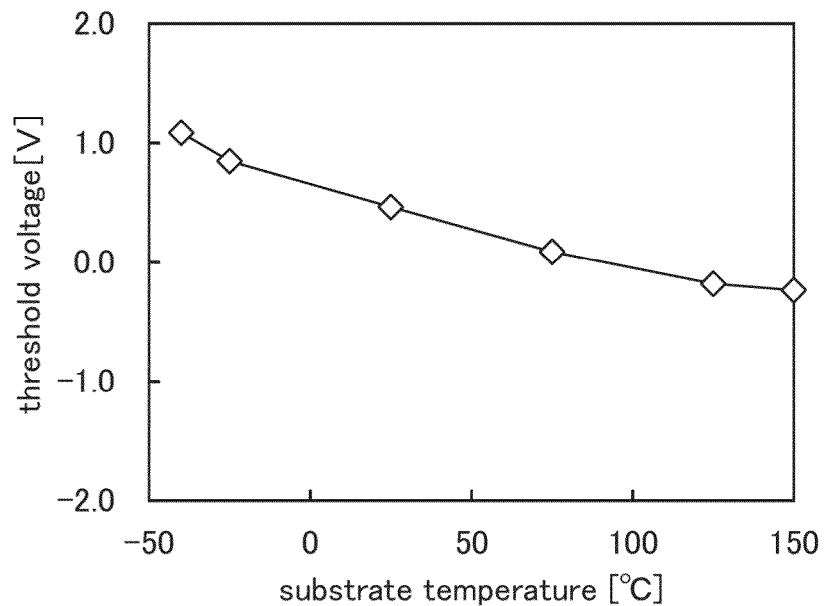
FIG. 30A is a graph showing a relation between substrate temperature and threshold voltage.

FIG. 29 shows the $V_g$ dependence of $I_d$ (a solid line) and field-effect mobility (a dotted line). FIG. 30A shows a relation between the substrate temperature and the threshold voltage, and FIG. 30B shows a relation between the substrate temperature and the field-effect mobility.

From FIG. 30A, it is found that the threshold voltage gets lower as the substrate temperature increases. Note that the threshold voltage is decreased from 1.09 V to −0.23 V in the range from −40° C. to 150° C.

Figure 30B:
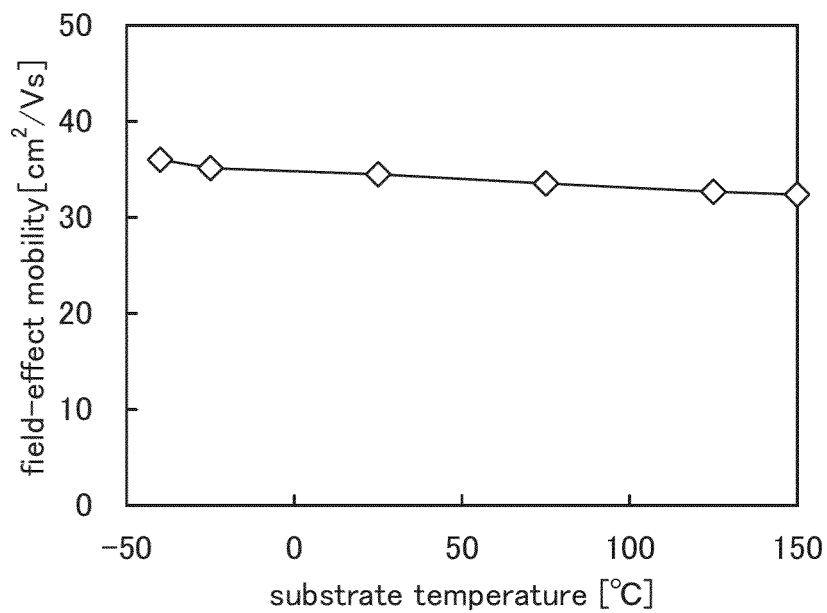
FIG. 30B is a graph showing a relation between substrate temperature and field-effect mobility.

From FIG. 30B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used for a channel formation region, a field-effect mobility higher than or equal to 30 cm$^2$/Vs, preferably higher than or equal to 40 cm$^2$/Vs, further preferably higher than or equal to 60 cm$^2$/Vs can be obtained with the off-state current maintained at 1 aA/μm or lower, which can achieve on-state current needed for an LSI. For example, in an FET where L/W is 33 nm/40 nm, an on-state current higher than or equal to 12 μA can flow when the gate voltage is 2.7 V and the drain voltage is 1.0 V. In addition, sufficient electric characteristics can be ensured in a temperature range needed for the operation of a transistor. With such characteristics, an integrated circuit having a novel function can be realized without decreasing the operation speed even when a transistor including an oxide semiconductor is provided in an integrated circuit formed using a Si semiconductor.

This embodiment can be combined with any of the other embodiments as appropriate.

Embodiment 9

In this embodiment, a transistor including an oxide semiconductor film with a structure different from the structures in the embodiments will be described. An oxide semiconductor included in the oxide semiconductor film may be formed using an oxide semiconductor including In, Sn, and Zn (In—Sn—Zn-based oxide semiconductor) or another oxide semiconductor described in any of the other embodiments.

Figure 31A:
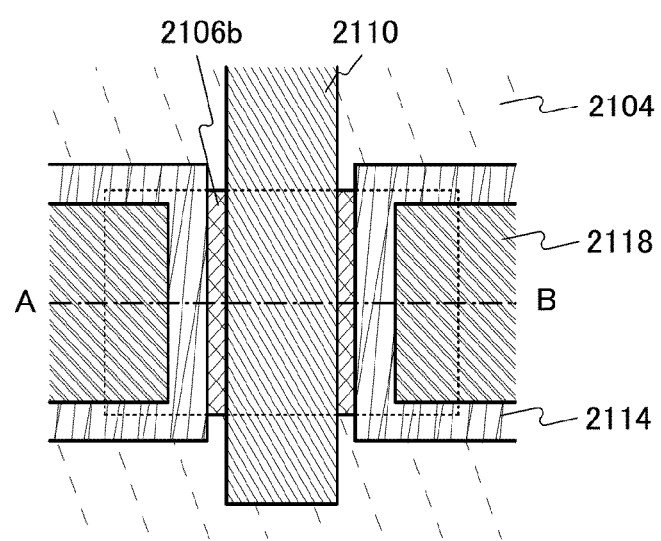
FIGS. 31A and 31B are a top view and a cross-sectional view illustrating a structure example of a transistor.
Figure 31B:
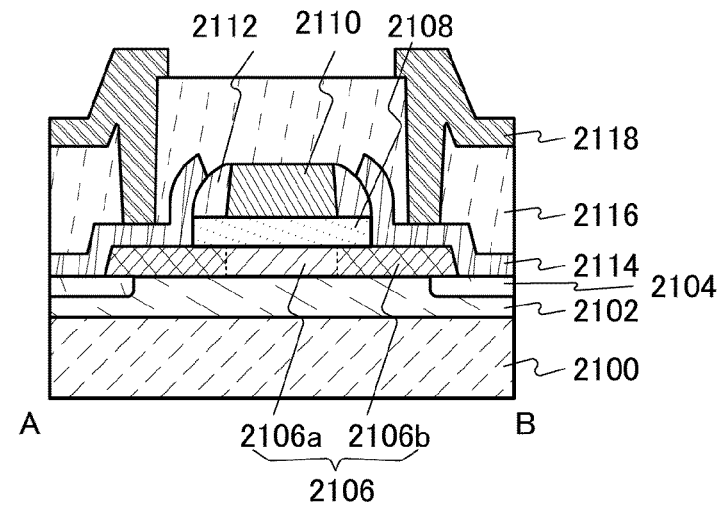

FIGS. 31A and 31B are a top view and a cross-sectional view of a coplanar transistor having a top-gate top-contact structure. FIG. 31A is the top view of the transistor. FIG. 31B illustrates a cross section A-B along the dashed-dotted line A-B in FIG. 31A.

The transistor illustrated in FIG. 31B includes a substrate 2100; a base insulating film 2102 provided over the substrate 2100; a protective insulating film 2104 provided in the periphery of the base insulating film 2102; an oxide semiconductor film 2106 which is provided over the base insulating film 2102 and the protective insulating film 2104 and includes a high-resistance region 2106a and low-resistance regions 2106b; a gate insulating film 2108 provided over the oxide semiconductor film 2106; a gate electrode 2110 provided to overlap with the oxide semiconductor film 2106 with the gate insulating film 2108 provided therebetween; a sidewall insulating film 2112 provided in contact with a side surface of the gate electrode 2110; a pair of electrodes 2114 provided in contact with at least the low-resistance regions 2106b; an interlayer insulating film 2116 provided to cover at least the oxide semiconductor film 2106, the gate electrode 2110, and the pair of electrodes 2114; and a wiring 2118 provided to be connected to at least one of the pair of electrodes 2114 through an opening formed in the interlayer insulating film 2116.

Although not illustrated, a protective film may be provided to cover the interlayer insulating film 2116 and the wiring 2118. With the protective film, a minute amount of leakage current generated by surface conduction of the interlayer insulating film 2116 can be reduced, so that the off-state current of the transistor can be reduced.

This embodiment can be combined with any of the other embodiments as appropriate.

Embodiment 10

In this embodiment, a transistor including an oxide semiconductor film with a structure different from the structures in the embodiments will be described. Although the case in which an oxide semiconductor including In, Sn, and Zn (an In—Sn—Zn-based oxide semiconductor) is used as an oxide semiconductor included in the oxide semiconductor film will be described in this embodiment, another oxide semiconductor described in any of the other embodiments can also be used.

Figure 32A:
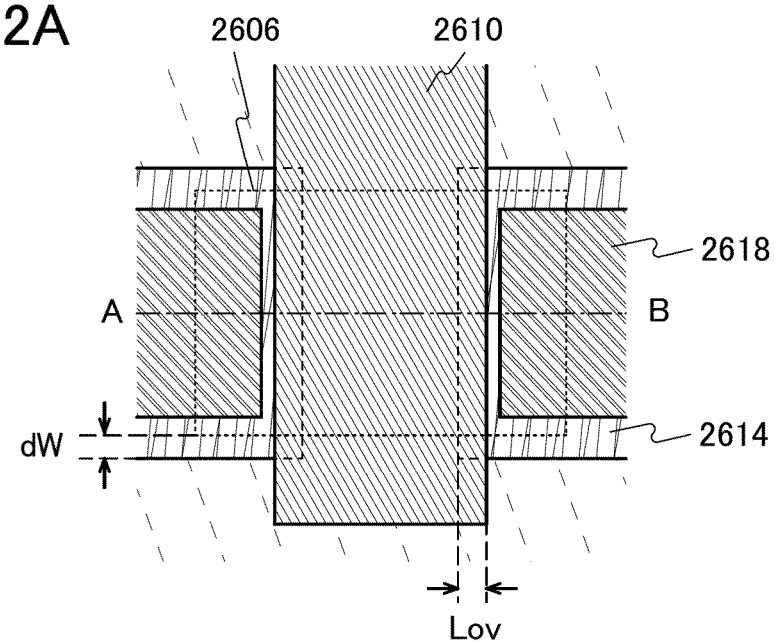
FIGS. 32A and 32B are a top view and a cross-sectional view illustrating a structure example of a transistor.
Figure 32B:
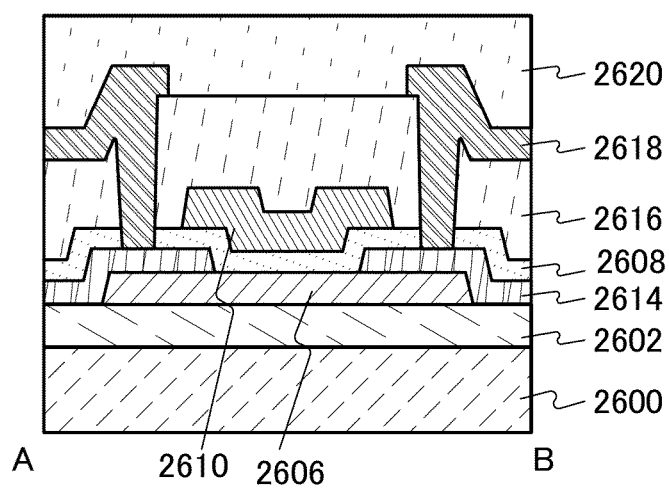

FIGS. 32A and 32B are a top view and a cross-sectional view illustrating a structure of a transistor. FIG. 32A is the top view of the transistor. FIG. 32B is a cross-sectional view taken along the dashed-dotted line A-B in FIG. 32A.

The transistor illustrated in FIG. 32B includes a substrate 2600; a base insulating film 2602 provided over the substrate 2600; an oxide semiconductor film 2606 provided over the base insulating film 2602; a pair of electrodes 2614 in contact with the oxide semiconductor film 2606; a gate insulating film 2608 provided over the oxide semiconductor film 2606 and the pair of electrodes 2614; a gate electrode 2610 provided to overlap with the oxide semiconductor film 2606 with the gate insulating film 2608 provided therebetween; an interlayer insulating film 2616 provided to cover the gate insulating film 2608 and the gate electrode 2610; wirings 2618 connected to the pair of electrodes 2614 through openings formed in the interlayer insulating film 2616; and a protective film 2620 provided to cover the interlayer insulating film 2616 and the wirings 2618.

As the substrate 2600, a glass substrate was used. As the base insulating film 2602, a silicon oxide film was used. As the oxide semiconductor film 2606, an In—Sn—Zn-based film was used. As the pair of electrodes 2614, a tungsten film was used. As the gate insulating film 2608, a silicon oxide film was used. The gate electrode 2610 had a layered structure of a tantalum nitride film and a tungsten film. The interlayer insulating film 2616 had a layered structure of a silicon oxynitride film and a polyimide film. The wirings 2618 had a layered structure in which a titanium film, an aluminum film, and a titanium film were formed in this order. As the protective film 2620, a polyimide film was used.

Note that in the transistor having the structure illustrated in FIG. 32A, the width of a portion where the gate electrode 2610 overlaps with one of the pair of electrodes 2614 is referred to as Lov. Similarly, the width of a portion of the pair of electrodes 2614, which does not overlap with the oxide semiconductor film 2606, is referred to as dW.

Embodiment 11

In general, a magnetic tunnel junction element (MTJ element) is known as a nonvolatile random access memory. The MTJ element is an element for storing information in a low-resistance state when the spin directions in films which are formed with an insulating film provided therebetween are parallel and storing information in a high-resistance state when the spin directions are not parallel. On the other hand, the principle of the nonvolatile memory circuit described in the above embodiment that utilizes the transistor having a channel in an oxide semiconductor layer is completely different from that of the MTJ element. Table 1 shows a comparison between the MTJ element (in the table, indicated by "spintronics (MTJ element)") and the nonvolatile memory circuit including an oxide semiconductor that is described in the above embodiment (in the table indicated by "Oxide semiconductor/Si").

TABLE 1

| | Spintronics (MTJ element) | Oxide semiconductor/Si |
|---|---|---|
| Heat resistance | Curie temperature | Process temperature around 500° C. (Reliability at 150° C.) |
| Driving method | Current driving | Voltage driving |
| Writing principle | Changing spin direction of magnetic body | On/off of FET |
| Si LSI | Suitable for bipolar LSI (MOS device is preferable for high integration because bipolar device is unsuitable for high integration. Note that W gets larger.) | Suitable for MOS LSI |
| Overhead | Large (Because of high Joule heat) | Smaller by 2 to 3 or more orders of magnitude than the MTJ element (Because of charging and discharging of parasitic capacitance) |
| Nonvolatility | Utilizing spin | Utilizing low off-state current |
| Read Number | Without limitation | Without limitation |
| 3D conversion | Difficult (at most two layers) | Easy (the number of layers is limitless) |

TABLE 1-continued

| | Spintronics (MTJ element) | Oxide semiconductor/Si |
|---|---|---|
| Integration degree ($F^2$) | $4 F^2$ to $15 F^2$ | Depends on the number of layers stacked in 3D conversion (it is necessary to ensure heat resistance in process of forming upper OS FET) |
| Material | Magnetic rare-earth element | Oxide semiconductor material |
| Cost per bit | High | Low (Might be slightly high depending on oxide semiconductor material (such as In) |
| Resistance to magnetic field | Low | High |

The MTJ element has a disadvantage in that a magnetic property is lost when the temperature is higher than or equal to the Curie temperature because a magnetic material is used. In addition, the MTJ element is compatible with a silicon bipolar device because current driving is employed; however, the bipolar device is unsuitable for high integration. Further, there is a problem in that power consumption is increased by an increase of memory capacity, though the writing current of the MTJ element is extremely low.

In principal, the MTJ element has low resistance to a magnetic field, and the spin direction is easily changed when the MTJ element is exposed to a high magnetic field. In addition, it is necessary to control magnetic fluctuation which is caused by nanoscaling of a magnetic body used for the MTJ element.

Further, a rare-earth element is used for the MTJ element; therefore, incorporation of a process of the MTJ element into a process of a silicon semiconductor which avoids metal contamination should be paid high attention to. The material cost per bit of the MTJ element is expensive.

On the other hand, the transistor having a channel in an oxide semiconductor layer included in the nonvolatile memory circuit described in above embodiment is similar to a silicon MOSFET in the element structure and the operation principal except that the region where the channel is formed includes a metal oxide. In addition, the transistor having the channel in the oxide semiconductor layer is not affected by a magnetic field and does not cause soft error. This shows that the transistor is highly compatible with a silicon integrated circuit.

Example 1

With use of a signal processing circuit according to one mode of the present invention, an electronic device with low power consumption can be provided. In particular, in the case of a portable electronic device which has difficulty in continuously receiving power, a signal processing circuit with low power consumption according to one mode of the present invention is added as a component of the device, an advantage in increasing the continuous operation time can be obtained.

The signal processing circuit according to one mode of the present invention can be used for display devices, personal computers, or image reproducing devices provided with recording media (typically, devices which reproduce the content of recording media such as digital versatile discs (DVDs) and have displays for displaying the reproduced images). Other than the above, as an electronic device which can employ the signal processing circuit according to one mode of the present invention, mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case where the signal processing circuit according to one mode of the present invention is applied to portable electronic devices such as a mobile phone, a smartphone, and an e-book reader is described.

Figure 13:
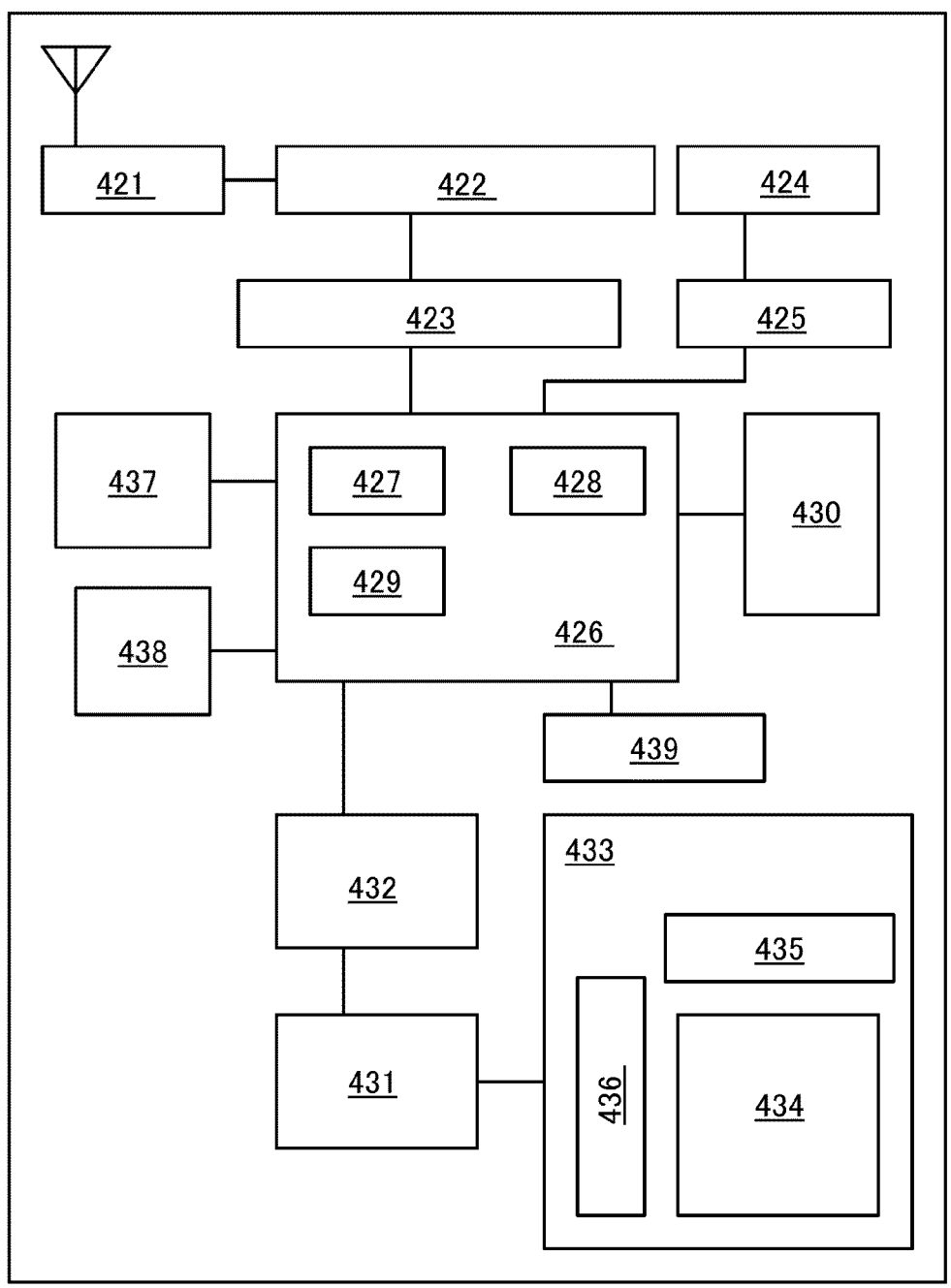
FIG. 13 is a block diagram of a portable electronic device.

FIG. 13 is a block diagram of a portable electronic device. The portable electronic device illustrated in FIG. 13 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. The signal processing circuit described in the above embodiment is employed for, for example, the CPU 427, whereby power consumption can be reduced.

Figure 14:
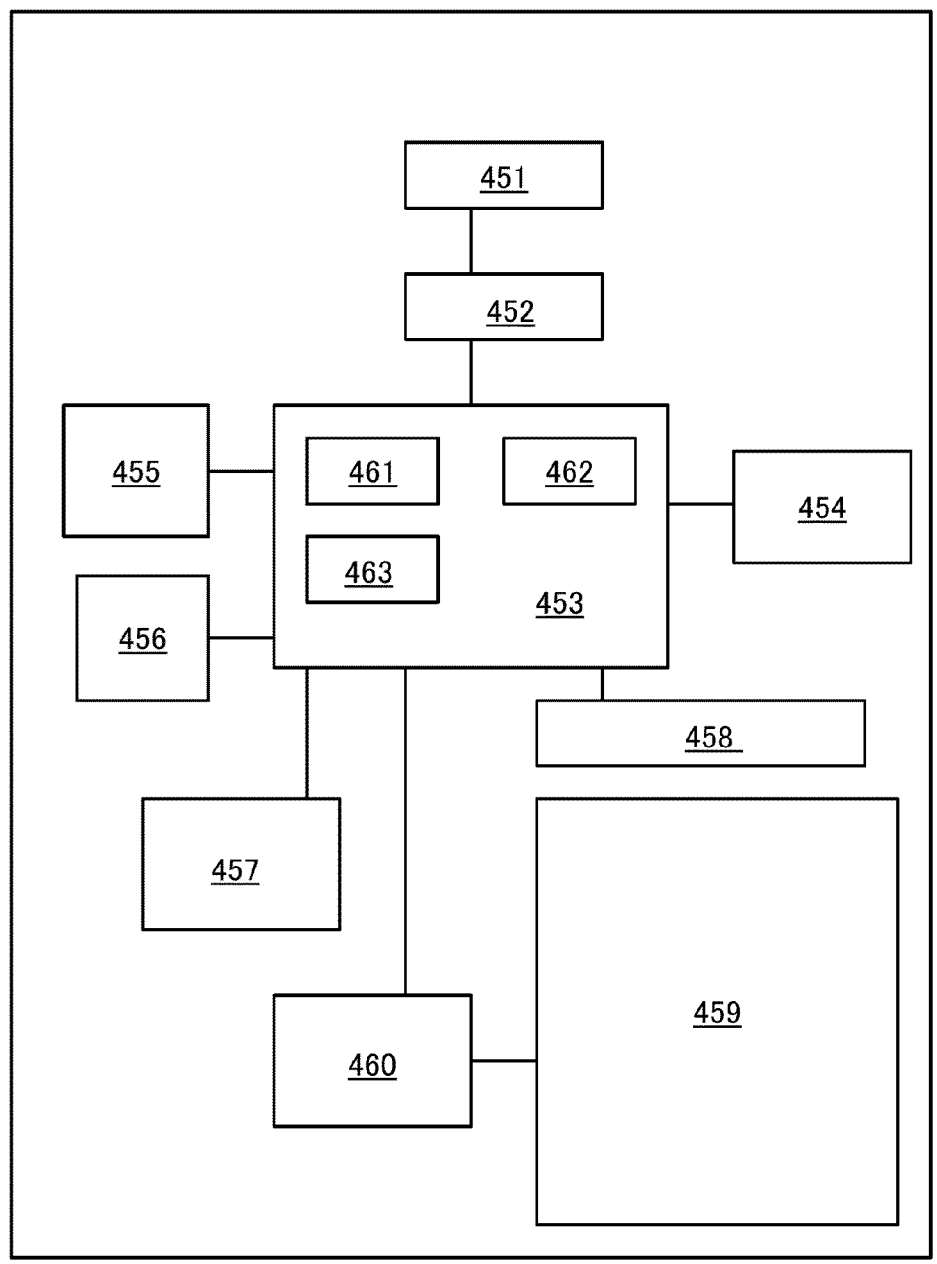
FIG. 14 is a block diagram of an e-book reader.

FIG. 14 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface 463. The signal processing circuit described in the above embodiment is employed for, for example, the CPU 461, whereby power consumption can be reduced.

This example can be combined with any of the above embodiments as appropriate.

EXPLANATION OF REFERENCE

100: memory circuit, 101: transistor, 102: capacitor, 103: transistor, 200: memory circuit, 201: arithmetic circuit, 202: arithmetic circuit, 203: switch, 303: the other of pair of electrodes, 400: memory cell array, 401: sense amplifier, 402: precharge circuit, 403: column decoder, 404: row decoder, 421: RF circuit, 422: analog baseband circuit, 423: digital baseband circuit, 424: battery, 425: power supply circuit, 426: application processor, 427: CPU, 428: DSP, 429: interface, 430: flash memory, 431: display controller, 432: memory circuit, 433: display, 434: display portion, 435: source driver, 436: gate driver, 437: audio circuit, 438: keyboard, 439: touch sensor, 443: latch circuit, 444: inverter, 445: inverter, 446: switch, 451: battery, 452: power supply circuit, 453: microprocessor, 454: flash memory, 455: audio circuit, 456: keyboard, 457: memory circuit, 458: touch panel, 459: display, 460: display controller, 461: CPU, 462: DSP, 463: interface, 700: substrate, 701: insulating film, 702: semiconductor film, 703: gate insulating film, 704: semiconductor layer, 707: gate electrode, 709: impurity region, 710: channel formation region, 712: insulating film, 713: insulating film, 716: oxide semiconductor layer, 719: conductive layer, 720: conductive layer, 721: gate insulating film, 722: insulating film, 724: insulating film, 726: wiring, 727: insulating film, 801: base insulating layer, 802: embedded insulator, 803*a*: semiconductor region, 803*b*: semiconductor region, 803*c*: semiconductor region, the intrinsic provided therebetween, 804: gate insulating film, 805: gate, 806*a*: sidewall insulator, 806*b*: sidewall insulator, 807: insulator, 808*a*: source, 808*b*: drain, 908: high-concentration region, 918: high-concentration region, 919: channel formation region, 928: high-concentration region, 929: low-concentration region, 930: sidewall, 931: channel formation region, 948: high-concentration region, 949: low-concentration region, 950: sidewall, 951: channel formation region, 101*a*: transistor, 101*b*: transistor, 101*c*: transistor, 101*d*: transistor, 102*a*: capacitor, 102*b*: capacitor, 102*c*: capacitor, 102*d*: capacitor, 103*a*: transistor, 103*b*: transistor, 1101: circuit group, 1103: circuit group, 1111: circuit group, 2000: signal processing circuit, 2001: decoder, 2002: control circuit, 2003: ALU, 2004: register, 2005: memory, 2006: power supply circuit, 2100: substrate, 2102: base insulating film, 2104: protective insulating film, 2106: oxide semiconductor film, 2106*a*: high-resistance region, 2106*b*: low-resistance region, 2108: gate insulating film, 2110: gate electrode, 2112: sidewall insulating film, 2114: electrode, 2116: interlayer insulating film, 2118: wiring, 2600: substrate, 2602: base insulating film, 2606: oxide semiconductor film, 2608: gate insulating film, 2610: gate electrode, 2614: electrode, 2616: interlayer insulating film, 2618: wiring, 2620: protective film, 301*a*: one of pair of electrodes, 301*b*: one of pair of electrodes, 302*a*: dielectric layer, 7301: conductive layer, 7302: insulating film, 7303: conductive film, and 1101*b*: part of circuit group.

This application is based on Japanese Patent Application serial No. 2011-065210 filed with the Japan Patent Office on Mar. 24, 2011 and Japanese Patent Application serial No. 2011-108886 filed with the Japan Patent Office on May 14, 2011, the entire contents of which are hereby incorporated by reference.

The invention claimed is:

1. A signal processing circuit comprising:
an arithmetic portion;
a memory; and
a control portion for controlling the arithmetic portion and the memory,
wherein the control portion includes a set of a first volatile memory circuit and a first nonvolatile memory circuit for storing data held in the first volatile memory circuit,
wherein the memory includes a plurality of second nonvolatile memory circuits arranged in matrix,
wherein the first nonvolatile memory circuit and the plurality of second nonvolatile memory circuits each include a transistor comprising a channel formation region in an oxide semiconductor layer, and
wherein the first nonvolatile memory circuit and the plurality of second nonvolatile memory circuits each include a capacitor in which one of a pair of electrodes of the capacitor is electrically connected to a node which is set in a floating state when the transistor is turned off.

2. The signal processing circuit according to claim 1, wherein the other of the pair of electrodes of the capacitor included in the first nonvolatile memory circuit and the other of the pair of electrodes of the capacitor included in each of the plurality of second nonvolatile memory circuits are provided in common without being separated from each other and are provided so as to cover a transistor included in the arithmetic portion, the transistor included in the memory, and the transistor included in the control portion.

3. The signal processing circuit according to claim 1, wherein the oxide semiconductor layer includes a crystal region in an amorphous phase.

4. The signal processing circuit according to claim 1, wherein the oxide semiconductor layer comprises at least one of indium and gallium.

5. An electronic device including the signal processing circuit according to claim 1.

6. A signal processing circuit comprising:
an arithmetic portion;
a memory; and
a control portion for controlling the arithmetic portion and the memory,
wherein the control portion includes a set of a first volatile memory circuit and a first nonvolatile memory circuit for storing data held in the first volatile memory circuit,
wherein the memory includes a plurality of second nonvolatile memory circuits arranged in matrix,
wherein the arithmetic portion includes a set of a second volatile memory circuit and a third nonvolatile memory circuit for storing data held in the second volatile memory circuit,
wherein the first nonvolatile memory circuit, the plurality of second nonvolatile memory circuits, and the third nonvolatile memory circuit each include a transistor comprising a channel formation region in an oxide semiconductor layer, and
wherein the first nonvolatile memory circuit, the plurality of second nonvolatile memory circuits, and the third nonvolatile memory circuit each include a capacitor in which one of a pair of electrodes of the capacitor is electrically connected to a node which is set in a floating state when the transistor is turned off.

7. The signal processing circuit according to claim 6, wherein the other of the pair of electrodes of the capacitor included in the first nonvolatile memory circuit, the other of the pair of electrodes of the capacitor included in each of the plurality of second nonvolatile memory circuits, and the other of the pair of electrodes of the capacitor included in the third nonvolatile memory circuit are provided in common without being separated from each other and are provided so as to cover the transistor included in the arithmetic portion, the transistor included the memory, and the transistor included the control portion.

8. The signal processing circuit according to claim 6, wherein the oxide semiconductor layer includes a crystal region in an amorphous phase.

9. The signal processing circuit according to claim 6, wherein the oxide semiconductor layer comprises at least one of indium and gallium.

10. An electronic device including the signal processing circuit according to claim 6.

11. A signal processing circuit comprising:
an arithmetic portion;
a memory; and
a control portion for controlling the arithmetic portion and the memory,
wherein the control portion includes:
a decoder for decoding a command;
a register for storing data input to the arithmetic portion and data output from the arithmetic portion;
a control circuit for controlling the register and the arithmetic portion; and
a power supply circuit for controlling the supply of power supply voltage to at least one of the arithmetic portion, the control circuit, the register, and the memory,
wherein the memory includes a plurality of second nonvolatile memory circuits arranged in matrix,
wherein the register includes a set of a third volatile memory circuit and a fourth nonvolatile memory circuit for storing data held in the third volatile memory circuit,
wherein the control circuit includes a set of a fourth volatile memory circuit and a fifth nonvolatile memory circuit for storing data held in the fourth volatile memory circuit,
wherein the plurality of second nonvolatile memory circuits, the fourth nonvolatile memory circuit, and the fifth nonvolatile memory circuit each include a transistor comprising a channel formation region in an oxide semiconductor layer, and
wherein the plurality of second nonvolatile memory circuits, the fourth nonvolatile memory circuit, and the fifth nonvolatile memory circuit each include a capacitor in which one of a pair of electrodes is electrically connected to a node which is set in a floating state when the transistor is turned off.

12. The signal processing circuit, according to claim 11, wherein the other of the pair of electrodes of the capacitor included in each of the plurality of second nonvolatile memory circuits, the other of the pair of electrodes of the capacitor included in the fourth nonvolatile memory circuit, and the other of the pair of electrodes of the capacitor included in the fifth nonvolatile memory circuit are provided in common without being separated from each other and are provided so as to cover a transistor included in the arithmetic portion, the transistor included in the memory, and the transistors included in the control portion.

13. The signal processing circuit according to claim 11, wherein the oxide semiconductor layer includes a crystal region in an amorphous phase.

14. The signal processing circuit according to claim 11, wherein the oxide semiconductor layer comprises at least one of indium and gallium.

15. An electronic device including the signal processing circuit according to claim 11.

16. A signal processing circuit comprising:
an arithmetic portion;
a memory; and
a control portion for controlling the arithmetic portion and the memory,
wherein the control portion includes:
a decoder for decoding a command;
a register for storing data input to the arithmetic portion and data output from the arithmetic portion;
a control circuit for controlling the register and the arithmetic portion; and
a power supply circuit for controlling supply of power supply voltage to at least one of the arithmetic portion, the control circuit, the register, and the memory,
wherein the memory includes a plurality of second nonvolatile memory circuits arranged in matrix,
wherein the arithmetic portion includes a set of a second volatile memory circuit and a third nonvolatile memory circuit for storing data held in the second volatile memory circuit,
wherein the register includes a set of a third volatile memory circuit and a fourth nonvolatile memory circuit for storing data held in the third volatile memory circuit,
wherein the control circuit includes a set of a fourth volatile memory circuit and a fifth nonvolatile memory circuit for storing data held in the fourth volatile memory circuit,
wherein the plurality of second nonvolatile memory circuits, the third nonvolatile memory circuit, the fourth nonvolatile memory circuit, and the fifth nonvolatile memory circuit each include a transistor comprising a channel formation region in an oxide semiconductor layer, and wherein the plurality of second nonvolatile memory circuits, the third nonvolatile memory circuit, the fourth nonvolatile memory circuit, and the fifth nonvolatile memory circuit each include a capacitor in which one of a pair of electrodes is electrically connected to a node which is set in a floating state when the transistor is turned off.

17. The signal processing circuit according to claim 16, the resister further comprises another fourth nonvolatile memory circuit provided for the third volatile memory circuit.

18. The signal processing circuit according to claim 16, wherein the other of the pair of electrodes of the capacitor included in each of the plurality of second nonvolatile memory circuits, the other of the pair of electrodes of the capacitor included in the third nonvolatile memory circuit, the other of the pair of electrodes of the capacitor included in the fourth nonvolatile memory circuit, and the other of the pair of electrodes of the capacitor included in the fifth nonvolatile memory circuit are provided in common without being separated from each other and are provided so as to cover the transistor included in the arithmetic portion, the transistor included in the memory, and the transistors included in the control portion.

19. The signal processing circuit according to claim 16, wherein the oxide semiconductor layer includes a crystal region in an amorphous phase.

20. The signal processing circuit according to claim 16, wherein the oxide semiconductor layer comprises at least one of indium and gallium.

21. An electronic device including the signal processing circuit according to claim 16.

* * * * *